United States Patent
Hayashi et al.

(10) Patent No.: US 6,490,139 B1
(45) Date of Patent: Dec. 3, 2002

(54) MAGNETO-RESISTIVE ELEMENT AND MAGNETIC HEAD FOR DATA WRITING/READING

(75) Inventors: Kazuhiko Hayashi, Tokyo (JP); Keishi Ohashi, Tokyo (JP); Nobuyuki Ishiwata, Tokyo (JP); Masafumi Nakada, Tokyo (JP); Hisao Matsutera, Tokyo (JP); Hisanao Tsuge, Tokyo (JP); Atsushi Kamijo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/492,229

(22) Filed: Jan. 27, 2000

(30) Foreign Application Priority Data

Jan. 26, 1999 (JP) ............................................. 11-017383

(51) Int. Cl.[7] .............................................. G11B 5/127
(52) U.S. Cl. ...................................................... 360/322
(58) Field of Search ................................ 360/126, 313, 360/314, 315, 316, 317, 318, 318.1, 319, 320, 321, 322, 323, 324.1, 324.2, 324.11, 324.12, 325, 326, 327, 327.1, 327.11, 327.2, 327.21, 327.22, 327.23, 327.24, 327.3, 327.31, 327.32, 327.33; 428/692, 212

(56) References Cited

U.S. PATENT DOCUMENTS

| | | | |
|---|---|---|---|
| 5,390,061 A | | 2/1995 | Nakatani et al. ......... 360/324.2 |
| 5,549,978 A | * | 8/1996 | Iwasaki et al. .............. 428/692 |
| 5,766,743 A | * | 6/1998 | Fujikata et al. ............. 428/212 |
| 5,958,611 A | * | 9/1999 | Ohta et al. .................. 428/692 |

FOREIGN PATENT DOCUMENTS

| | | |
|---|---|---|
| JP | 2-61572 | 3/1990 |
| JP | 4-103014 | 4/1992 |
| JP | 4-358310 | 12/1992 |
| JP | 2-701748 | 10/1997 |

* cited by examiner

Primary Examiner—David Davis
(74) Attorney, Agent, or Firm—Sughrue Mion, PLLC

(57) ABSTRACT

A magneto-resistive element comprises a first electrode, a magneto-resistive layer formed on the first electrode in which resistance is changed in accordance with magnetic field, and a second electrode layer formed on the magneto-resistive layer. The magneto-resistive layer has a first magnetic layer formed on the first electrode, a non-magnetic layer formed on the first magnetic layer, and a second magnetic layer formed on the non-magnetic layer. The average surface roughness of the first electrode is equal to or smaller than 0.3 nm. Since the first electrode has such the small average surface roughness, the non-magnetic layer formed on the first electrode layer is flattened, thus, current leakage is prevented. The first electrode is made of at least one of Ta, Zr, Ti, Hf, W, Mo, Y, V, Nb, Au, Ag, Pd, and Pt which has strong bond strength. Since the first electrode has strong bond strength, exfoliation of the first electrode from the layers contacting the first electrode does not occur.

11 Claims, 41 Drawing Sheets

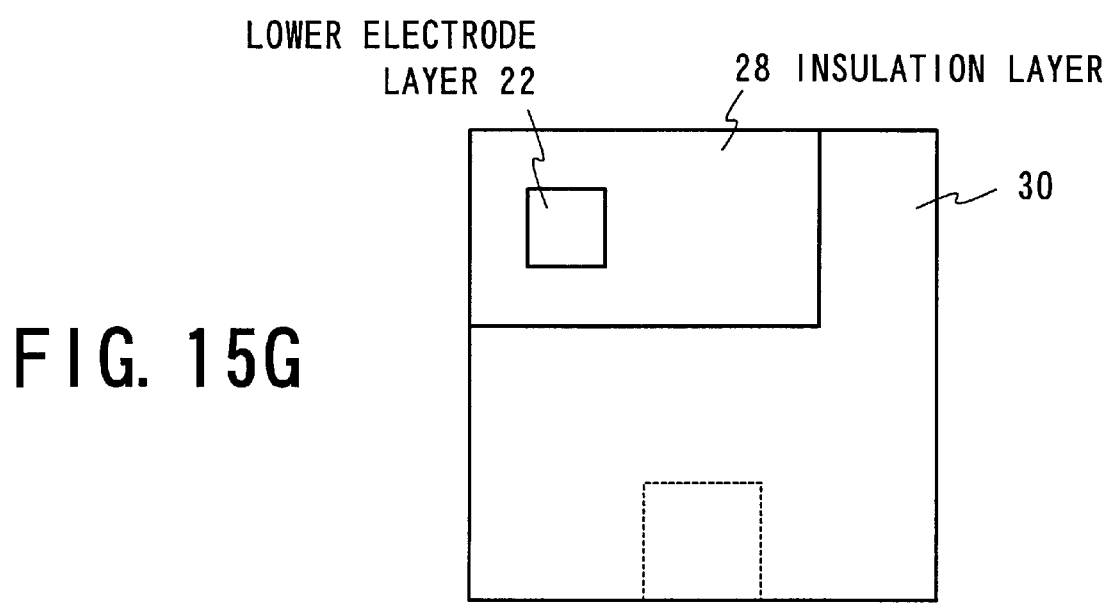

MAGNETO-RESISTIVE ELEMENT AND MAGNETIC HEAD FOR DATA WRITING/READING

BACKGROUND OF THE INVENTION

1. Field of the Invention

The present invention relates to a magneto-resistive element and a magnetic head for data writing/reading. The present invention also relates to a data writing/reading device which writes/reads data on/from a magnetic recording medium.

2. Description of the Related Art

A magnet-resistive element (or a magnetic head) has been known as an element which can read high density data recorded on a magnetic material.

As disclosed in, for example, a paper titled "Thin Film Magnetoresistors in Memory Storage and Related Applications" written by D. A. Thompson (IEEE TRANSACTIONS ON MAGNETICS, MAG-11, no. 4, p. 1039; 1975), operation of the magneto-resistive element is based on AMR (anisotropic magnetoresistance) effect. According to the AMR effect, one component of resistance in the magneto-resistive element changes. The change degree is in proportion to a cosine (of an angle between the magnetization direction of the magneto-resistive element and the flow direction of a current in the magneto-resistive element) to the second power.

Bias magnetic field is applied to an AMR head (a magnetic head utilizing the AMR effect) in order to reduce Barkhausen noise. An antiferromagnetic material such as FeMn, NiMn, and nickel oxidew is a material which applies the bias magnetic field.

As another type of the magnetic head, a GMR (giant magnetoresistance) head which utilizing GMR effect (spin valve effect) has been known. The GMR head has a pair of ferromagnetic layers sandwiching a non-magnetic layer. According to the GMR effect, changes of resistance between the ferromagnetic layers changes. The change degree is in proportion to a cosine of an angle between the magnetization directions of the ferromagnetic layers. The GMR head is more sensitive than the AMR head. In other words, the degree of resistance changes in the GMR head caused by magnetic field is larger than that of the AMR head.

Various techniques for improving performance of the above described magnetic head (magnetic sensor) have been disclosed in Unexamined Japanese Patent Application KOKAI Publication Nos. H2-61572, H4-358310, and H4-103014, Japanese Patent No. 2701748, and the U.S. Pat. No. 5,390,061.

According to the technique disclosed in Unexamined Japanese Patent Application KOKAI Publication No. H2-61572, the magnetization directions of a pair of the ferromagnetic layers sandwiching a non-magnetic layer are controlled in order to improve sensitivity of the magnetic head. More precisely, the magnetization direction of one ferromagnetic layer and another magnetization direction of the other ferromagnetic layer are controlled so as to be parallel or anti-parallel in accordance with external magnetic field.

According to the technique disclosed in Unexamined Japanese Patent Application KOKAI Publication No. H4-358310, the magnetization directions of ferromagnetic films which are separated by a non-magnetic film are controlled in order to improve sensitivity of the magnetic head. More precisely, the magnetization direction of one ferromagnetic film and another magnetization direction of the other ferromagnetic film are controlled so as to be perpendicular to each other when no external magnetic field is applied thereto.

According to the technique disclosed in Japanese Patent No. 2701748, bias magnetic field is applied to the magnetic head in order to improve sensitivity of the magnetic head. More precisely, the disclosed magnetic head has two magnetic films, each having different coercive force, which are deposited while sandwiching a non-magnetic layer therebetween. In this technique, the direction of the applied bias magnetic field is the same as the direction of remained magnetization of the magnetic film having larger coercive force.

In a magnetic sensor disclosed in Unexamined Japanese Patent Application KOKAI Publication No. H4-103014, the magnetization directions of magnetic layers sandwiching a non-magnetic layer are controlled by applying bias magnetic field thereto in order to improve sensitivity of the magnetic sensor. More precisely, the applied bias magnetic field controls the magnetization direction of one magnetic layer and another magnetization direction of the other magnetic layer so as to be parallel or anti-parallel.

According to the technique disclosed in U.S. Pat. No. 5,390,061, positional relationship between magnetic layers and a recording surface of a magnetic recording medium is controlled in order to read data from the high density recording medium. More precisely, the magnetic layers are formed on a Cu or AL electrode so that surfaces of the magnetic layers are perpendicular to the recording surface of the magnetic recording medium. Thus, a region of the magnetic sensor which contacts the recording surface is reduced.

In order to improve performance of the magnetic sensor, other than the above techniques, a non-magnetic layer to be formed on an electrode should be flattened, and the electrode should be strongly affixed to layers sandwiching the electrode.

FIG. 22 shows uneven thickness of a non-magnetic layer. That is, unflat non-magnetic layer is likely to cause current leakage which will reduce sensitivity of the magnetic sensor. Moreover, a current through the non-magnetic layer is likely to break thin portions of the non-magnetic layer. In other words, the unflat non-magnetic layer worsens withstand voltage characteristics of the magnetic sensor (magneto-resistive element).

If bond strength of the electrode is not strong, the electrode is exfoliated easily from the layers which sandwich the electrode. Such the magnetic sensor (magneto-resistive element) has poor reliability and yielding.

Further a data writing/reading device comprising the above magnetic sensor also has poor reliability.

None of the above described Thompson's paper, Unexamined Japanese Patent Application KOKAI Publication Nos. H2-61572, H4-358310, and H4-103014, Japanese Patent No. 2701748, and U.S. Pat. No. 5,390,061 has descriptions regarding to a method for flattening a non-magnetic layer and bond strength of an electrode.

SUMMARY OF THE INVENTION

It is an object of the present invention to provide a magneto-resistive element having improved reliability. It is another object of the present invention to provide a magneto-resistive element having a flat magneto-resistive layer. It is a further object of the present invention to provide a magneto-resistive element which has an electrode having strong bond strength. It is still another object of the present invention to provide a magnetic head and a data writing/reading device having improved reliability.

According to this invention, the magneto-resistive layer is formed on an electrode which has an average surface roughness equal to or smaller than about 0.3 nm. Thus, current leakage, breaking of the non-magnetic layer, and the like do not occur. As a result, the magneto-resistive element has excellent reliability. A second electrode is formed on the magneto-resistive layer. The magneto-resistive layer may include a non-magnetic layer. In an embodiment, the magneto-resistive layer may include at least one magnetic layer along with the non-magnetic layer. The magneto-resistive layer in one embodiment may have a pair of magnetic layers sandwiching a non-magnetic layer.

According to this invention, the non-magnetic layer formed on the first electrode is flat because the average surface roughness of the first electrode is equal to or smaller than 0.3 nm. Thus, current leakage, breaking of the non-magnetic layer, and the like do not occur. As a result, the magneto-resistive element has excellent reliability.

The electrode may be made of a material which prevents it from being exfoliated from a layer formed directly thereon.

The electrode may be made of a material including at least one of Ta, Zr, Ti, Hf, W, Mo, Y, V, Nb, Au, Ag, Pd, and Pt. In this case, the electrode may be affixed to the magneto-resistive layer with bond strength of equal to or greater than 36 Giga Pascal (Gpa).

According to a second aspect of the present invention a magnetic head is formed with the above described magneto-resistive element.

A data writing/reading device may be formed using the aforementioned magnetic head.

BRIEF DESCRIPTION OF THE DRAWINGS

These objects and other objects and advantages of the present invention will become more apparent upon reading of the following detailed description and the accompanying drawings in which:

FIGS. 15A to 15G are plan views for explaining steps of manufacturing the read head according to Ex. 7;

DETAILED DESCRIPTION OF THE PREFERRED EMBODIMENTS

First Embodiment

A magneto-resistive element according to a first embodiment of the present invention will now be described with referring to the accompanying drawings.

Magnetic Disk Drive

Figure 1:
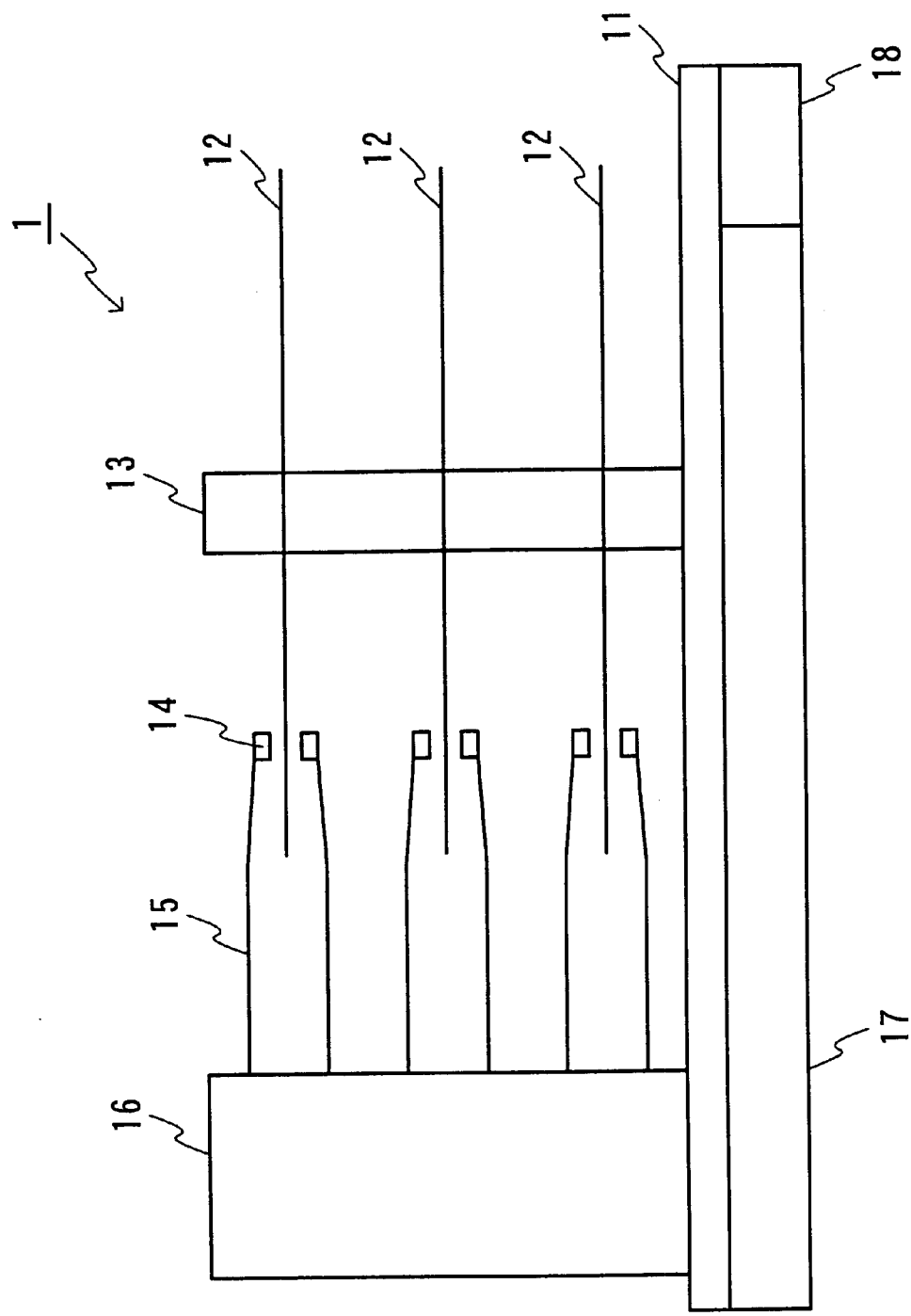
FIG. 1 is a diagram showing the structure of a magnetic disk drive 1 comprising magneto-resistive elements according to the first embodiment of the present invention.

FIG. 1 is a diagram showing the structure of a magnetic disk drive 1. A magnetic head 14 of the magnetic disk drive 1 employs the magneto-resistive element according to the first embodiment.

As shown in FIG. 1, the magnetic disk drive 1 comprises a base 11, magnetic disks 12, a spindle motor 13, magnetic heads 14, head arms 15, a head actuator 16, a controller 17, and an I/O (input/output) interface 18.

The magnetic disks 12 rest on the spindle motor 13 so as to be parallel to each other at regular interval. Each magnetic disk 12 has the diameter of approximately 46 mm. Data will be stored on an area in a diameter range from 10 mm to 40 mm.

The spindle motor 13 is fixed on one major surface of the base 11, and rotates the magnetic disks 12.

Figure 2:
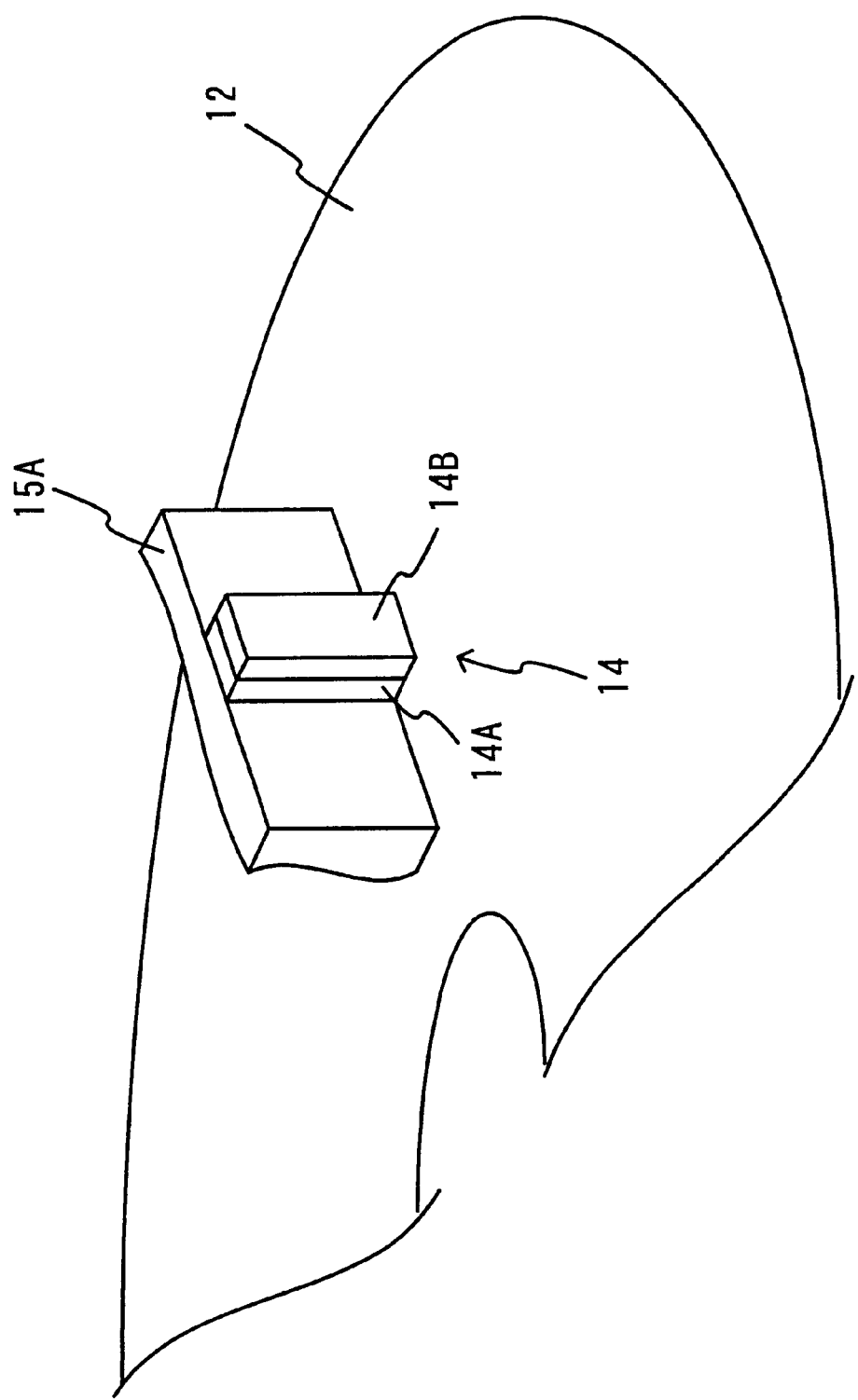
FIG. 2 is a diagram showing the structure of a magnetic head in the magnetic disk drive.

As shown in FIG. 1, paired magnetic heads 14 oppose to each other while sandwiching the disk 12 therebetween. While the drive 1 is resting, the head 14 may contact the disk 12 or be apart therefrom with a predetermined gap (equal to or smaller than 0.2 micrometers). After the drive 1 is activated, the heads 14 float on air flow caused by rotations of the disks 12. A surface which catches the air flow, that is, a surface facing the disk 12 is so called Air Bearing Surface (ABS). As shown in FIG. 2, each of the heads 14 comprises a read head 14A and a write head 14B. More precisely, the read head 14A is formed so as to contact a head holder 15A which is a part of the head arm 15, and the write head 14B is formed on the read head 14A. The read head 14A comprises the aforementioned magneto-resistive element in order to read data on the disk 12 by sensing magnetic field leaked from the disk 12. The structure of the read head 14A will be described in detail later. The write head 14B comprises a coil. The coil generates magnetic field when a current is supplied thereto. The write head 14B writes data on the disk 12 by utilizing the magnetic field generated by the coil. Since the head 14 has the deposition structure of the read and write heads 14A and 14B, both heads will be placed on the same track easily. The illustrated head 14 in FIG. 2 is exaggerated in size for better understandability.

The head arms 15 hold the heads 14.

The head actuator 16, which is fixed on the one major surface of the base 11, moves the arms 15 across the disks 12 so as to the heads 14 are moved to desired positions on the disk 12.

The controller 17, which is mounted on the other major surface of the base 11, controls the spindle motor 13 and the actuator 16 for relative motion between the head 14 and the disk 12. The controller 17 comprises a signal processor and the like, and controls the heads 14 to write/read data on/from the disks 12.

The I/O interface 18 comprises a cache memory, and is connected to a computer (not shown) via a 32-bit bus whose data transfer rate is, for example, 5 to 20 MB per second.

Thus structured drive 1 performs data reading/writing in accordance with instructions given by the computer or the like. More precisely, the controller 17 controls the spindle motor 13 and the actuator 16 in accordance with the instructions given by the computer or the like. The controller 17 reads data on the disk 12 by detecting resistance changes in the magneto-resistive elements of the read heads 14A. The resistance changes are caused by magnetic field leaked from the disks 12. The controller 17 outputs the read data to the computer. The controller 17 also writes data supplied from the computer on the disks 12 by supplying a current to the coil in the write head 14B.

Structure of Read Head

The structure of the read head 14A will now be described in detail.

The read head 14A is so-called a shielded type head. Other types may be applicable to the read head 14A. Regardless of the types, the read head 14A comprises at least a lower electrode, a magnetic tunnel junction (MTJ) layer, and an upper electrode. Resistance of the MTJ layer changes in accordance with magnetic field around the read head 14A. According to this characteristics, the read head 14A can read data on a magnetic recording medium by measuring a current in the MTJ layer after applying a predetermined voltage between the upper and lower electrodes.

The present invention features that average surface roughness of the lower electrode is small. The surface roughness of the lower electrode in equal to or smaller than 0.3 nm. This characteristics helps to form flatter layers to be formed above the lower electrode. In other words, it makes flat MTJ layer. Such the flatness of the MTJ layer prevents currents from leaking. Another feature of the present invention is strong bond strength of the lower electrode. More precisely, the lower electrode is made of a material having strong bond strength, thus the lower electrode is strongly affixed to the layers which contact the lower electrode. This characteristics helps to prevent the layers of the head from being exfoliated from each other, thus, accurate data reading is realized. The above described average surface roughness Ra is defined by JIS (Japanese Industrial Standards), and is represented by the equation below.

$$Ra = \frac{1}{l}\int_0^l |f(x)|\,dx$$

where y=f(x) is a function representing a form of film surface.

Table 1 shows measured bond strength of the lower electrode by materials. The measurement is carried out under the lower electrode is formed on a glass substrate. Table 1 also shows the thickness and surface roughness of the lower electrode.

As a first step of the measurement, a jig presses the glass substrate on which the lower electrode is formed to bend the glass substrate. And then, stress applied to the lower electrode is measured at a point where the lower electrode starts to exfoliate from the glass substrate. The measured stress represents the bond strength shown in table 1.

TABLE 1

| MATERIAL | THICKNESS (nm) | BOND STRENGTH (GPa) | SURFACE ROUGHNESS Ra (nm) |
|---|---|---|---|
| Al | 40 | 43 | 0.45 |
| Cu | 40 | 19 | 0.24 |
| Ta | 40 | 44 | 0.30 |
| Zr | 40 | 43 | 0.30 |
| Ti | 40 | 45 | 0.28 |
| Hf | 40 | 40 | 0.26 |
| W | 40 | 42 | 0.25 |
| Mo | 40 | 42 | 0.24 |
| Y | 40 | 41 | 0.25 |
| V | 40 | 42 | 0.26 |
| Nb | 40 | 42 | 0.26 |
| Au | 40 | 36 | 0.29 |
| Ag | 40 | 37 | 0.24 |
| Pd | 40 | 40 | 0.25 |
| Ta/Cu | 5/35 | 42 | 0.25 |
| Ta/Au | 5/35 | 43 | 0.24 |
| Ta/Ag | 5/35 | 42 | 0.25 |
| Ta/Pt | 5/35 | 43 | 0.24 |
| Ta/Pd | 5/35 | 43 | 0.25 |
| Zr/Cu | 5/35 | 42 | 0.26 |
| Hf/Cu | 5/35 | 43 | 0.24 |
| W/Cu | 5/35 | 42 | 0.25 |
| Ti/Cu | 5/35 | 42 | 0.26 |
| Ti/Au | 5/35 | 43 | 0.24 |
| Ti/Ag | 5/35 | 41 | 0.25 |
| Ti/Pt | 5/35 | 42 | 0.24 |
| Ti/Pd | 5/35 | 42 | 0.26 |
| Mo/Cu | 5/35 | 41 | 0.25 |
| Y/Cu | 5/35 | 42 | 0.26 |
| V/Cu | 5/35 | 43 | 0.25 |
| Nb/Cu | 5/35 | 43 | 0.24 |

As shown in table 1, the material Al has strong bond strength (43 GPa), however, the surface roughness is large (0.45 nm). Another material Cu has small surface roughness (0.24), however, the bond strength is weak (19 GPa). Each of the other materials shows small surface roughness and strong bond strength (equal to or greater than 36 GPa). The lower electrode of the magneto-resistive element according to the first embodiment is made of material other than Al and Cu.

Detailed Structure of Read Head

Seven structural examples (Ex. 1 to Ex. 7) of the read head 14A will now be described.

EX. 1

Figure 3A:
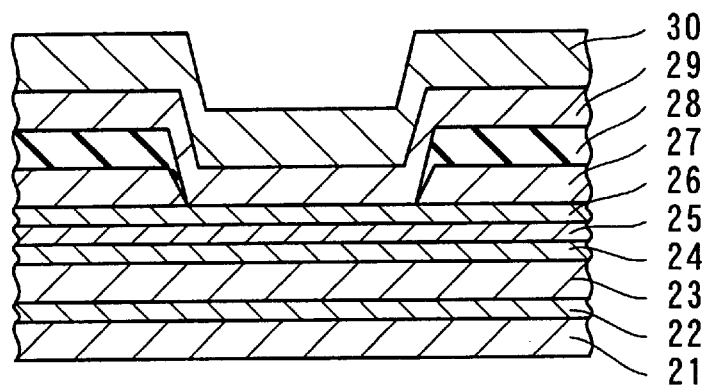
FIG. 3A is a cross sectional view showing a read head according to Ex. 1.
Figure 3B:
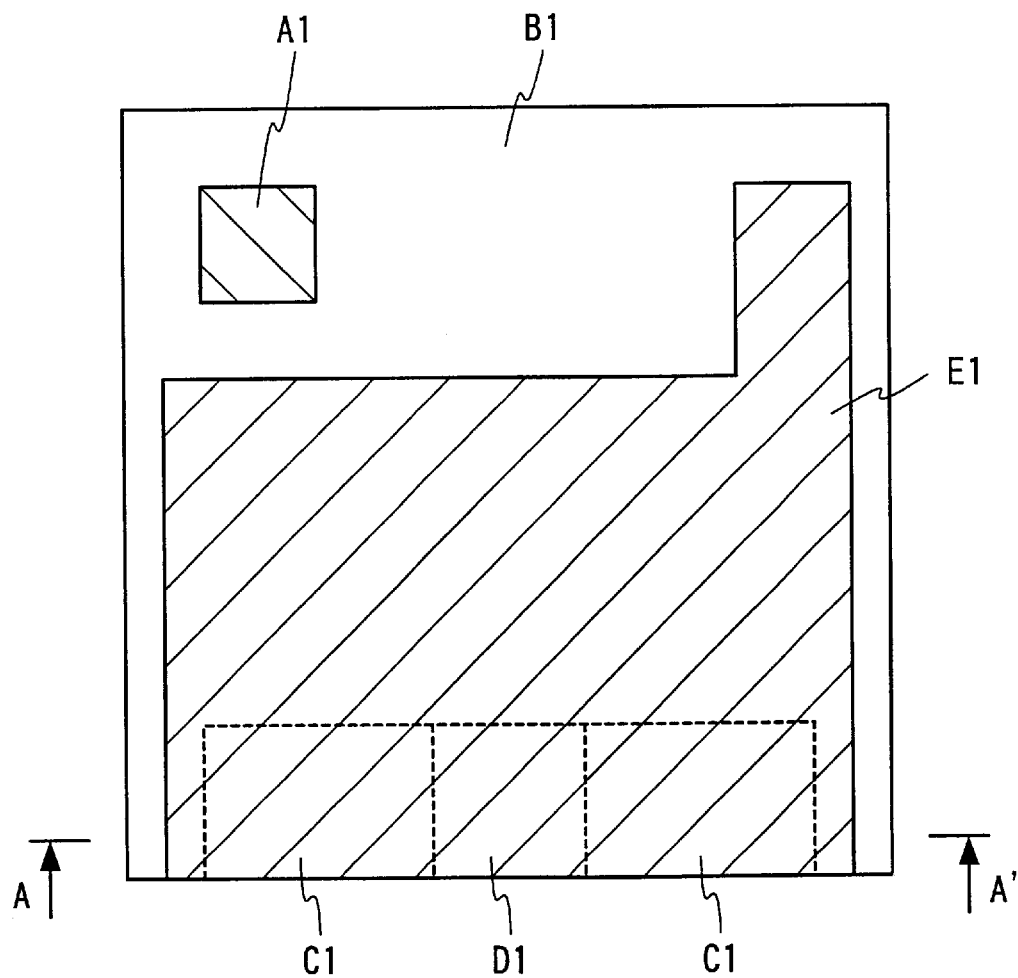
FIG. 3B is a plan view showing the read head shown in FIG. 3A.
Figure 4A:
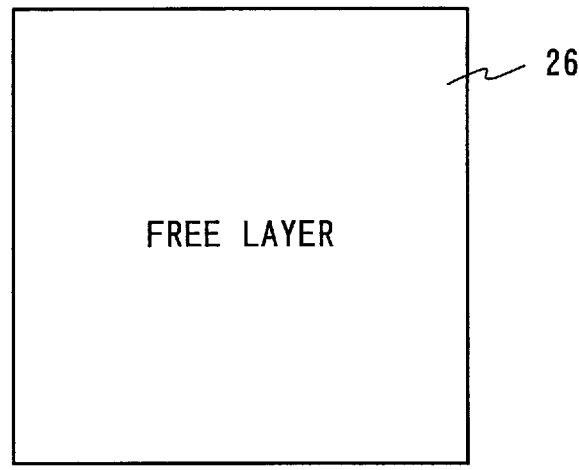
FIGS. 4A to 4J are plan views for explaining steps of manufacturing the read head according to Ex. 1.
Figure 4B:
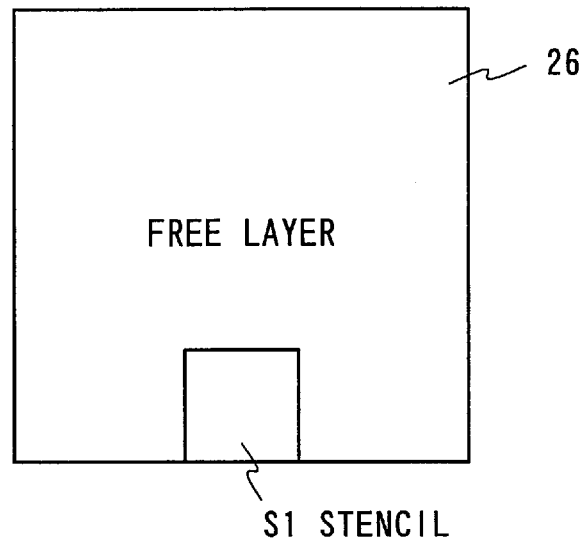
Figure 4C:
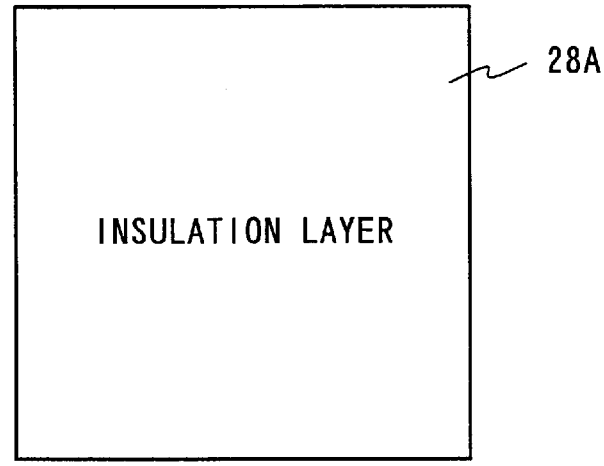
Figure 4D:
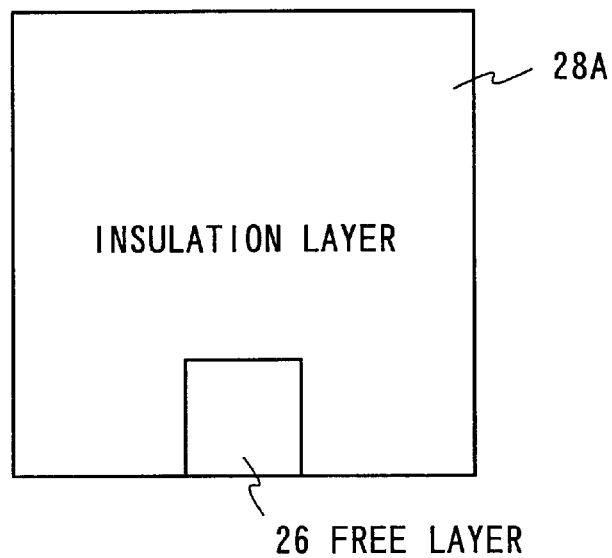
Figure 4E:
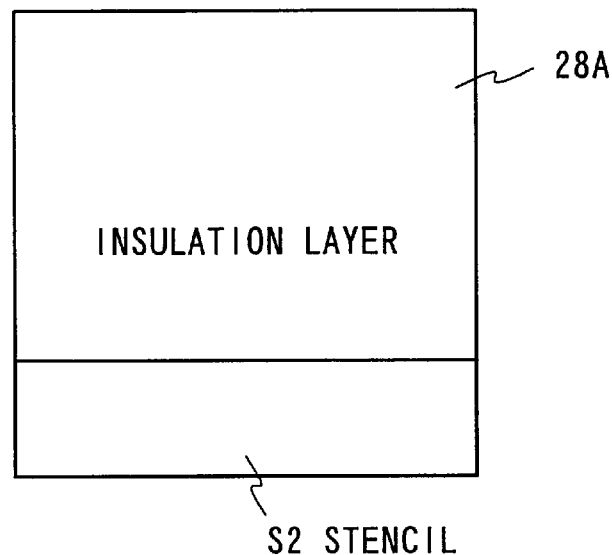
Figure 4F:
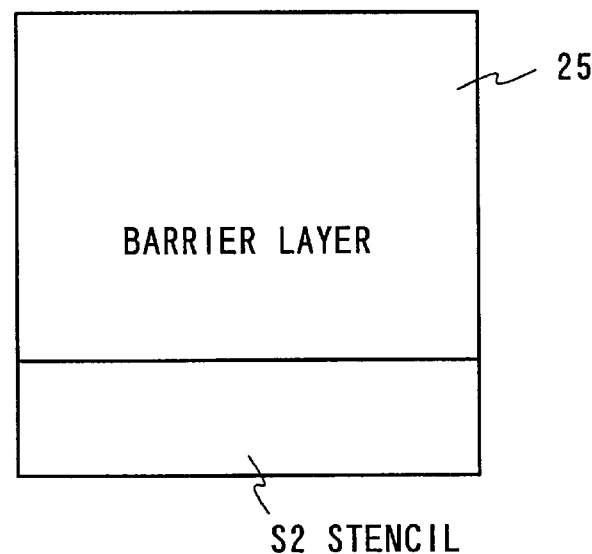
Figure 4G:
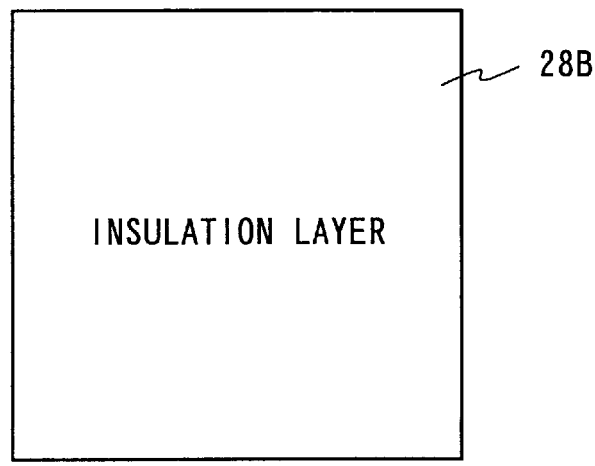
Figure 4H:
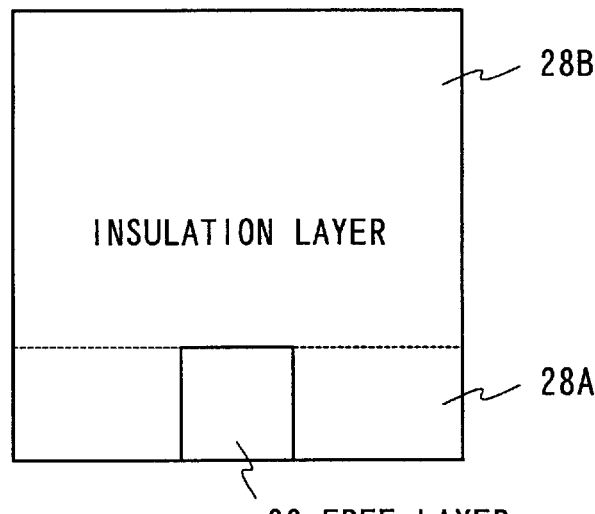
Figure 4I:
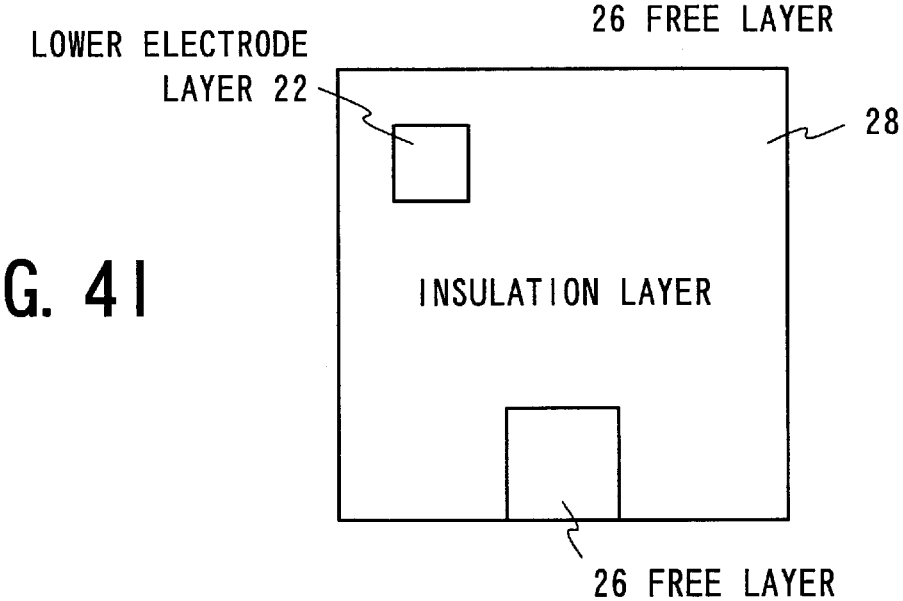
Figure 4J:
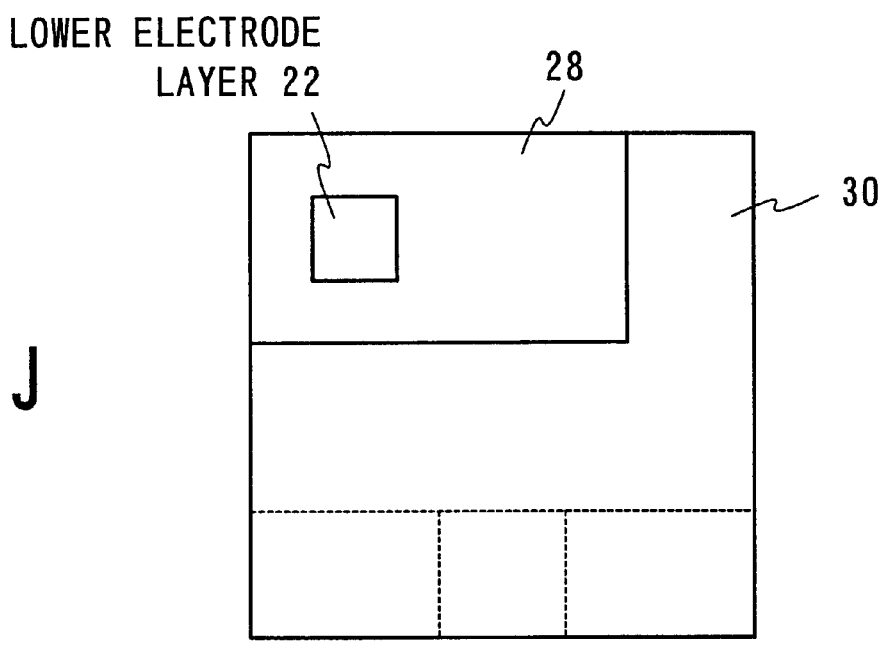

FIG. 3A is a cross sectional view showing the read head 14A of the Ex. 1 along an A–A' line shown FIG. 3B which is a plan view of the read head 14A.

As shown in FIG. 3A, the read head 14A of the Ex. 1 comprises a lower shield layer 21, a lower electrode layer 22, a fixer layer 23, a fixed layer 24, a barrier layer 25, a free layer 26, a bias layer 27, an insulation layer 28, an upper electrode layer 29, and an upper shield layer 30. Materials of the layers will be described after the structure of the read head 14A is described.

The lower shield layer 21 is formed on a substrate (not shown) made of aluminum titanate, SiC, almina, or deposition thereof. The lower shield layer 21 and the upper shield layer 30 are prepared to shield incline components of the magnetic field leaked from the magnetic recording medium (magnetic disk 12). This shielding effect helps the read head 14A to have improved resolution. The average surface roughness of the lower shield layer 21 is equal to or smaller than 0.3 nm.

The lower electrode layer 22 is formed on the lower shield layer 21. The lower electrode layer 22 is made of any one of the materials shown in table 1 except Al and Cu. The average surface roughness of the selected material should be equal to or smaller than 0.3 nm. Accordingly, the lower electrode layer 22 will have stronger bond strength, thus, the lower electrode layer 22 will be strongly affixed to layers to be formed so as to contact the lower electrode layer 22. Moreover, the layers to be formed above the lower electrode layer 22 will be flattened.

A set of the fixer layer 23, fixed layer 24, barrier layer 25 and free layer 26 forms the aforementioned MTJ layer.

The fixer layer 23 is formed on the lower electrode layer 22. The fixer layer 23 is made of an antiferromagnetic material or a rigid magnetic material. The purpose of the fixer layer 23 is to fix the magnetization direction of the fixed layer 24.

The fixed layer 24 is formed on the fixer layer 23, and is magnetized in a predetermined direction by the fixer layer 23.

The barrier layer 25 is formed on the fixed layer 24. The barrier layer 25 is made of a non-magnetic material in order to magnetically disconnect the fixed layer 24 from the free layer 26. Since the surface roughness of the lower electrode layer 22 is small, the barrier layer 25 is flat. Because the barrier layer 25 is so flattened, a leak current does not occur during data reading.

The free layer 26 is formed on the barrier layer 25. The magnetization direction of the free layer 26 flexibly changes in accordance with external magnetic field, that is, the magnetic field leaked from the magnetic recording medium. Resistance of the magneto-resistive element changes in accordance with an angle between the magnetization directions of the fixed layer 24 and the free layer 26.

The bias layer 27 is partially formed on the free layer 26 at a predetermined interval as shown in FIG. 3A. The bias layer 27 applies bias magnetic field to the free layer in order to cause the free layer 26 to have stable magnetic domain. However, sensitivity of the read head 14A will be reduced if the bias magnetic field is too strong. On the contrary, too weak bias magnetic field will make noises in a signal representing read data. To avoid such troubles, suitable strength of the bias magnetic field is selected so that the read head 14A has appropriate sensitivity for its purpose.

The insulation layer 28 is formed on the bias layer 27. The insulation layer 28 regulates current flow region between the lower electrode layer 22 and the upper electrode layer 29.

The upper electrode layer 29 is formed so as to cover the insulation layer 28 and exposed free layer 26, as shown in FIG. 3A.

The upper shield layer 30 is formed on the upper electrode layer 29. The structure of the read head 14A in cross section has been described so far with reference to the FIG. 3A. Shapes in plan view of the layers are different from each other. Regions denoted by reference alphanumeric characters A1 to E1 in FIG. 3B represent shapes of the layers in the read head 14A in plan view.

Layer structures of the read head 14A at the regions A1 to E1 will now be described.

At the region A1, the lower shield layer 21 and the lower electrode layer 22 have been deposited in this order onto the substrate.

At the region B1, the lower shield layer 21, the lower electrode layer 22, the fixer layer 23, the fixed layer 24, the barrier layer 25, and the insulation layer 28 have been deposited in this order onto the substrate.

At the region C1, the lower shield layer 21, the lower electrode layer 22, the fixer layer 23, the fixed layer 24, the barrier layer 25, the free layer 26, the bias layer 27, the insulation layer 28, the upper electrode layer 29, and the upper shield layer 30 have been deposited in this order onto the substrate.

At the region D1, the lower shield layer 21, the lower electrode layer 22, the fixer layer 23, the fixed layer 24, the barrier layer 25, the free layer 26, the upper electrode layer 29, and the upper shield layer 30 have been deposited in this order onto the substrate.

At the region E1, the lower shield layer 21, the lower electrode layer 22, the fixer layer 23, the fixed layer 24, the barrier layer 25, the insulation layer 28, the upper electrode layer 29, and the upper shield layer 30 have been deposited in this order onto the substrate.

In thus structured read head 14A, a predetermined voltage is applied between the lower electrode layer 22 and the upper electrode layer 29 for reading data from the magnetic recording medium. Since a current flow in the MTJ layer changes in accordance with the magnetic field leaked from the magnetic recording medium, the current flow between the lower electrode layer 22 and the upper electrode layer 29 represents data.

Materials of the above described layers in the read head 14A are as follows. Each of the lower and upper shield layers 21 and 29 is made of NiFe, CoZr, CoFeB, CoZrMo, CoZrNb, CoZrTa, CoHf, CoTa, CoTaHf, CoNbHf, CoHfPb, CoTaZrNb, CoZrMoNi, FeAlSi, iron nitride material, MnZn ferrite, NiZn ferrite, and/or MgZn ferrite. And single layer structure, multi-layer structure, or composition structure each including the above material(s) is applicable.

The lower electrode layer 22 is a monomerous film made of one of some materials shown in table 1, that is, Ta, Zr, Ti, Hf, W, Mo, Y, V, Nb, Au, Ag, and Pb, or a deposition (or alloy) film including some of the above. Or, the lower electrode layer 22 has multi-layer structure. In this case, the lower electrode layer 22 comprises a monomerous film made of Ta, Zr, Ti, Hf, W, Mo, Y, V, or Nb, or a deposition (or alloy) film including some of the above, and a monomerous film made of Au, Ag, Pd, Cu or Pt, or a deposition (or alloy) film including some of the above.

The fixer layer 23 is made of FeMn, NiMn, IrMn, RhMn, PtPdMn, ReMn, PtMn, PtCrMn, CrMn, CrAl, ThCo, CoCr, CoCrPt, CoCrTa, PtCo, Co oxide, Ni oxide, and/or Fe oxide. And single layer structure, multi-layer structure, or composition structure each including the above material(s) is applicable. Preferable material for the fixer layer 23 is PtMn, or PtMn to which Ti, V, Cr, Co, Cu, Zn, Y, Zr, Nb, Mo, Tc, Ru, Rh, Pd, Ag, Hf, Ta, W, Re, Os, Ir, Pt, Au, Si, or Al is added.

The fixed layer 24 is a monomerous film made of Co, Ni, or Fe, or a deposition (or alloy) film including some of the above. Or, the fixed layer 24 has multi-layer structure. In this case, the fixed layer 24 comprises a monomerous film made of Co, Ni, or Fe, or a deposition (or alloy) film including some of the above, and another monomerous film made of Ti, V, Cr, Co, Cu, Zn, Y, Zr, Nb, Mo, Tc, Ru, Rh, Pd, Ag, Hf, Ta, W, Re, Os, Ir, Pt, Au, Si, or Al, or another deposition (or alloy) film including some of the above. Preferable material for the fixed layer 24 is Co/Ru/Co, CoFe/Ru/CoFe, CoFeNi/Ru/CoFeNi, Co/Cr/Co, CoFe/Cr/CoFe, or CoFeNi/Cr/CoFeNi.

The barrier layer 25 is a monomerous film made of oxide or nitride, or a deposition film including a metal film and an oxide film (or a nitride film). In this case source material of the oxide or nitride film is Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ta, or Ni.

The free layer 26 is made of NiFe, CoFe, NiFeCo, CoFeB, CoZrMo, CoZrNb, CoZr, CoZrTa, CoHf, CoTa, CoTaHf, CoNbHf, CoZrNb, CoHfPb, CoTaZrNb, CoZrMoNi, or an amorphous magnetic material.

The bias layer 27 is made of CoCrPt, CoCr, CoPt, CoCrTa, FeMn, NiMn, Ni oxide, NiCo oxide, Fe oxide, NiFe oxide, IrMn, PtMn, PtPdMn, ReMn, Co ferrite, and/or Ba ferrite. And single layer structure, multi-layer structure, or composition structure each including the above material (s) is applicable.

The insulation layer 28 is made of Al oxide, Si oxide, aluminum nitride, silicon nitride, and/or diamond-like carbon. And single layer structure, multi-layer structure, or composition structure each including the above material(s) is applicable.

The upper electrode layer 29 is made of Au, Ag, Cu, Mo, W, Y, Ti, Zr, Hf, V, Nb, and/or Ta. And single layer structure, multi-layer structure, or composition structure each including the above material(s) is applicable.

Manufacturing Method for Ex. 1

Typical steps of manufacturing the read head 14A having the Ex. 1 will now be described.

FIGS. 4A to 4J are plan views for explaining steps of manufacturing the read head 14A.

The first step (FIG. 4A): the lower shield layer 21, the lower electrode layer 22, and the MTJ layer (including the fixer layer 23, the fixed layer 24, the barrier layer 25, and the free layer 26) have been deposited in this order onto the substrate.

The second step (FIG. 4B): a stencil S1 is formed so as to cover the region D1 shown in FIG. 3B.

The third step (FIG. 4C): the bias layer 27 and a primary insulation layer 28A have been deposited in this order onto the free layer 26 after the stencil S1 is formed.

The fourth step (FIG. 4D): the stencil S1 is lifted off, thus, the free layer 26 corresponding to the region D1 is exposed.

The fifth step (FIG. 4E): a stencil S2 is formed so as to cover the regions C1 and D1 shown in FIG. 3B.

The sixth step (FIG. 4F): ion milling at an uncovered region is carried out until the barrier layer 25 is exposed.

The seventh step (FIG. 4G): an insulation layer 28B is formed on the exposed barrier layer 25 and the stencil S2.

The eighth step (FIG. 4H): the stencil S2 is lifted off. In this case, the insulation layer 28 is a set of the insulation layers 28A and 28B.

The ninth step (FIG. 4I): Chemical Mechanical Polishing (CMP) is carried out to form an opening at the region A1 shown in FIG. 3B until the lower electrode layer 22 is exposed.

Final step (FIG. 4J): the upper electrode layer 29 and the upper shield layer 30 have been deposited in this order onto the regions C1, D1, and E1 shown in FIG. 3B, and the read head 14A is completed.

As mentioned above, since the lower electrode layer 22 has strong bond strength, the lower electrode layer 22 is strongly affixed to the layers contacting the lower electrode layer 22, thus, the lower electrode layer 22 is not exfoliated from the contacting layers. Moreover small average surface roughness (equal to or smaller than 0.3 nm) of the lower electrode layer 22 is helpful to form flater MTJ layer on the lower electrode layer 22, thus, a leak current does not occur. According to those characteristics, accurate reading of data stored in the magnetic recording medium is realized, and improved reliability of the read head 14A is available.

EX. 2

The read head 14A having Ex. 2 will now be described.

Figure 5A:
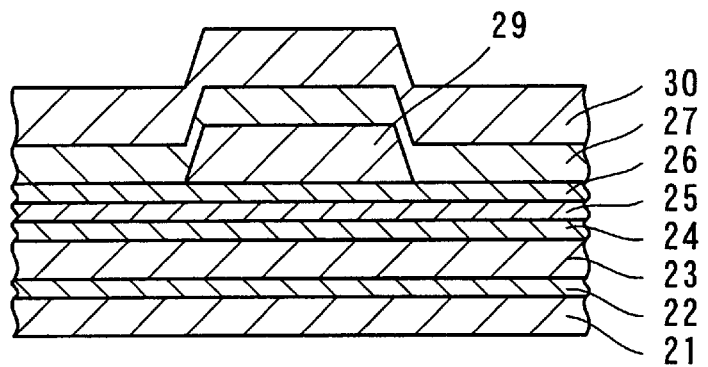
FIG. 5A is a cross sectional view showing a read head according to Ex. 2.
Figure 5B:
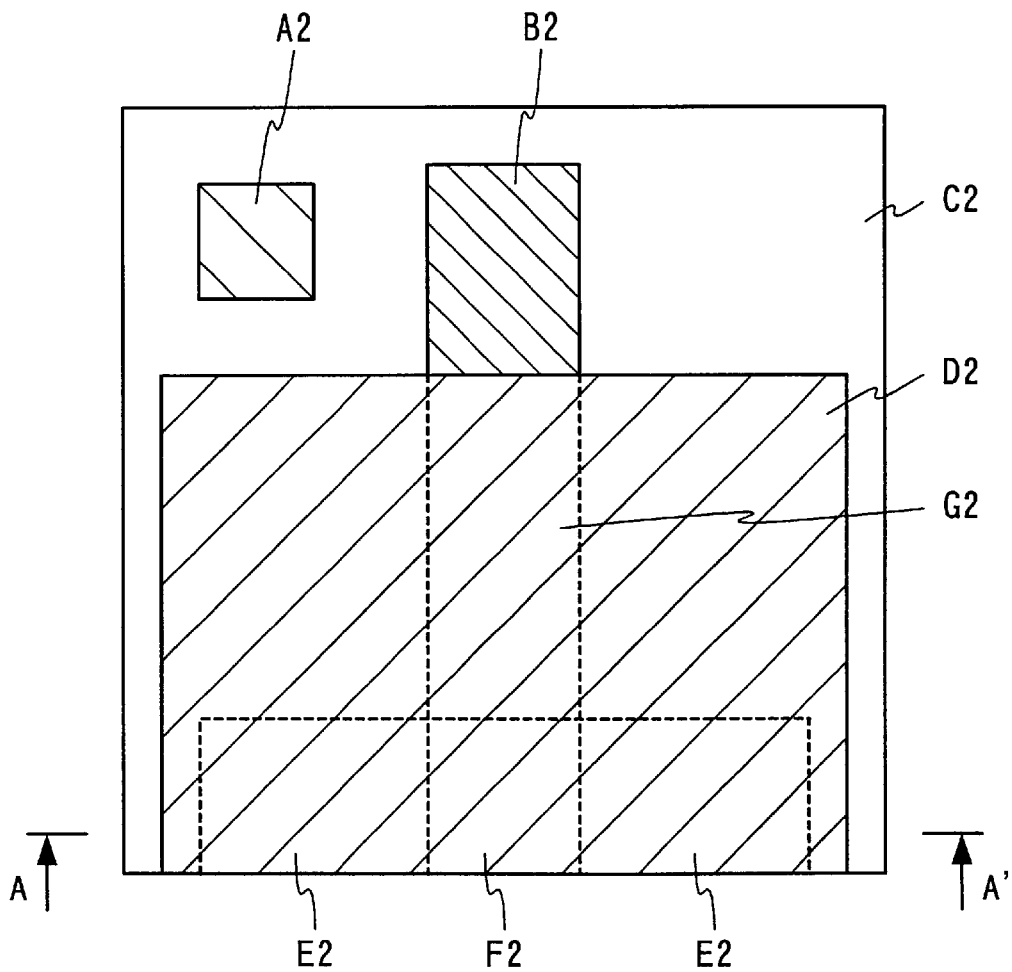
FIG. 5B is a plan view showing the read head shown in FIG. 5A.

FIG. 5A is a cross sectional view showing the read head 14A of the Ex. 2 along an A–A' line shown FIG. 5B which is a plan view of the read head 14A.

As shown in FIG. 5A, the read head 14A of the Ex. 2 comprises the lower shield layer 21, the lower electrode layer 22, the fixer layer 23, the fixed layer 24, the barrier layer 25, the free layer 26, the bias layer 27, the insulation layer 28, the upper electrode layer 29, and the upper shield layer 30. Materials of the layers are substantially the same as those described in Ex. 1. The insulation layer 28 is not shown in FIG. 5A, because the insulation layer 28 is formed in regions B2, C2, D2, and G2 shown in FIG. 5B. Detailed explanation will be followed later.

The lower shield layer 21 is formed on a substrate (not shown) made of aluminum titanate, SiC, almina, or deposition thereof. The lower shield layer 21 and the upper shield layer 30 are prepared to shield incline components of the magnetic field leaked from the magnetic recording medium (magnetic disk 12). This shielding effect helps the read head 14A to have improved resolution. The surface roughness of the lower shield layer 21 is equal to or smaller than 0.3 nm.

The lower electrode layer 22 is formed on the lower shield layer 21. The lower electrode layer 22 is made of any one of the materials shown in table 1 except Al and Cu. The average surface roughness of the selected material should be equal to or smaller than 0.3 mn. Accordingly, the lower electrode layer 22 will have stronger bond strength, thus, the lower electrode layer 22 will be strongly affixed to layers to be formed so as to contact the lower electrode layer 22, and the layer to be formed on the lower electrode layer 22 will be flattened.

A set of the fixer layer 23, fixed layer 24, barrier layer 25 and free layer 26 forms the aforementioned MTJ layer.

The fixer layer 23 is formed on the lower electrode layer 22. The fixer layer 23 is made of an antiferromagnetic material or a rigid magnetic material. The purpose of the fixer layer 23 is to fix the magnetization direction of the fixed layer 24.

The fixed layer 24 is formed on the fixer layer 23, and is magnetized in a predetermined direction by the fixer layer 23.

The barrier layer 25 is formed on the fixed layer 24. The barrier layer 25 magnetically disconnects the fixed layer 24 from the free layer 26. Since the surface roughness of the lower electrode layer 22 is small, the barrier layer 25 is flat. Because the barrier layer 25 is so flattened, a leak current does not occur during data reading.

The free layer 26 is formed on the barrier layer 25. The magnetization direction of the free layer 26 flexibly changes in accordance with external magnetic field, that is, the magnetic field leaked from the magnetic recording medium. Resistance of the magneto-resistive element changes in accordance with an angle between the magnetization directions of the fixed layer 24 and the free layer 26.

The bias layer 27 is prepared for causing the free layer 26 to have stable magnetic domain. The bias layer 27 is formed so as to cover the upper electrode layer 29 which is formed at predetermined areas on the free layer 26 as shown in FIG. 5A. As mentioned in Ex. 1, suitable strength of the bias magnetic field is selected so that the read head 14A has appropriate sensitivity for its purpose.

The upper shield layer 30 is formed on the bias layer 27.

The structure of the read head 14A in cross section has been described so far with reference to the FIG. 5A. Shapes in plan view of the layers are different from each other. Regions denoted by reference alphanumeric characters A2 to G2 in FIG. 5B represent shapes of the layers in the read head 14A.

Layer structures at the regions A2 to G2 will now be described.

At the region A2, the lower shield layer 21 and the lower electrode layer 22 have been deposited in this order onto the substrate.

At the region B2, the lower shield layer 21, the lower electrode layer 22, the fixer layer 23, the fixed layer 24, the barrier layer 25, the insulation layer 28, and the upper electrode layer 29 have been deposited in this order onto the substrate.

At the region C2, the lower shield layer 21, the lower electrode layer 22, the fixer layer 23, the fixed layer 24, the barrier layer 25, and the insulation layer 28 have been deposited in this order onto the substrate.

At the region D2, the lower shield layer 21, the lower electrode layer 22, the fixer layer 23, the fixed layer 24, the barrier layer 25, the insulation layer 28, and the upper shield layer 30 have been deposited in this order onto the substrate.

At the region E2, the lower shield layer 21, the lower electrode layer 22, the fixer layer 23, the fixed layer 24, the barrier layer 25, the free layer 26, the bias layer 27, and the upper shield layer 30 have been deposited in this order onto the substrate.

At the region F2, the lower shield layer 21, the lower electrode layer 22, the fixer layer 23, the fixed layer 24, the barrier layer 25, the free layer 26, the upper electrode layer 29, the bias layer 27, and the upper shield layer 30 have been deposited in this order onto the substrate.

At the region G2, the lower shield layer 21, the lower electrode layer 22, the fixer layer 23, the fixed layer 24, the barrier layer 25, the insulation layer 28, the upper electrode layer 29, and the upper shield layer 30 have been deposited in this order onto the substrate.

Manufacturing Method for Ex. 2

Typical steps of manufacturing the read head 14A having the Ex. 2 will now be described.

FIGS. 6A to 6M are plan views for explaining steps of manufacturing the read head 14A.

The first step (FIG. 6A): the lower shield layer 21, the lower electrode layer 22, and the MTJ layer (including the fixer layer 23, the fixed layer 24, the barrier layer 25, and the free layer 26) have been deposited in this order onto the substrate.

The second step (FIG. 6B): a stencil S1 is formed so as to cover the regions E2 and F2 shown in FIG. 5B.

The third step (FIG. 6C): ion milling at an uncovered region is carried out until the barrier layer 25 is exposed.

Figure 6A:
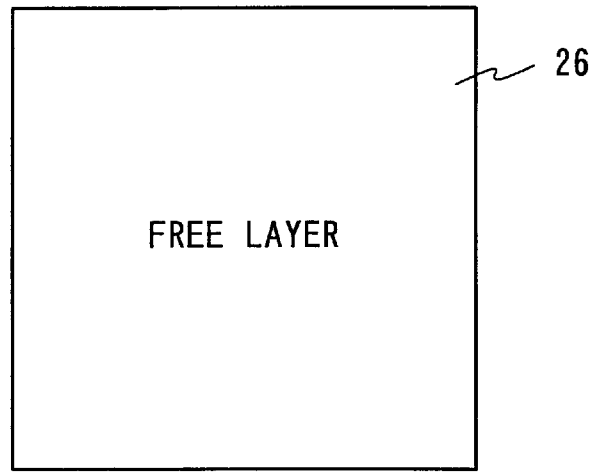
FIGS. 6A to 6M are plan views for explaining steps of manufacturing the read head according to Ex. 2.
Figure 6B:
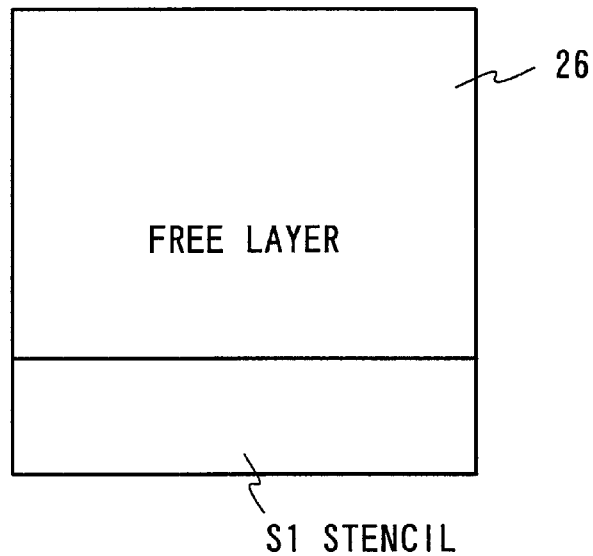
Figure 6C:
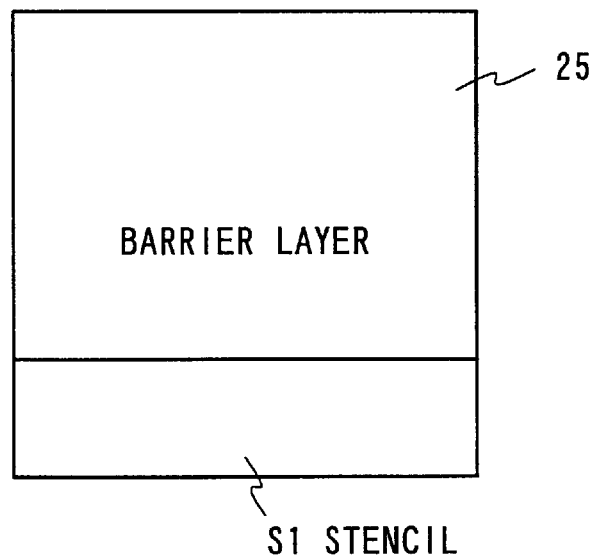
Figure 6D:
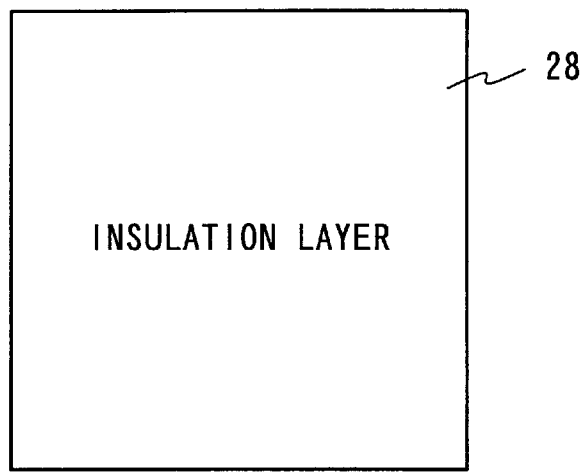
Figure 6E:
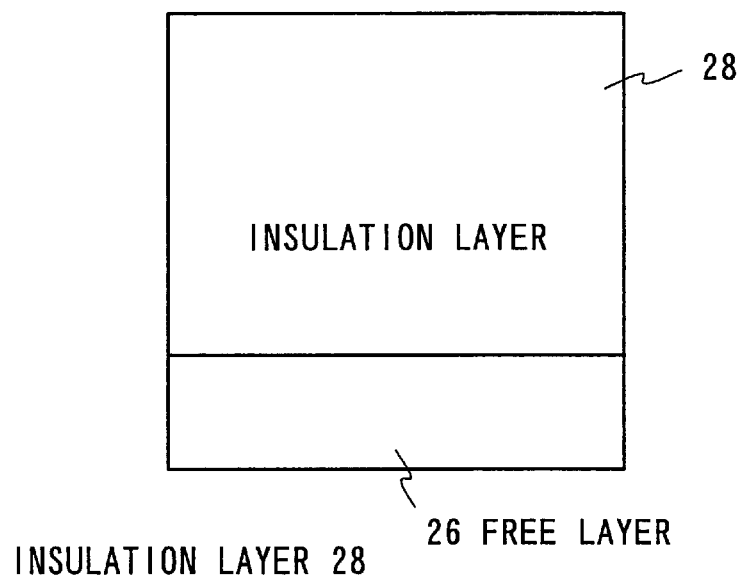
Figure 6F:
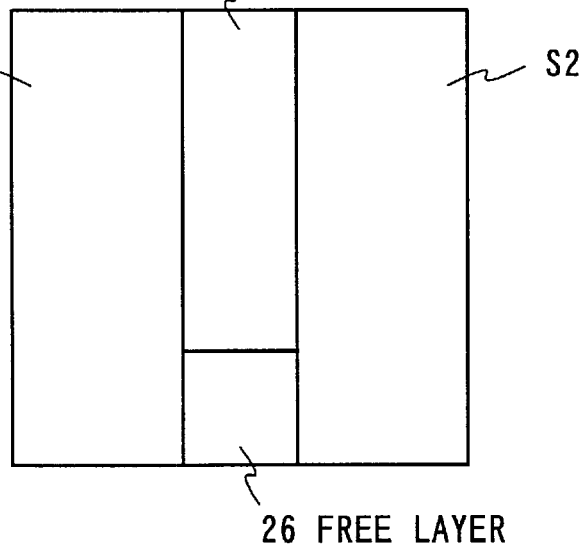
Figure 6G:
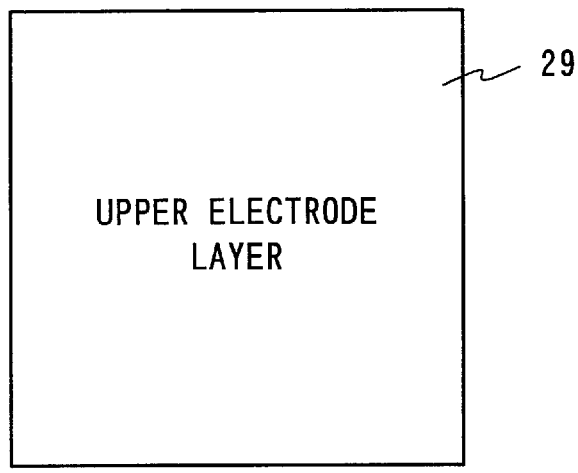
Figure 6H:
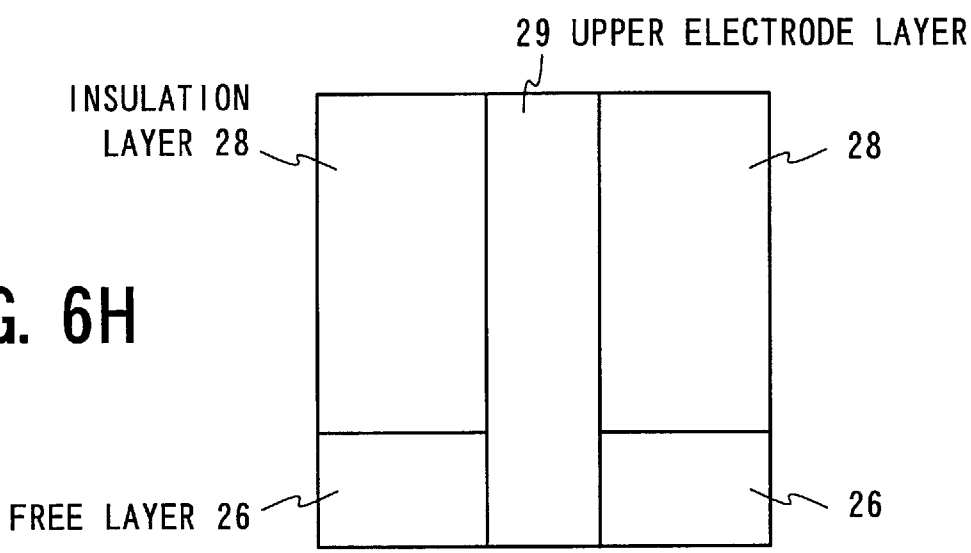
Figure 6I:
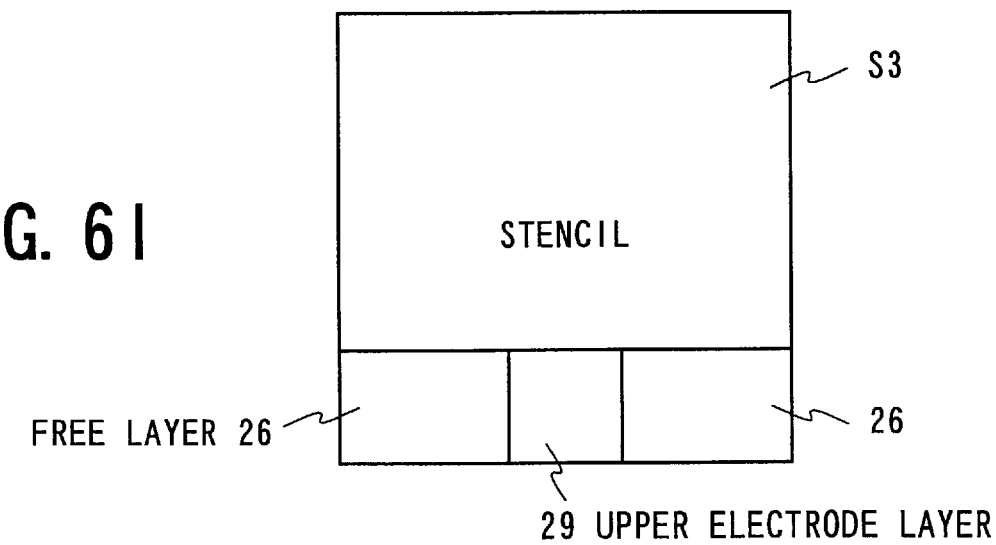
Figure 6J:
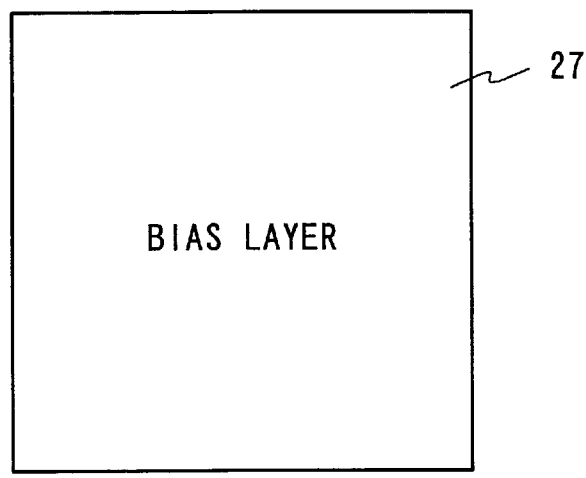

The fourth step (FIGS. 6D and 6E): the insulation layer 28 is formed on the barrier layer 25 and the stencil S1 (FIG. 6D), and then the stencil S1 is lifted off (FIG. 6E).

The fifth step (FIG. 6F): a stencil S2 is formed so as not to cover the regions B2, F2, and G2 shown in FIG. 5B.

The sixth step (FIG. 6G): the upper electrode layer 29 is formed on the free layer 26, the insulation layer 28, and the stencil S2.

The seventh step (FIG. 6H): the stencil S2 is lifted off.

The eighth step (FIG. 6I): a stencil S3 is formed so as to cover the regions A2, B2, C2, D2, and G2 shown in FIG. 5B.

The ninth step (FIG. 6J): the bias layer 27 is formed on the free layer 26, the upper electrode layer 29, and the stencil S3.

The tenth step (FIG. 6K): the stencil S3 is lifted off.

The eleventh step (FIG. 6L): CMP is carried out to form an opening at the region A2 shown in FIG. 5B until the lower electrode layer 22 is exposed.

Final step (FIG. 6M): the upper shield layer 30 is formed on the regions D2, E2, F2, and G2 shown in FIG. 5B, and the read head 14A is completed.

As mentioned above, since the lower electrode layer 22 has strong bond strength, the lower electrode layer 22 is strongly affixed to the layers contacting the lower electrode layer 22, thus, the lower electrode layer 22 is not exfoliated from the contacting layers. Moreover small average surface roughness (equal to or smaller than 0.3 nm) of the lower electrode layer 22 is helpful to form flat MTJ layer on the lower electrode layer 22, thus, a leak current does not occur. According to those characteristics, accurate reading of data stored in the magnetic recording medium is realized, and improved reliability of the read head 14A is available.

EX. 3

The read head 14A having Ex. 3 will now be described.

Figure 7A:
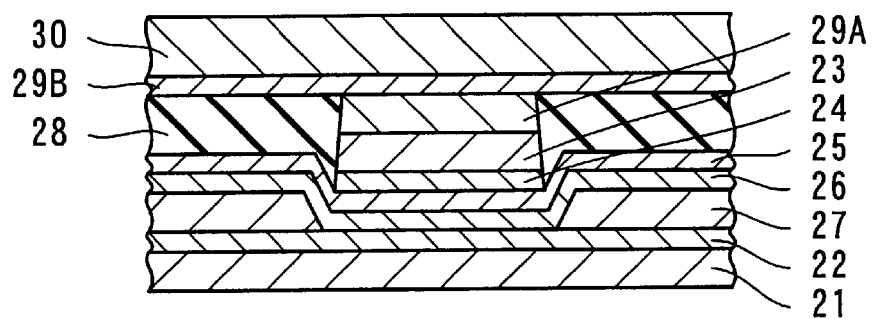
FIG. 7A is a cross sectional view showing a read head according to Ex. 3.
Figure 7B:
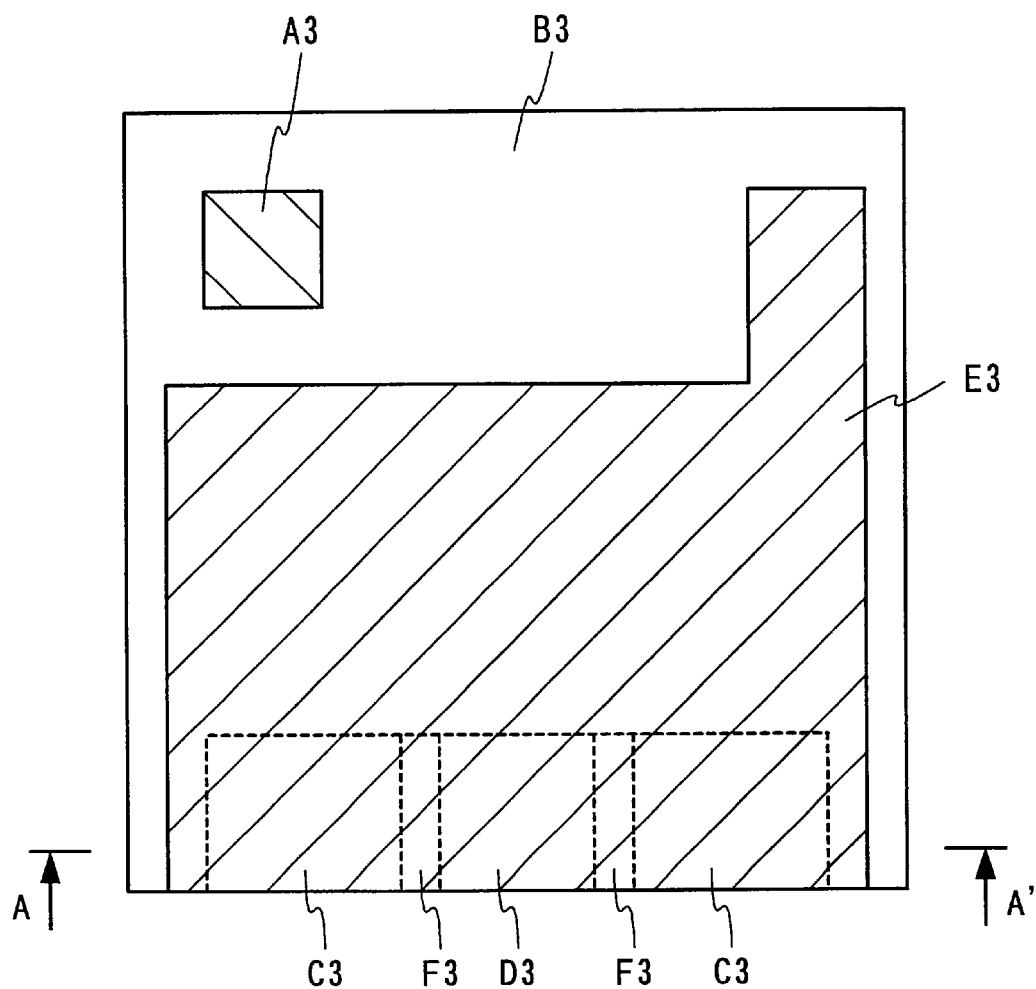
FIG. 7B is a plan view showing the read head shown in FIG. 7A.

FIG. 7A is a cross sectional view showing the read head 14A of the Ex. 3 along an A–A' line shown FIG. 7B which is a plan view of the read head 14A.

As shown in FIG. 7A, the read head 14A of the Ex. 3 comprises the lower shield layer 21, the lower electrode layer 22, the fixer layer 23, the fixed layer 24, the barrier layer 25, the free layer 26, the bias layer 27, the insulation layer 28, a first upper electrode layer 29A, a second upper electrode layer 29B, and the upper shield layer 30. Materials of the layers are substantially the same as those described in Ex. 1. In Ex. 3, deposition order of the MTJ layer (the fixer layer 23, the fixed layer 24, the barrier layer 25, and the free layer 26) is reversed from that described in the Ex. 1 and Ex. 2. Detailed explanation will be followed later.

The lower shield layer 21 is formed on a substrate (not shown) made of aluminum titanate, SiC, almina, or deposition thereof. The lower shield layer 21 and the upper shield layer 30 are prepared to shield incline components of the magnetic field leaked from the magnetic recording medium (magnetic disk 12). This shielding effect helps the read head 14A to have improved resolution. The surface roughness of the lower shield layer 21 is equal to or smaller than 0.3 nm.

The lower electrode layer 22 is formed on the lower shield layer 21. The lower electrode layer 22 is made of any one of the materials shown in table 1 except Al and Cu. The average surface roughness of the selected material should be equal to or smaller than 0.3 nm. Accordingly, the lower electrode layer 22 will have stronger bond strength, thus, the lower electrode layer 22 will be strongly affixed to layers to be formed so as to contact the lower electrode layer 22. Moreover, the layers to be formed above the lower electrode layer 22 will be flattened.

The bias layer 27 is formed on the free layer 26 while being separated into opposite two pieces. As mentioned in Ex. 1, suitable strength of the bias magnetic field is selected so that the read head 14A has appropriate sensitivity for its purpose.

The free layer 26 is formed on the bias layer 27 and the lower electrode layer 22 corresponding to the interval of the bias layer 27 as shown in FIG. 7A. This structure allows the bias layer 27 to apply bias magnetic field to the free layer 26, thus, the free layer 26 has stable magnetic domain.

The barrier layer 25 is formed on the free layer 26. The barrier layer 25 is made of a non-magnetic material in order to magnetically disconnect the fixed layer 24 from the free layer 26. Since the surface roughness of the lower electrode layer 22 is small, the barrier layer 25 is flat. Because the barrier layer 25 is so flattened, a leak current does not occur during data reading.

The fixed layer 24 is formed on the barrier layer 25 between the pieces of the bias layer 27.

The fixer layer 23 is formed on the fixed layer 24. The fixer layer 23 is made of an antiferromagnetic material or a rigid magnetic material. The purpose of the fixer layer 23 is to fix the magnetization direction of the fixed layer 24.

The first upper electrode layer 29A is formed on the fixer layer 23.

The insulation layer 28 is formed on the barrier layer 25 being exposed. The insulation layer 28 regulates a current flow region between the lower and upper electrode layers 22 and 29.

The second upper electrode layer 29B is formed on the first upper electrode layer 29A and the insulation layer 28. A set of the first and second upper electrode layers 29A and 29B corresponds to the upper electrode layer 29 described in Ex. 1 and Ex. 2.

The upper shield layer 30 is formed on the second upper electrode layer 29B.

The structure of the read head 14A in cross section has been described so far with reference to the FIG. 7A. Shapes in plan view of the layers are different from each other. Regions denoted by reference alphanumeric characters A3 to F3 in FIG. 7B represent shapes of the layers in the read head 14A.

Layer structures at the regions A3 to F3 will now be described.

At the region A3, the lower shield layer 21 and the lower electrode layer 22 have been deposited in this order onto the substrate.

At the region B3, the lower shield layer 21, the lower electrode layer 22, the free layer 26, the barrier layer 25, and the insulation layer 28 have been deposited in this order onto the substrate.

At the region C3, the lower shield layer 21, the lower electrode layer 22, the bias layer 27, the free layer 26, the barrier layer 25, the insulation layer 28, the upper electrode layer 29 and the upper shield layer 30 have been deposited in this order onto the substrate.

At the region D3, the lower shield layer 21, the lower electrode layer 22, the free layer 26, the barrier layer 25, the fixed layer 24, the fixer layer 23, the upper electrode layer 29, and the upper shield layer 30 have been deposited in this order onto the substrate.

At the region E3, the lower shield layer 21, the lower electrode layer 22, the free layer 26, the barrier layer 25, the insulation layer 28, the upper electrode layer 29, and the upper shield layer 30 have been deposited in this order onto the substrate.

At the region F3, the lower shield layer 21, the lower electrode layer 22, the bias layer 27, the free layer 26, the barrier layer 25, the insulation layer 28, the upper electrode layer 29, and the upper shield layer 30 have been deposited in this order onto the substrate.

Manufacturing Method for Ex. 3

Typical steps of manufacturing the read head 14A having the Ex. 3 will now be described.

Figure 6K:
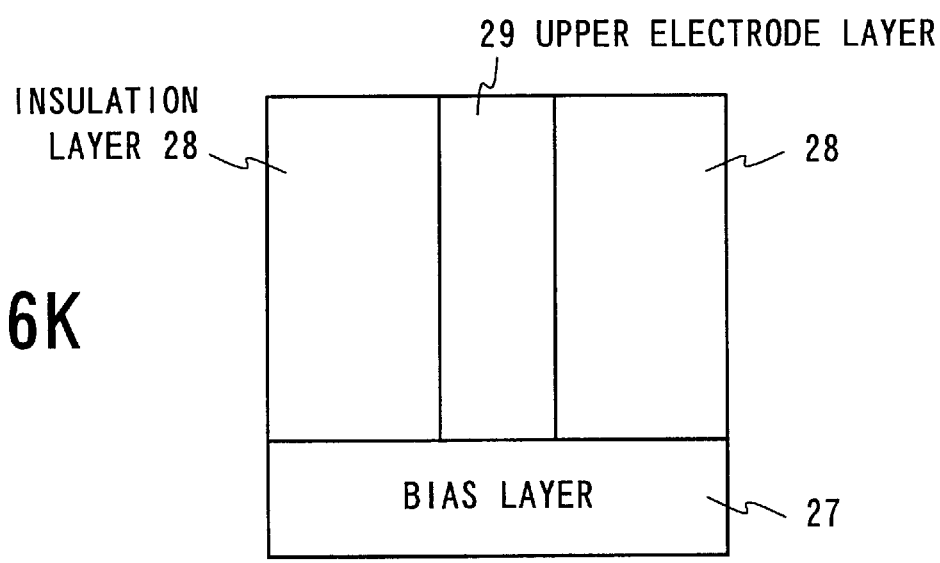
Figure 6L:
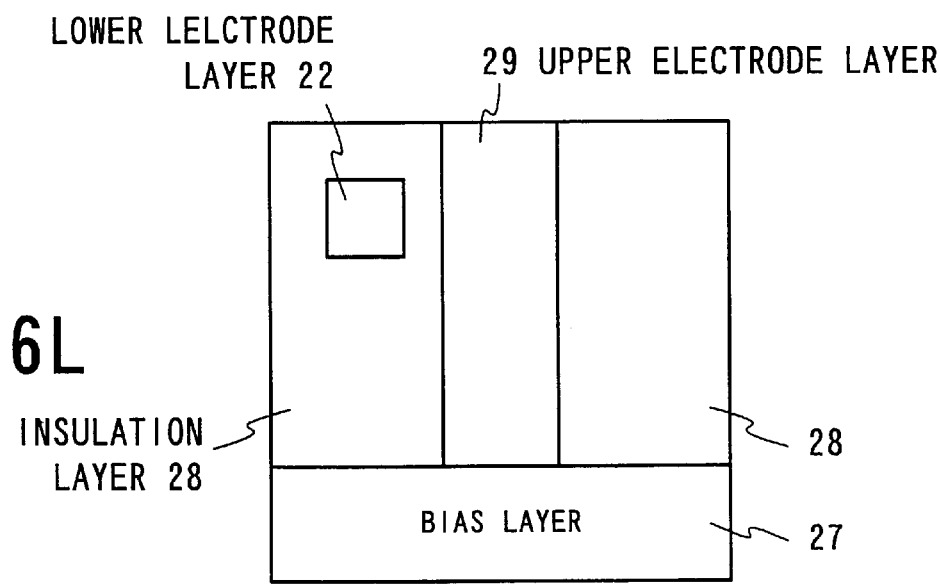
Figure 6M:
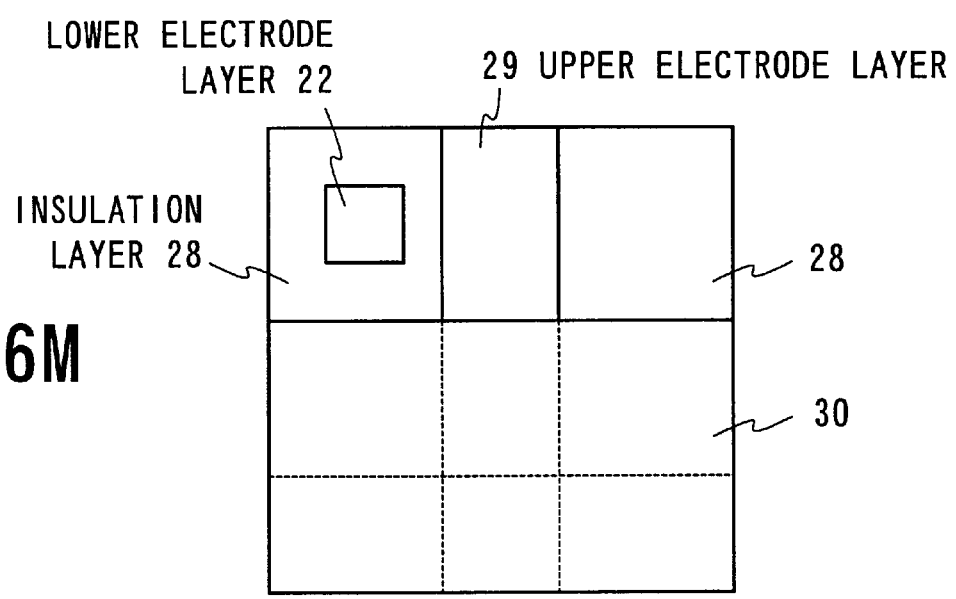
Figure 8A:
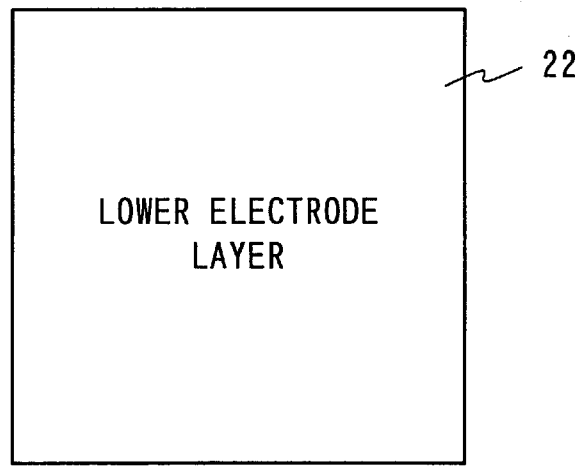
FIGS. 8A to 8K are plan views for explaining steps of manufacturing the read head according to Ex. 3.

FIGS. 8A to 6K are plan views for explaining steps of manufacturing the read head 14A.

The first step (FIG. 8A): the lower shield layer 21 and the lower electrode layer 22 have been deposited in this order onto the substrate.

Figure 8B:
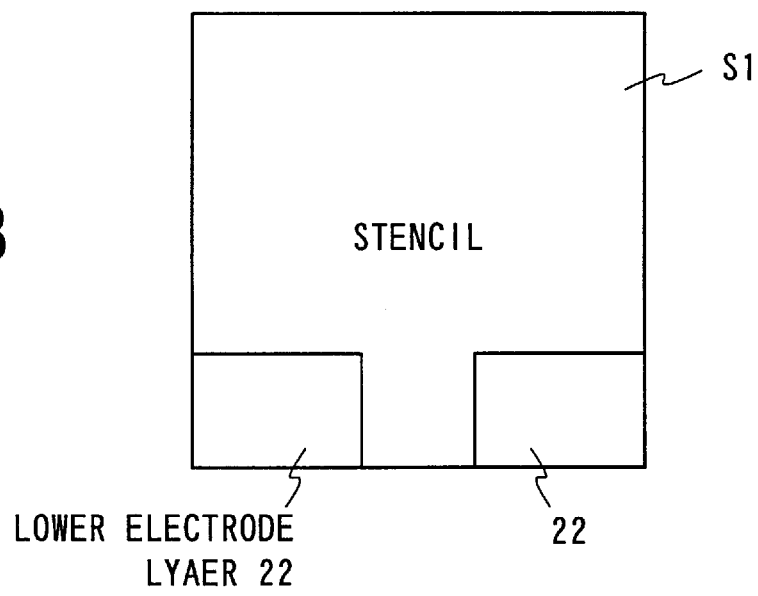

The second step (FIG. 8B): a stencil S1 is formed so as not to cover the regions C3 and F3 shown in FIG. 7B.

Figure 8C:
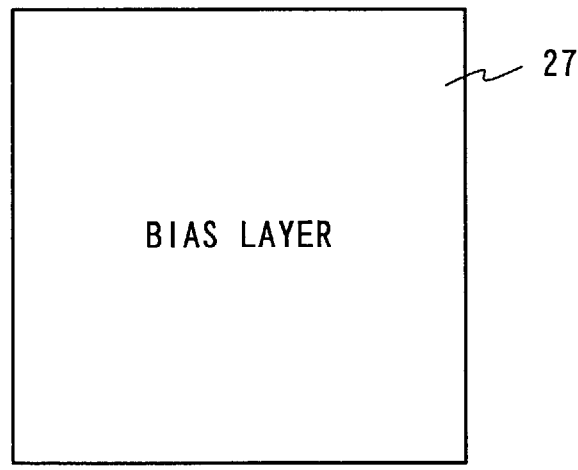

The third step (FIG. 8C): the bias layer 27 is formed on the lower electrode layer 22 and the stencil S1.

Figure 8D:
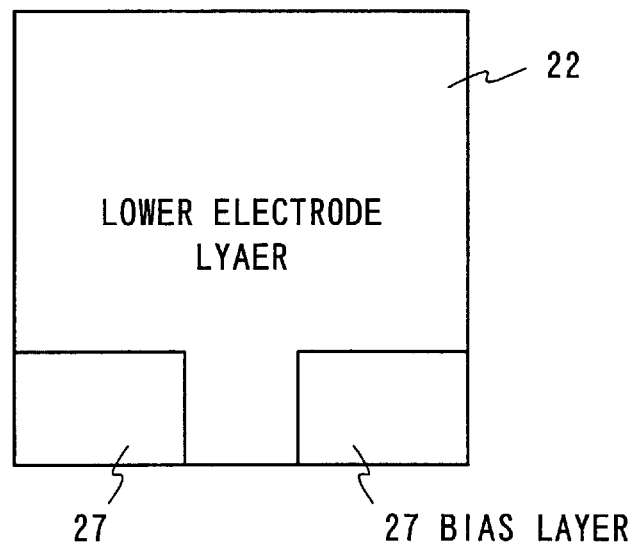

The fourth step (FIG. 8D): the stencil S1 is lifted off.

Figure 8E:
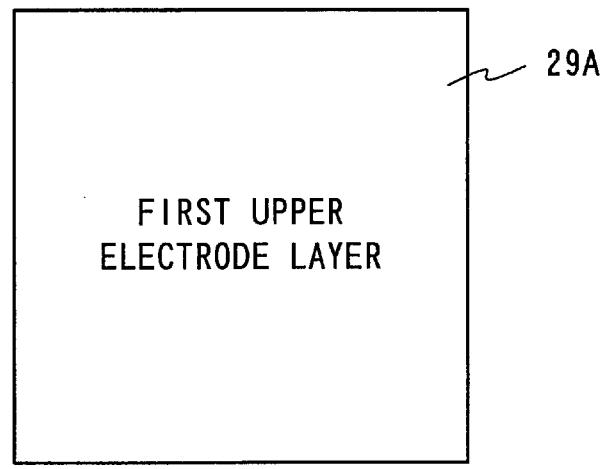

The fifth step (FIG. 8E): the free layer 26, the barrier layer 25, the fixed layer 24, the fixer layer 23, and the first upper electrode layer 29A have been deposited in this order onto the lower electrode layer 22 and the bias layer 27.

Figure 8F:
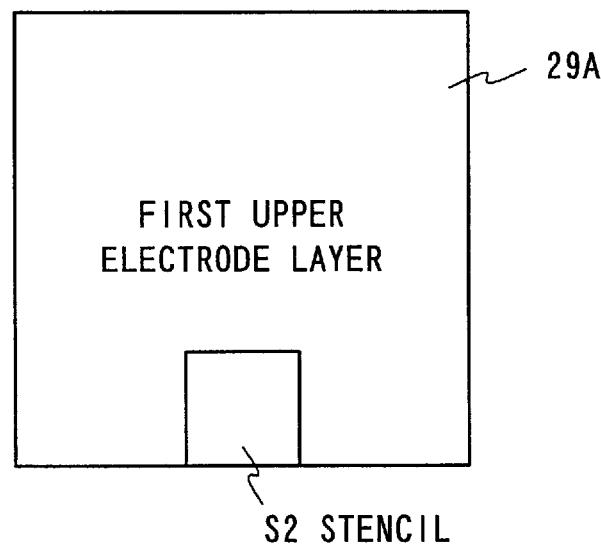

The sixth step (FIG. 8F): a stencil S2 is formed so as to cover the region D3 shown in FIG. 7B.

Figure 8G:
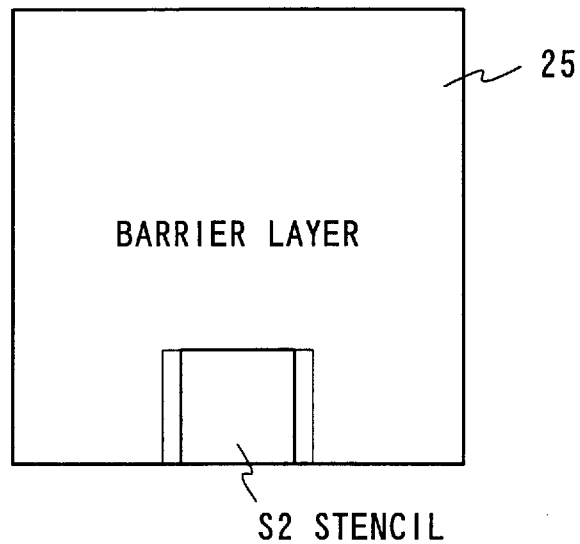

The seventh step (FIG. 8G): ion milling at a region except the stencil S2 is carried out until the barrier layer 25 is exposed.

Figure 8H:
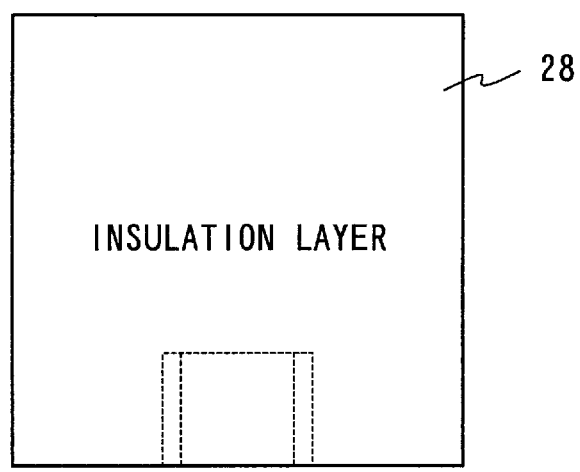
Figure 8I:
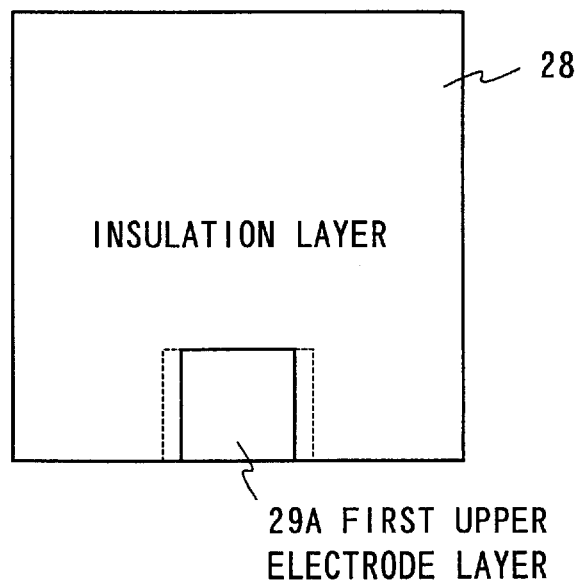

The eighth step (FIGS. 8H and 8I): the insulation layer 28 is formed on the exposed barrier layer 25 and the stencil S2 (FIG. 8H), and then the stencil S2 is lifted off (FIG. 8I).

Figure 8J:
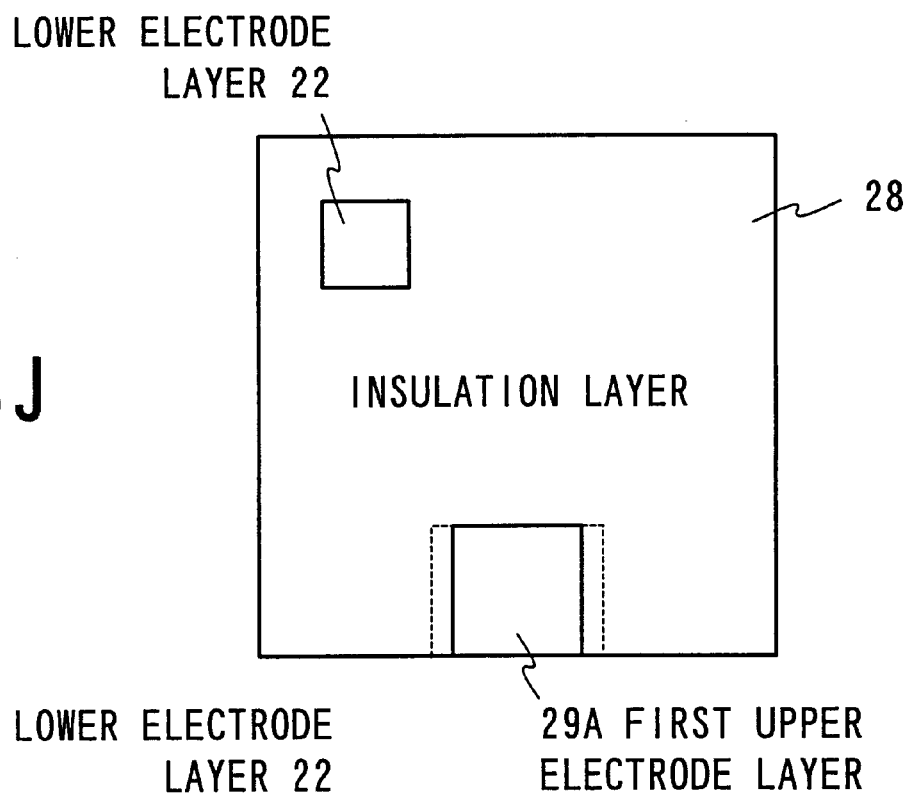

The ninth step (FIG. 8J): CMP is carried out to form an opening at the region A3 shown in FIG. 7B until the lower electrode layer 22 is exposed.

Figure 8K:
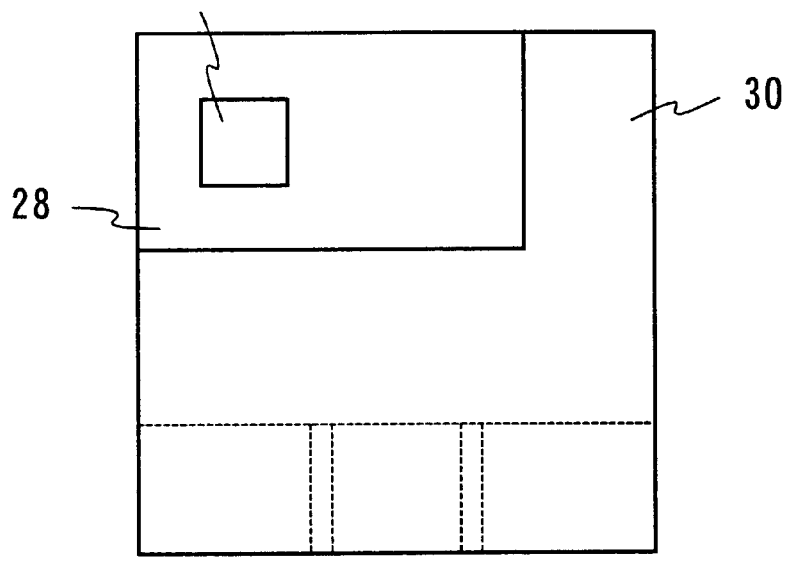

Final step (FIG. 8K): the second upper electrode layer 29B and the upper shield layer 30 have been deposited in this order onto the regions C3, D3, E3, and F3 shown in FIG. 7B, and the read head 14A is completed.

As mentioned above, since the lower electrode layer 22 has strong bond strength, the lower electrode layer 22 is strongly affixed to the layers contacting the lower electrode layer 22, thus, the lower electrode layer 22 is not exfoliated from the contacting layers. Moreover small average surface roughness (equal to or smaller than 0.3 nm) of the lower electrode layer 22 is helpful to form flat MTJ layer on the lower electrode layer 22, thus, a leak current does not occur. According to those characteristics, accurate reading of data stored in the magnetic recording medium is realized, and improved reliability of the read head 14A is available.

EX. 4

The read head 14A having Ex. 4 will now be described.

Figure 9A:
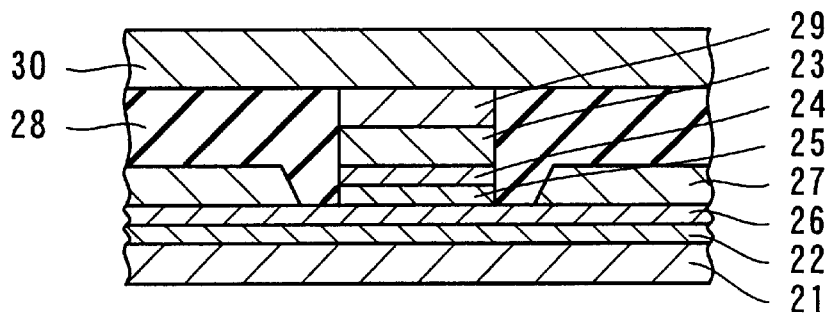
FIG. 9A is a cross sectional view showing a read head according to Ex. 4.
Figure 9B:
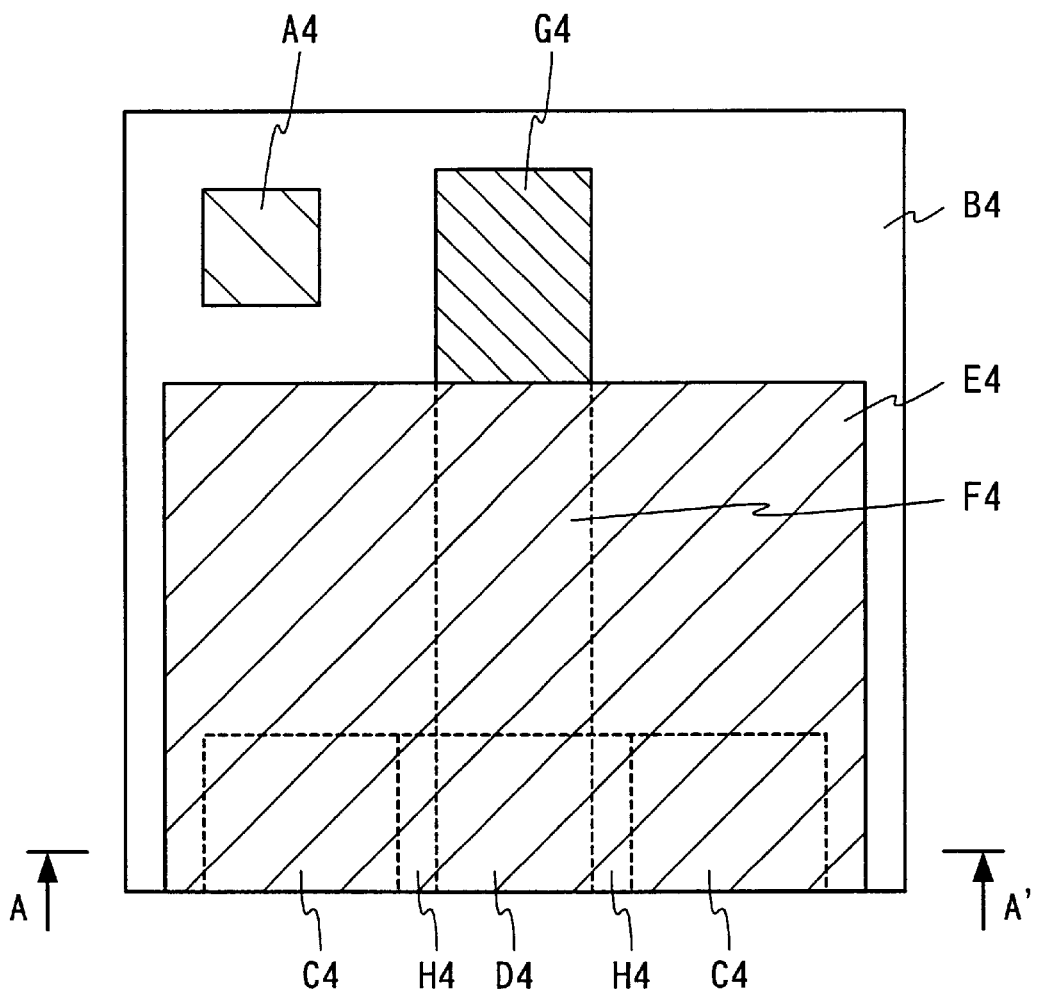
FIG. 9B is a plan view showing the read head shown in FIG. 9A.

FIG. 9A is a cross sectional view showing the read head 14A of the Ex. 4 along an A–A' line shown FIG. 9B which is a plan view of the read head 14A.

As shown in FIG. 9A, the read head 14A of the Ex. 4 comprises the lower shield layer 21, the lower electrode layer 22, the fixer layer 23, the fixed layer 24, the barrier layer 25, the free layer 26, the bias layer 27, the insulation layer 28, the upper electrode layer 29, and the upper shield layer 30. Materials of the layers are substantially the same as those described in Ex. 1. In Ex. 4, deposition order of the MTJ layer (the fixer layer 23, the fixed layer 24, the barrier layer 25, and the free layer 26) is reversed from that described in the Ex. 1 and Ex. 2. Detailed explanation will be followed later.

The lower shield layer 21 is formed on a substrate (not shown) made of aluminum titanate, SiC, almina, or deposition thereof. The lower shield layer 21 and the upper shield layer 30 are prepared to shield incline components of the magnetic field leaked from the magnetic recording medium (magnetic disk 12). This shielding effect helps the read head 14A to have improved resolution. The surface roughness of the lower shield layer 21 is equal to or smaller than 0.3 nm.

The lower electrode layer 22 is formed on the lower shield layer 21. The lower electrode layer 22 is made of any one of the materials shown in table 1 except Al and Cu. The average surface roughness of the selected material should be equal to or smaller than 0.3 nm. Accordingly, the lower electrode layer 22 will have stronger bond strength, thus, the lower electrode layer 22 will be strongly affixed to layers to be formed so as to contact the lower electrode layer 22. Moreover, the layers to be formed above the lower electrode layer 22 will be flattened.

The free layer 26 is formed on the lower electrode layer 22.

As shown in FIG. 9A, the bias layer 27 is formed on the free layer 26 while being separated into opposite two pieces. The bias layer 27 applies bias magnetic field to the free layer 26 in order to cause the free layer 26 to have stable magnetic domain. As mentioned in Ex. 1, suitable strength of the bias magnetic field is selected so that the read head 14A has appropriate sensitivity for its purpose.

The barrier layer 25 is formed on the free layer 26 between the pieces of the bias layer 27. The barrier layer 25 is made of a non-magnetic material in order to magnetically disconnect the fixed layer 24 from the free layer 26. Since the surface roughness of the lower electrode layer 22 is small, the barrier layer 25 is flat. Because the barrier layer 25 is so flattened, a leak current does not occur during data reading.

The fixed layer 24 is formed on the barrier layer 25.

The fixer layer 23 is formed on the fixed layer 24. The fixer layer 23 is made of an antiferromagnetic material or a rigid magnetic material. The purpose of the fixer layer 23 is to fix the magnetization direction of the fixed layer 24.

The upper electrode layer 29 is formed on the fixer layer 23.

As shown in FIG. 9A, the insulation layer 28 is formed on the bias layer 27 and the free layer 26 being exposed. The insulation layer 28 regulates a current flow region between the lower and upper electrode layers 22 and 29.

The upper shield layer 30 is formed on the insulation layer 28 and the upper electrode layer 29.

The structure of the read head 14A in cross section has been described so far with reference to the FIG. 9A. Shapes in plan view of the layers are different from each other. Regions denoted by reference alphanumeric characters A4 to H4 in FIG. 9B represent shapes of the layers in the read head 14A.

Layer structures at the regions A4 to H4 will now be described.

At the region A4, the lower shield layer 21 and the lower electrode layer 22 have been deposited in this order onto the substrate.

At the region B4, the lower shield layer 21, the lower electrode layer 22, the free layer 26, the barrier layer 25, and the insulation layer 28 have been deposited in this order onto the substrate.

At the region C4, the lower shield layer 21, the lower electrode layer 22, the free layer 26, the bias layer 27, the barrier layer 25, the insulation layer 28, and the upper shield layer 30 have been deposited in this order onto the substrate.

At the region D4, the lower shield layer 21, the lower electrode layer 22, the free layer 26, the barrier layer 25, the fixed layer 24, the fixer layer 23, the upper electrode layer 29, and the upper shield layer 30 have been deposited in this order onto the substrate.

At the region E4, the lower shield layer 21, the lower electrode layer 22, the free layer 26, the barrier layer 25, the insulation layer 28, and the upper shield layer 30 have been deposited in this order onto the substrate.

At the region F4, the lower shield layer 21, the lower electrode layer 22, the free layer 26, the barrier layer 25, the insulation layer 28, the upper electrode layer 29, and the upper shield layer 30 have been deposited in this order onto the substrate. At the region G4, the lower shield layer 21, the lower electrode layer 22, the free layer 26, the barrier layer 25, the insulation layer 28, and the upper electrode layer 29 have been deposited in this order onto the substrate.

At the region H4, the lower shield layer 21, the lower electrode layer 22, the free layer 26, the insulation layer 28, and the upper shield layer 30 have been deposited in this order onto the substrate.

Manufacturing Method for Ex. 4

Typical steps of manufacturing the read head 14A having the Ex. 4 will now be described. Although shapes of the upper electrode layer 29 and the upper shield layer 30 in plan view are different from each other with reference to FIGS. 9A and 9B, the following explanation of the manufacturing steps will describe a case where the upper electrode layer 29 and the upper shield layer 30 have the same shape for simple explanation. In the following explanation, the shapes of them in plan view are substantially the same as the shape of the upper shield layer 30 described in Ex. 3.

FIGS. 10A to 10J are plan views for explaining steps of manufacturing the read head 14A.

The first step (FIG. 10A): the lower shield layer 21, the lower electrode layer 22, the MTJ layer (the free layer 26, the barrier layer 25, the fixed layer 24, and the fixer layer 23), and the upper electrode layer 29A have been deposited in this order onto the substrate.

The second step (FIG. 10B): a stencil S1 is formed on the region D4 shown in FIG. 9B.

The third step (FIG. 10C): ion milling at a whole region except the stencil S1 is carried out until the barrier layer 25 is exposed.

The fourth step (FIG. 10D): the stencil S1 is removed.

The fifth step (FIG. 10E): a stencil S2 is formed so as not to cover the region C4 shown in FIG. 9B.

Figure 10A:
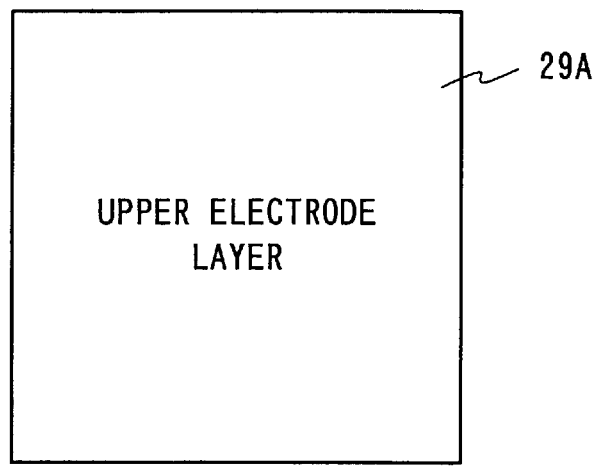
FIGS. 10A to 10J are plan views for explaining steps of manufacturing the read head according to Ex. 4.
Figure 10B:
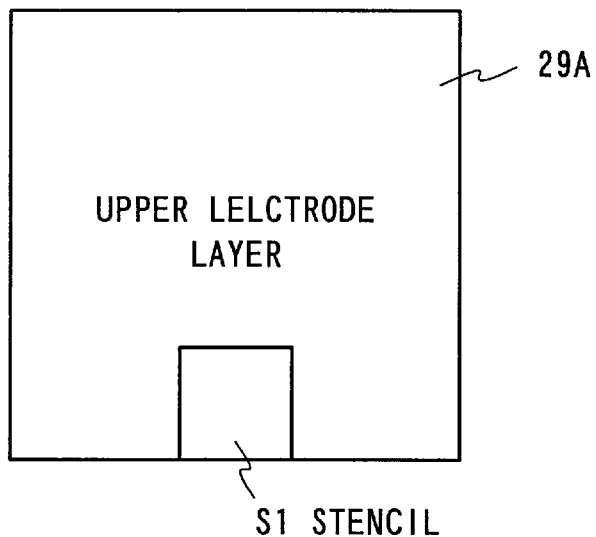
Figure 10C:
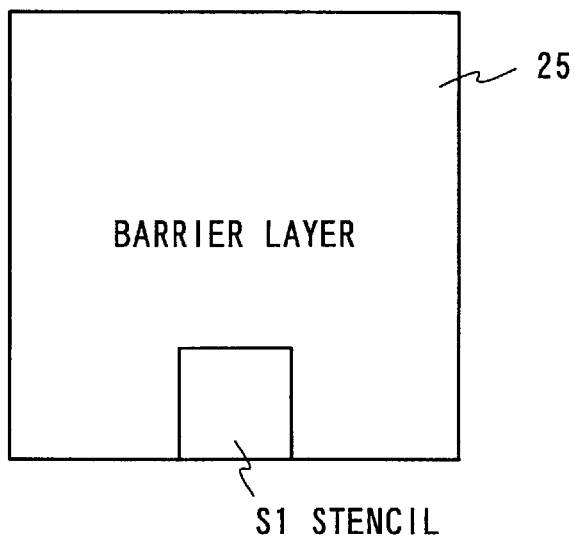
Figure 10D:
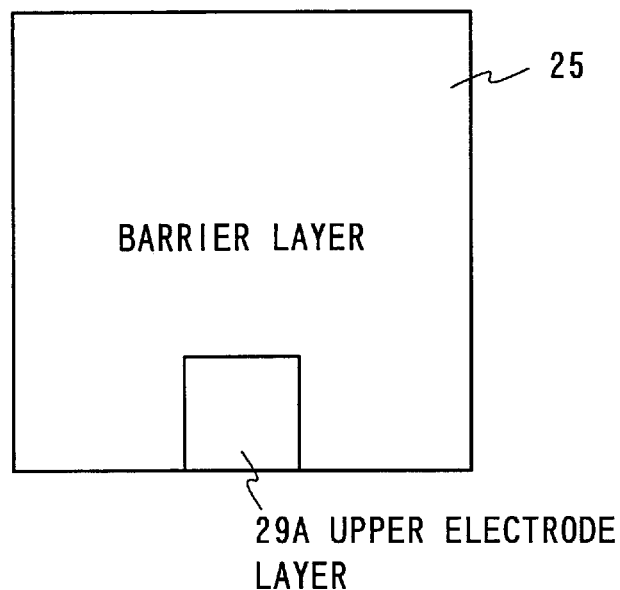
Figure 10E:
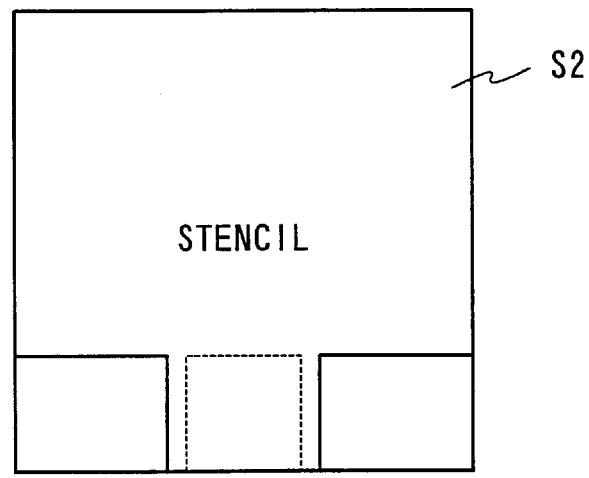
Figure 10F:
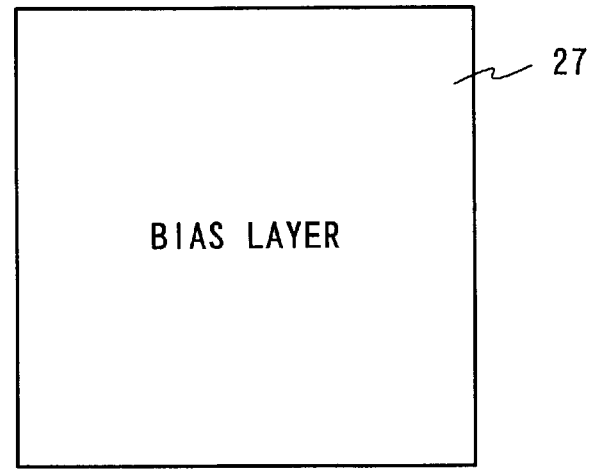
Figure 10G:
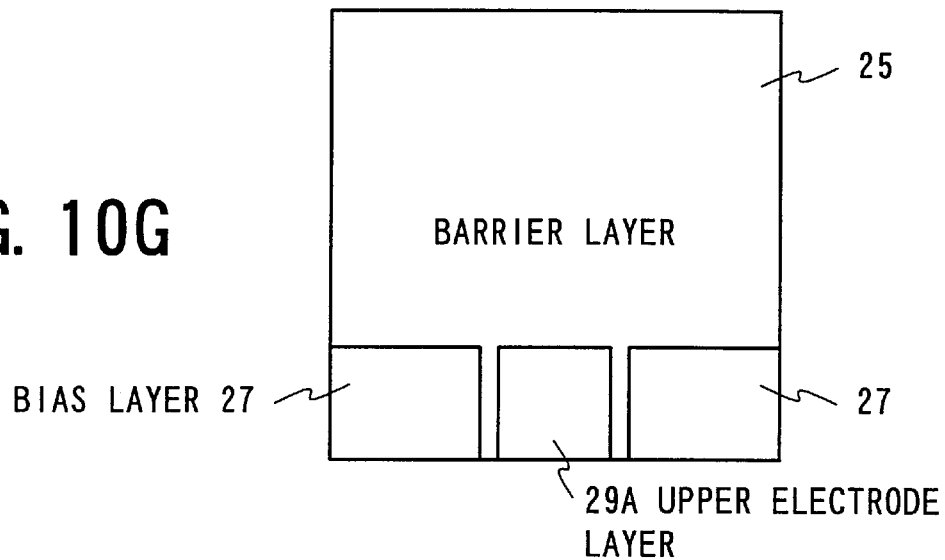
Figure 10H:
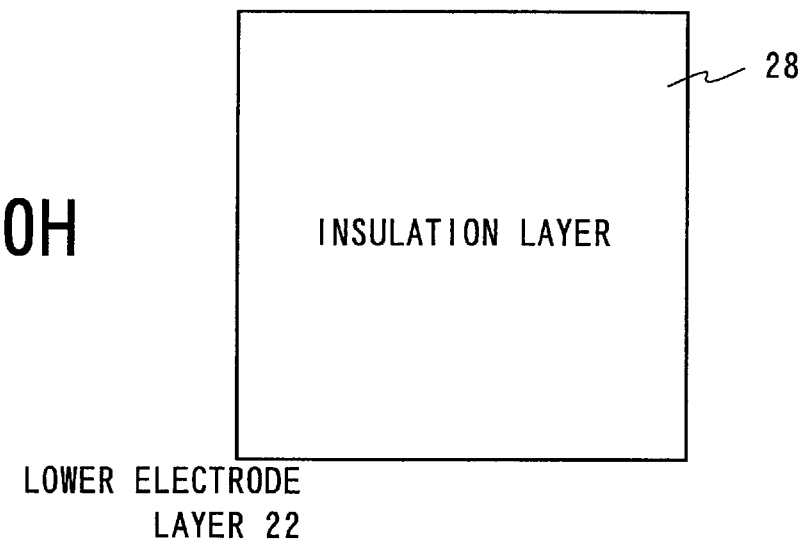
Figure 10I:
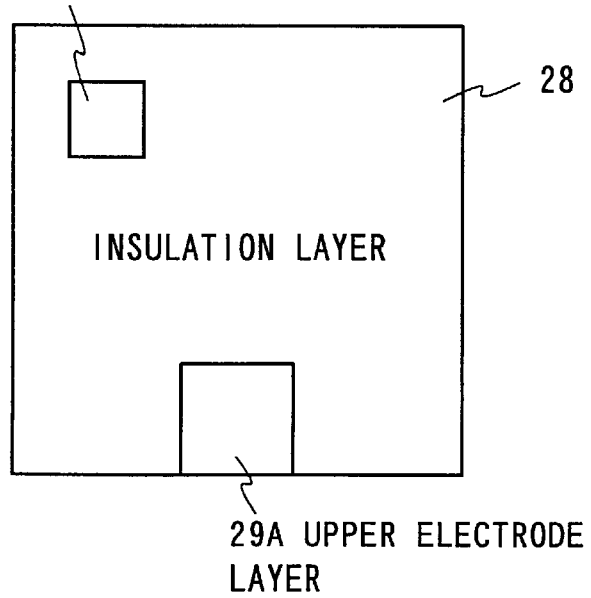
Figure 10J:
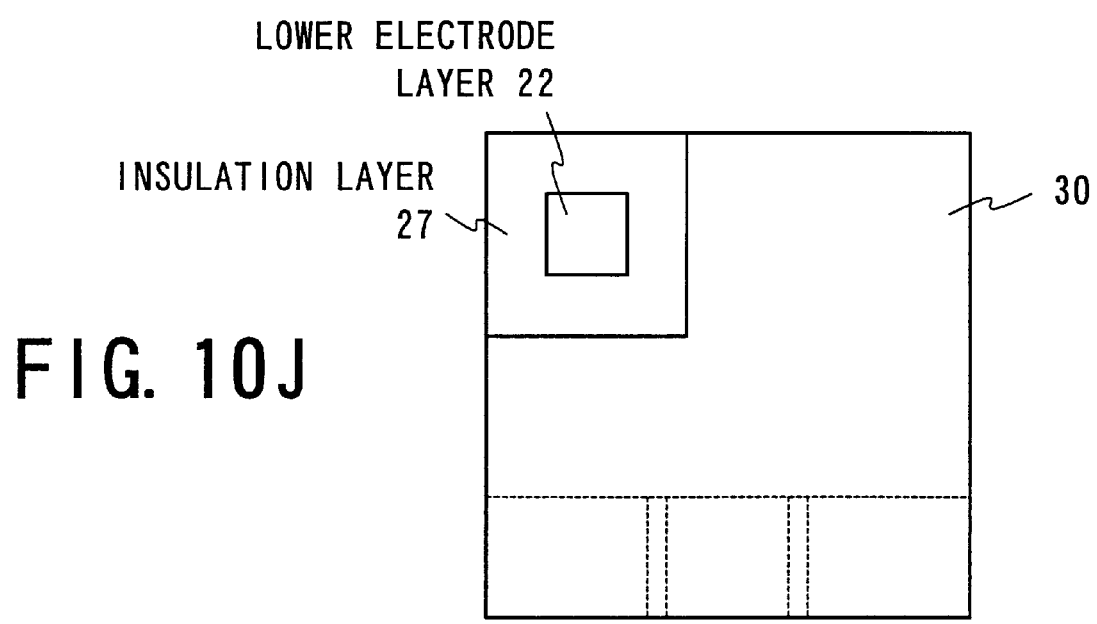

The sixth step (FIGS. 10F and 10G): the bias layer 27 is formed on the stencil S2 and the free layer 26 (FIG. 10F), and then the stencil S2 is lifted off (FIG. 10G).

The seventh step (FIG. 10H): the insulation layer 28 is formed on the barrier layer 25, the bias layer 27, and the upper electrode layer 29A.

The eighth step (FIG. 10I): CMP is carried out to form an opening at the region A3 shown in FIG. 9B until the lower electrode layer 22 is exposed, and further the region D4 (FIG. 9B) on the insulation layer 28 is etched until the upper electrode layer 29A is exposed.

Final step (FIG. 10J): the upper electrode layer 29B and the upper shield layer 30 have been deposited in this order onto the regions C4 to H4 (FIG. 9B), and the read head 14A is completed. In this case, a set of the upper electrode layers 29A and 29B acts as the upper electrode layer 29.

As mentioned above, since the lower electrode layer 22 is affixed to layers contacting the lower electrode layer 22 with strong bond strength, the lower electrode layer 22 is not exfoliated from the contacting layers. Moreover small average surface roughness (equal to or smaller than 0.3 nm) of the lower electrode layer 22 is helpful to form flat MTJ layer on the lower electrode layer 22, thus, a leak current does not occur. According to those characteristics, accurate reading of data stored in the magnetic recording medium is realized, and improved reliability of the read head 14A is available.

EX. 5

The read head 14A having Ex. 5 will now be described.

Figure 11A:
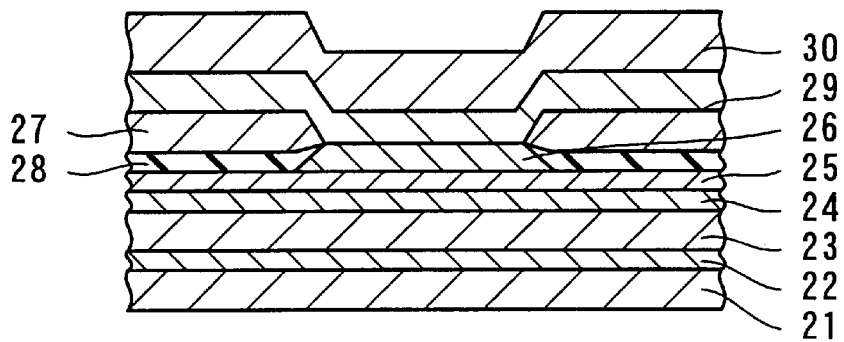
FIG. 11A is a cross sectional view showing a read head according to Ex. 5.
Figure 11B:
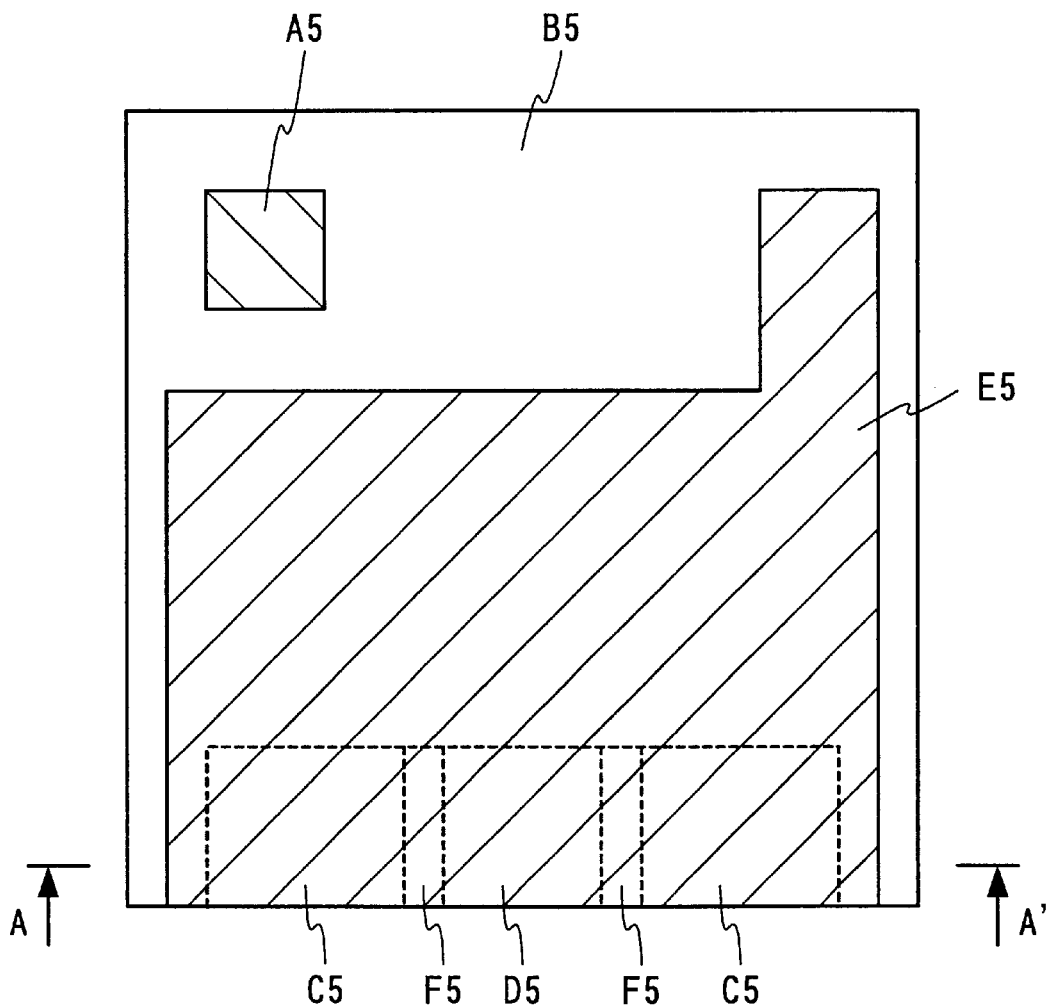
FIG. 11B is a plan view showing the read head shown in FIG. 11A.

FIG. 11A is a cross sectional view showing the read head 14A of the Ex. 5 along an A–A' line shown FIG. 11B which is a plan view of the read head 14A.

As shown in FIG. 11A, the read head 14A of the Ex. 5 comprises the lower shield layer 21, the lower electrode layer 22, the fixer layer 23, the fixed layer 24, the barrier layer 25, the free layer 26, the bias layer 27, the insulation layer 28, the upper electrode layer 29, and the upper shield layer 30. Materials of the layers are substantially the same as those described in Ex. 1.

The lower shield layer 21 is formed on a substrate (not shown) made of aluminum titanate, SiC, almina, or deposition thereof. The lower shield layer 21 and the upper shield layer 30 are prepared to shield incline components of the magnetic field leaked from the magnetic recording medium (magnetic disk 12). This shielding effect helps the read head 14A to have improved resolution. The surface roughness of the lower shield layer 21 is equal to or smaller than 0.3 nm.

The lower electrode layer 22 is formed on the lower shield layer 21. The lower electrode layer 22 is made of any one of the materials shown in table 1 except Al and Cu.

The average surface roughness of the selected material should be equal to or smaller than 0.3 nm. Accordingly, the lower electrode layer 22 will have stronger bond strength, thus, the lower electrode layer will be strongly affixed to layers to be formed so as to contact the lower electrode layer 22. Moreover, the layers to be formed above the lower electrode layer 22 will be flattened.

A set of the fixer layer 23, the fixed layer 24, the barrier layer 25, and the free layer 26 forms the aforementioned MTJ layer.

The fixer layer 23 is formed on the lower electrode layer 22. The fixer layer 23 is made of an antiferromagnetic material or a rigid magnetic material. The purpose of the fixer layer 23 is to fix the magnetization direction of the fixed layer 24.

The fixed layer 24 is formed on the fixer layer 23, and is magnetized in a predetermined direction by the fixer layer 23.

The barrier layer 25 is formed on the fixed layer 24 in order to magnetically disconnect the fixed layer 24 from the free layer 26. Since the surface roughness of the lower electrode layer 22 is small, the barrier layer 25 is flat. Because the barrier layer 25 is so flattened, a leak current does not occur during data reading.

The free layer 26 is formed at a predetermined region on the barrier layer 25.

The insulation layer 28 is formed on the barrier layer 25 so as not to cover the free layer 26 on the barrier layer 25. The insulation layer 28 regulates a current flow area between the lower and upper electrode layers 22 and 29.

The bias layer 27 is formed on the insulation layer 28 so that its ends contact the free layer 26 as shown in FIG. 11A. The bias layer 27 applies bias magnetic field to the free layer 26 in order to cause the free layer 26 to have stable magnetic domain. As mentioned in Ex. 1, suitable strength of the bias magnetic field is selected so that the read head 14A has appropriate sensitivity for its purpose.

The upper electrode layer 29 is formed on the free layer 26 and the bias layer 27.

The upper shield layer 30 is formed on the upper electrode layer 29.

The structure of the read head 14A in cross section has been described so far with reference to the FIG. 11A. Shapes in plan view of the layers are different from each other. Regions denoted by reference alphanumeric characters A5 to F5 in FIG. 11B represent shapes of the layers in the read head 14A.

Layer structures at the regions A5 to F5 will now be described.

At the region A5, the lower shield layer 21 and the lower electrode layer 22 have been deposited in this order onto the substrate.

At the region B5, the lower shield layer 21, the lower electrode layer 22, the fixer layer 23, the fixed layer 24, the barrier layer 25, and the insulation layer 28 have been deposited in this order onto the substrate.

At the region C5, the lower shield layer 21, the lower electrode layer 22, the fixer layer 23, the fixed layer 24, the barrier layer 25, the insulation layer 28, the bias layer 27, the upper electrode layer 29, and the upper shield layer 30 have been deposited in this order onto the substrate.

At the region D5, the lower shield layer 21, the lower electrode layer 22, the fixer layer 23, the fixed layer 24, the barrier layer 25, the free layer 26, the upper electrode layer 29, and the upper shield layer 30 have been deposited in this order onto the substrate.

At the region E5, the lower shield layer 21, the lower electrode layer 22, the fixer layer 23, the fixed layer 24, the barrier layer 25, the insulation layer 28, the upper electrode layer 29, and the upper shield layer 30 have been deposited in this order onto the substrate.

At the region F5, the lower shield layer 21, the lower electrode layer 22, the fixer layer 23, the fixed layer 24, the barrier layer 25, the free layer 26, the insulation layer 28, the bias layer 27, the upper electrode layer 29, and the upper shield layer 30 have been deposited in this order onto the substrate.

Manufacturing Method for Ex. 5

Typical steps of manufacturing the read head 14A having the Ex. 5 will now be described.

FIGS. 12A to 12J are plan views for explaining steps of manufacturing the read head 14A.

The first step (FIG. 12A): the lower shield layer 21, the lower electrode layer 22, and the MTJ layer (the fixer layer 23, the fixed layer 24, the barrier layer 25, and the free layer 26) have been deposited in this order onto the substrate.

The second step (FIG. 12B): a stencil S1 is formed on the region D5 shown in FIG. 11B.

The third step (FIG. 12C): ion milling at a whole region except the stencil S1 is carried out until the barrier layer 25 is exposed.

Figure 12A:
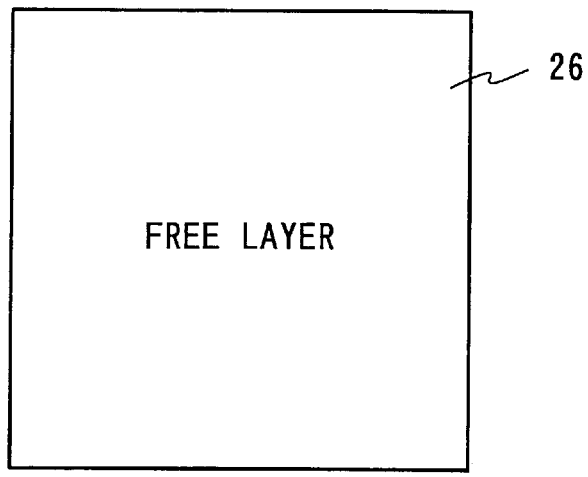
FIGS. 12A to 12J are plan views for explaining steps of manufacturing the read head according to Ex. 5.
Figure 12B:
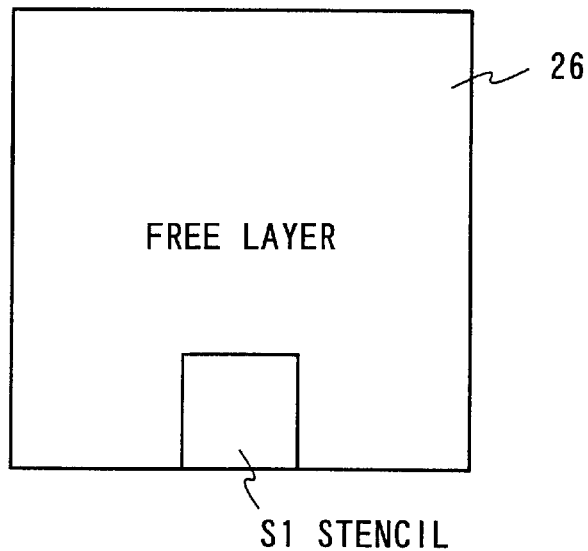
Figure 12C:
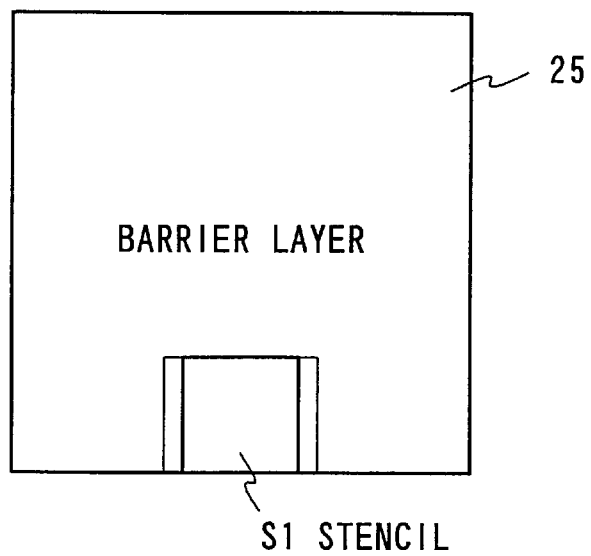
Figure 12D:
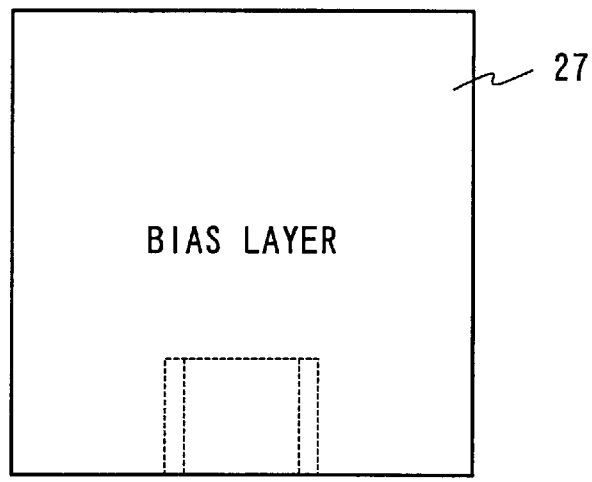
Figure 12E:
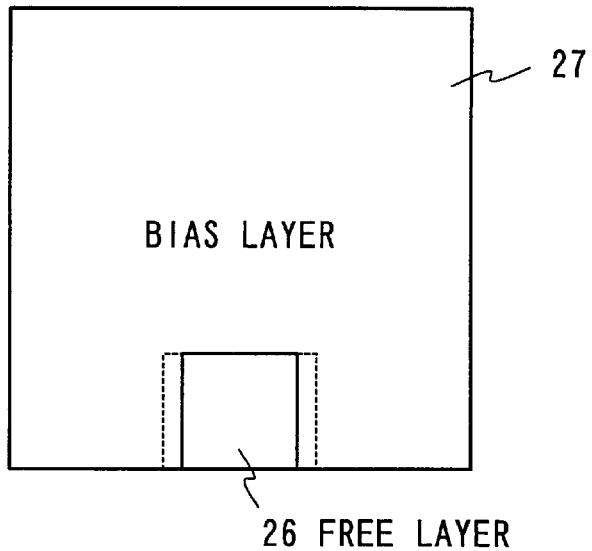
Figure 12F:
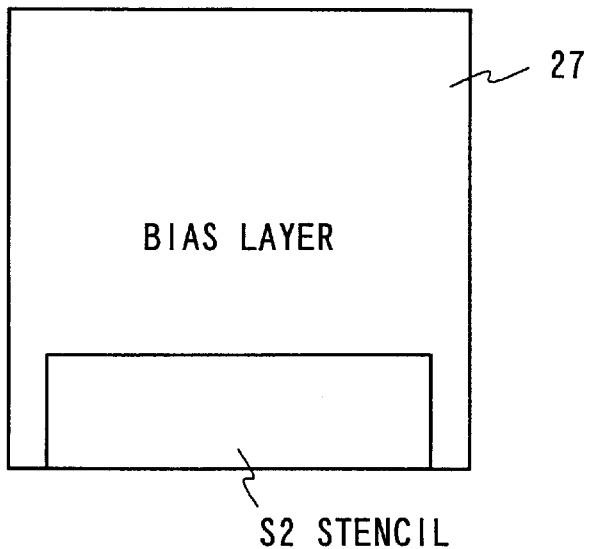
Figure 12G:
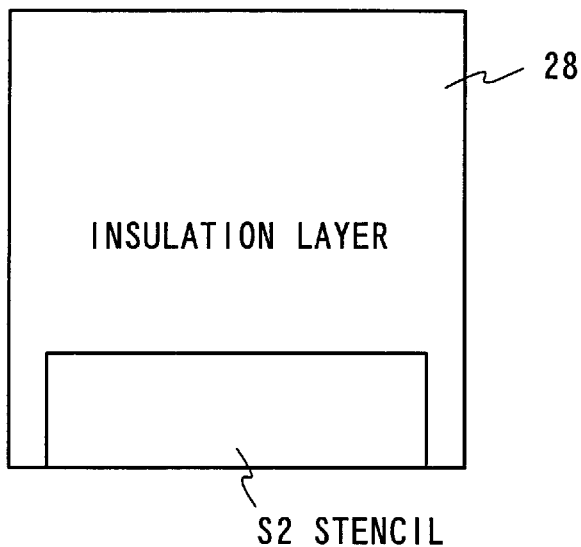

The fourth step (FIGS. 12D and 12E): the insulation layer 28 and the bias layer 27 have been deposited in this order onto the barrier layer 25 and the stencil S1 (FIG. 12D), and then the stencil S1 is lifted off (FIG. 12E).

The fifth step (FIG. 12F): a stencil S2 is formed so as to cover the regions C5, D5, and F5 shown in FIG. 11B.

Figure 12H:
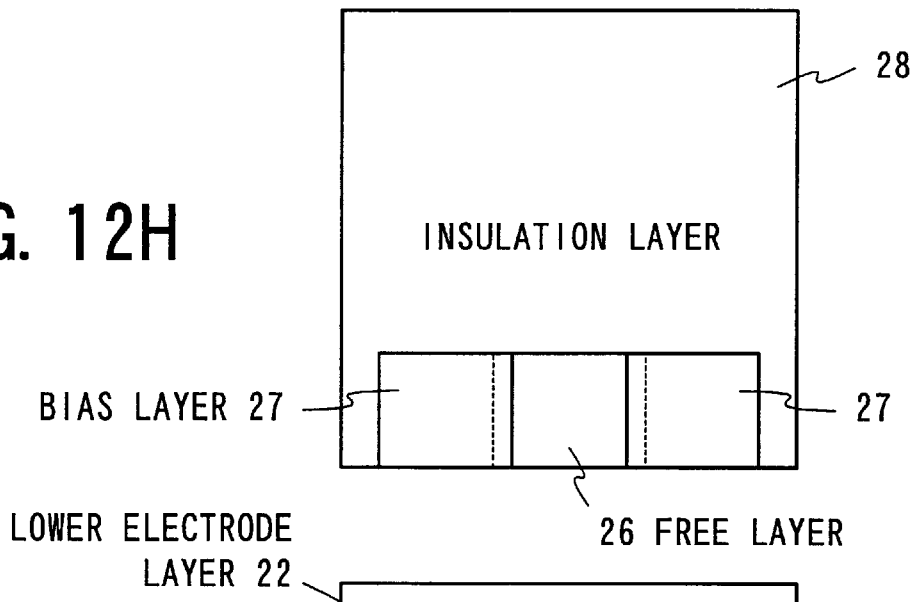
Figure 12I:
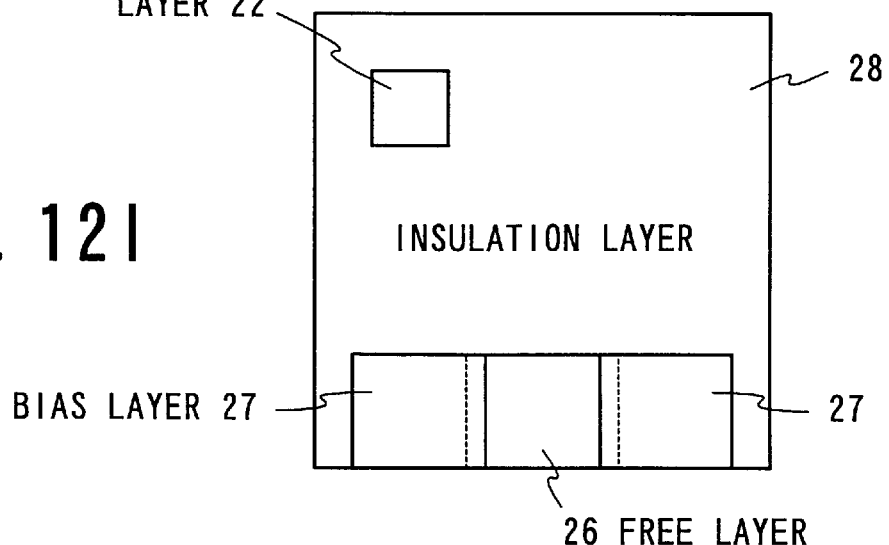
Figure 12J:
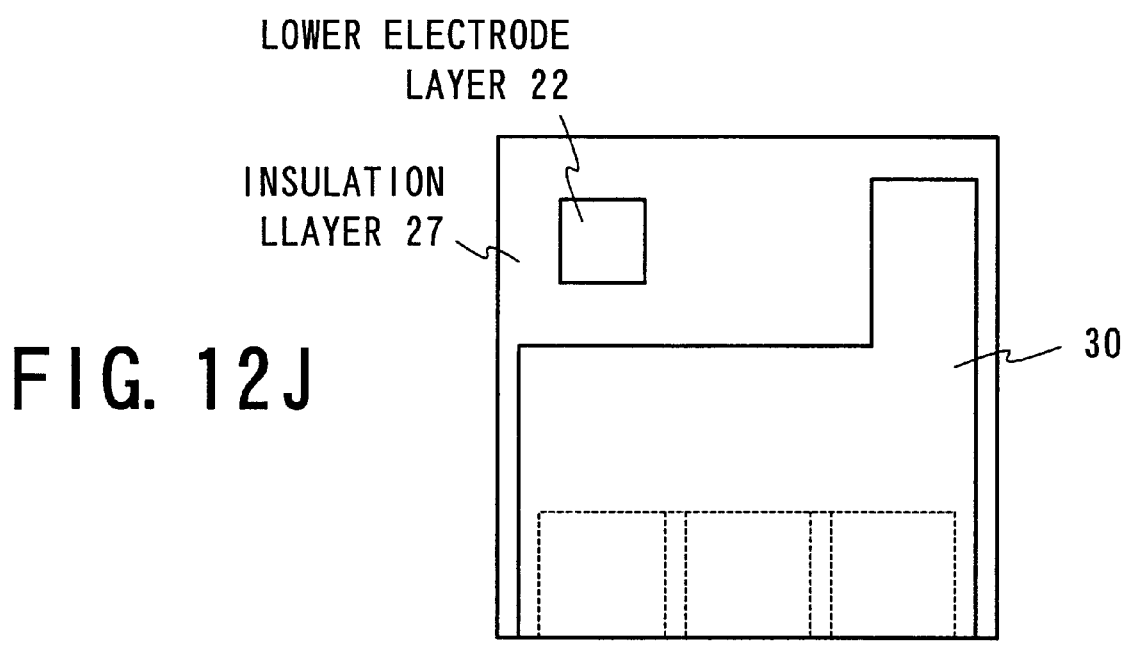

The sixth step (FIGS. 12G and 12H): ion milling at a whole region except the stencil S2 is carried out until the insulation layer 28 is exposed (FIG. 12G), and then the stencil S2 is exfoliated (FIG. 12H).

The seventh step (FIG. 12I): CMP is carried out to form an opening at the region A5 shown in FIG. 11B until the lower electrode layer 22 is exposed.

Final step (FIG. 12J): the upper electrode layer 29 and the upper shield layer 30 have been deposited in this order onto the regions C5 to F5 shown in FIG. 11B, and the read head 14A is completed.

As mentioned above, since the lower electrode layer 22 is affixed to layers contacting the lower electrode layer 22 with strong bond strength, the lower electrode layer 22 is not exfoliated from the contacting layers. Moreover small average surface roughness (equal to or smaller than 0.3 nm) of the lower electrode layer 22 is helpful to form flat MTJ layer on the lower electrode layer 22, thus, a leak current does not occur. According to those characteristics, accurate reading of data stored in the magnetic recording medium is realized, and improved reliability of the read head 14A is available.

EX. 6

The read head 14A having Ex. 6 will now be described.

Figure 13A:
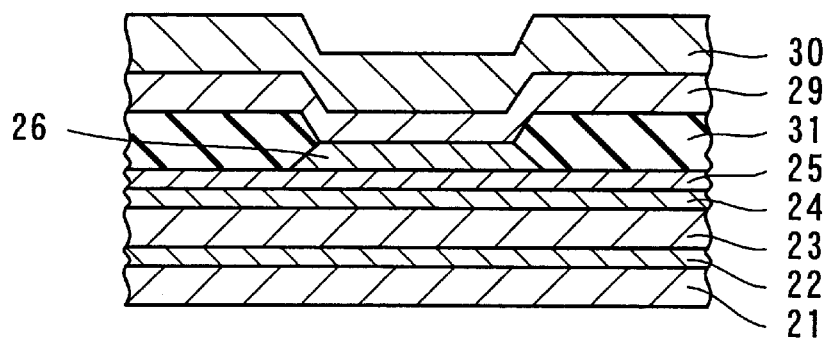
FIG. 13A is a cross sectional view showing a read head according to Ex. 6.
Figure 13B:
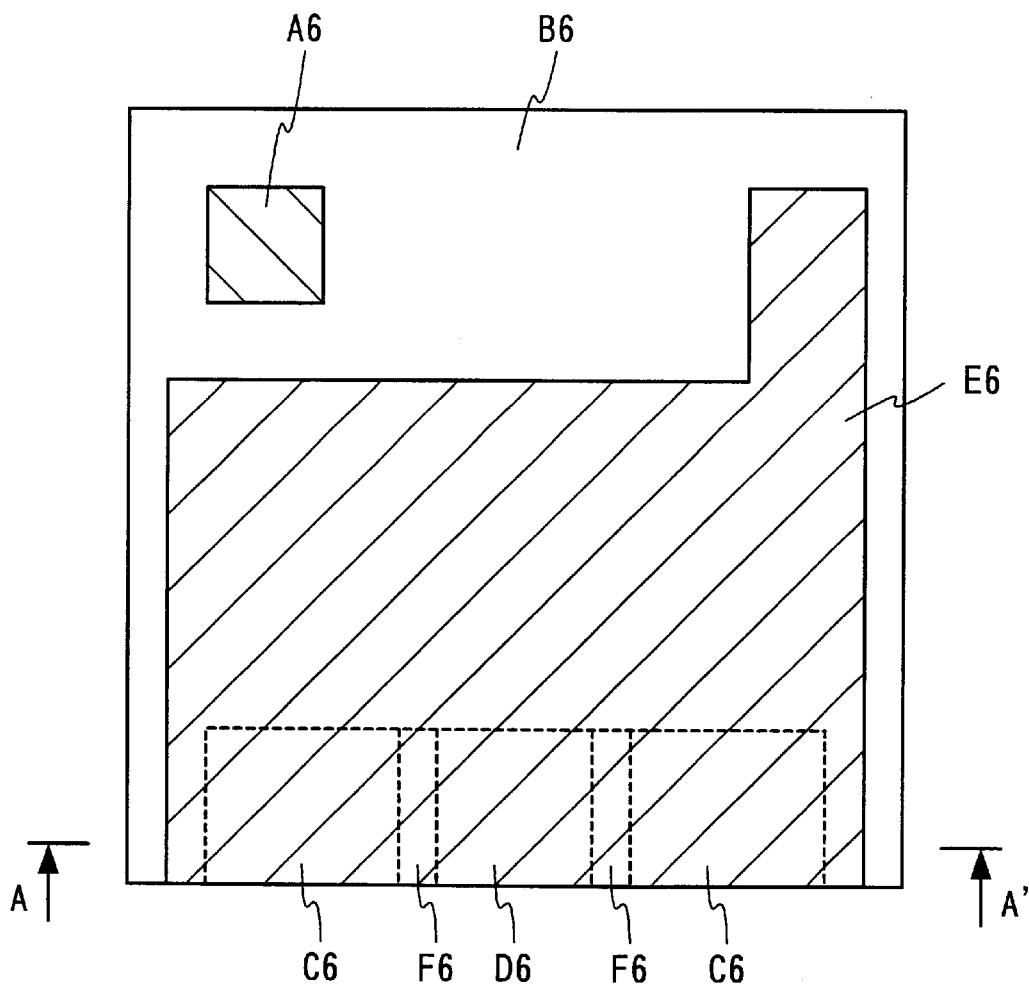
FIG. 13B is a plan view showing the read head shown in FIG. 13A.

FIG. 13A is a cross sectional view showing the read head 14A of the Ex. 6 along an A–A' line shown FIG. 13B which is a plan view of the read head 14A.

As shown in FIG. 13A, the read head 14A of the Ex. 6 comprises the lower shield layer 21, the lower electrode layer 22, the fixer layer 23, the fixed layer 24, the barrier layer 25, the free layer 26, the upper electrode layer 29, the upper shield layer 30, and a bias/insulation layer 31.

As shown in FIG. 13A, the bias/insulation layer 31 has both function of the bias layer 27 and the insulation layer 28 described in Ex. 5, and is prepared instead of them. The bias/insulation layer 31 is made of Ni oxide, NiCo oxide, Fe oxide, and/or NeFe oxide. And single layer structure, multi-layer structure, or composition structure each including the above material(s) is applicable.

The structure and manufacturing steps of the read head 14A of Ex. 6 is substantially the same of those described in Ex. 5 except the bias/insulation layer 31. Therefore, this structure also prevents film exfoliation and current leakage. As a result, accurate data reading is realized, and improved reliability of the read head 14A is available.

EX. 7

The read head 14A having Ex. 7 will now be described.

Figure 14A:
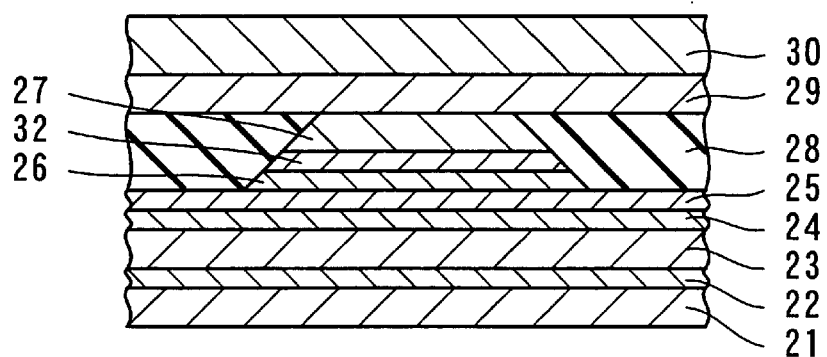
FIG. 14A is a cross sectional view showing a read head according to Ex. 7.
Figure 14B:
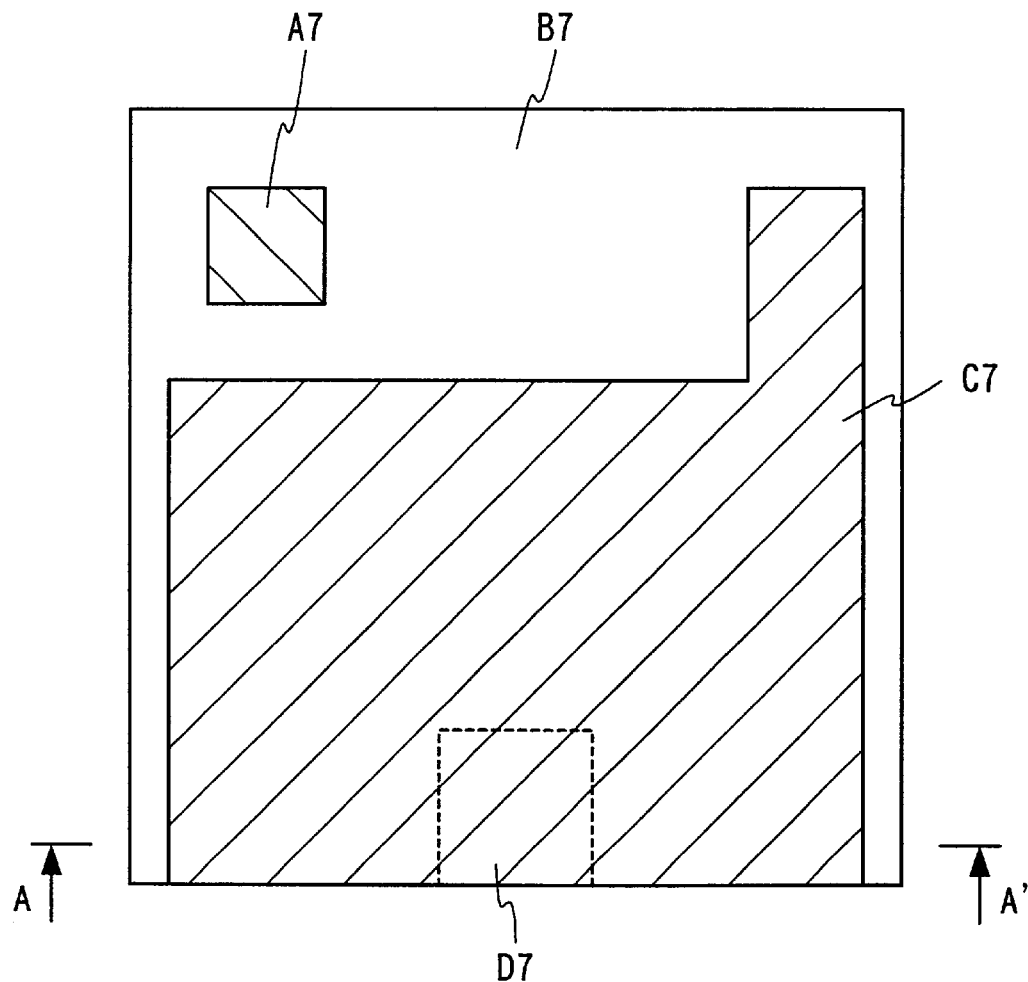
FIG. 14B is a plan view showing the read head shown in FIG. 14A.

FIG. 14A is a cross sectional view showing the read head 14A of the Ex. 7 along an A–A' line shown FIG. 14B which is a plan view of the read head 14A.

As shown in FIG. 14A, the read head 14A of the Ex. 7 comprises the lower shield layer 21, the lower electrode layer 22, the fixer layer 23, the fixed layer 24, the barrier layer 25, the free layer 26, the bias layer 27, the insulation layer 28, the upper electrode layer 29, the upper shield layer 30, and a field adjuster layer 32.

The lower shield layer 21 is formed on a substrate (not shown) made of aluminum titanate, SiC, almina, or deposition thereof. The lower shield layer 21 and the upper shield layer 30 are prepared to shield incline components of the magnetic field leaked from the magnetic recording medium (magnetic disk 12). This shielding effect helps the read head 14A to have improved resolution. The surface roughness of the lower shield layer 21 is equal to or smaller than 0.3 nm.

The lower electrode layer 22 is formed on the lower shield layer 21. The lower electrode layer 22 is made of any one of the materials shown in table 1 except Al and Cu. The average surface roughness of the selected material should be equal to or smaller than 0.3 nm. Accordingly, the lower electrode layer 22 will have stronger bond strength, thus, the lower electrode layer 22 will be strongly affixed to layers to be formed so as to contact the lower electrode layer 22. Moreover, the layers to be formed above the lower electrode layer 22 will be flattened.

A set of the fixer layer 23, the fixed layer 24, the barrier layer 25, and the free layer 26 forms the MTJ layer.

The fixer layer 23 is formed on the lower electrode layer 22. The fixer layer 23 is made of an antiferromagnetic material or a rigid magnetic material. The purpose of the fixer layer 23 is to fix the magnetization direction of the fixed layer 24.

The fixed layer 24 is formed on the fixer layer 23, and is magnetized in a predetermined direction by the fixer layer 23.

The barrier layer 25 is formed on the fixed layer 24 in order to magnetically disconnect the fixed layer 24 from the free layer 26. Since the surface roughness of the lower electrode layer 22 is small, the barrier layer 25 is flat. Because the barrier layer 25 is so flattened, a leak current does not occur during data reading.

The free layer 26 is formed at a predetermined region on the barrier layer 25.

The field adjuster layer 32 is formed on the free layer 26 in order to adjust the strength of bias magnetic field to be applied to the free layer 26 by the bias layer 27. That is, the field adjuster layer 32 adjust the strength so that the read head 14A has sensitivity suitable for its purpose.

The bias layer 27 is formed on the field adjuster layer 32. The bias layer 27 applies bias magnetic field to the free layer 26 in order to cause the free layer to have stable magnetic domain. The strength of the bias magnetic field is adjusted by the field adjuster layer 32 as described above.

The insulation layer 28 is formed on the barrier layer 25 being exposed. The insulation layer 28 regulates a current flow region between the lower and upper electrode layers 22 and 29.

The upper electrode layer 29 is formed on the bias layer 27 and the insulation layer 28.

The upper shield layer 30 is formed on the upper electrode layer 29.

The structure of the read head 14A in cross section has been described so far with reference to the FIG. 14A. Shapes in plan view of the layers are different from each other. Regions denoted by reference alphanumeric characters A7 to D7 in FIG. 14B represent shapes of the layers in the read head 14A.

Layer structures at the regions A7 to D7 will now be described.

At the region A7, the lower shield layer 21 and the lower electrode layer 22 have been deposited in this order onto the substrate.

At the region B7, the lower shield layer 21, the lower electrode layer 22, the fixer layer 23, the fixed layer 24, the barrier layer 25, and the insulation layer 28 have been deposited in this order onto the substrate.

At the region C7, the lower shield layer 21, the lower electrode layer 22, the fixer layer 23, the fixed layer 24, the barrier layer 25, the insulation layer 28, the upper electrode layer 29, and the upper shield layer 30 have been deposited in this order onto the substrate.

At the region D7, the lower shield layer 21, the lower electrode layer 22, the fixer layer 23, the fixed layer 24, the barrier layer 25, the free layer 26, the field adjuster layer 32, the bias layer 27, the upper electrode layer 29, and the upper shield layer 30 have been deposited in this order onto the substrate.

Manufacturing Method for Ex. 7

Typical steps of manufacturing the read head 14A having the Ex. 7 will now be described.

FIGS. 15A to 15G are plan views for explaining steps of manufacturing the read head 14A.

The first step (FIG. 15A): the lower shield layer 21, the lower electrode layer 22, the MTJ layer (the fixer layer 23, the fixed layer 24, the barrier layer 25, and the free layer 26), the field adjuster layer 32, and bias layer 27 have been deposited in this order onto the substrate.

The second step (FIG. 15B): a stencil S1 is formed on the region D7 shown in FIG. 14B.

The third step (FIG. 15C): ion milling at a whole region except the stencil S1 is carried out until the barrier layer 25 is exposed.

Figure 15A:
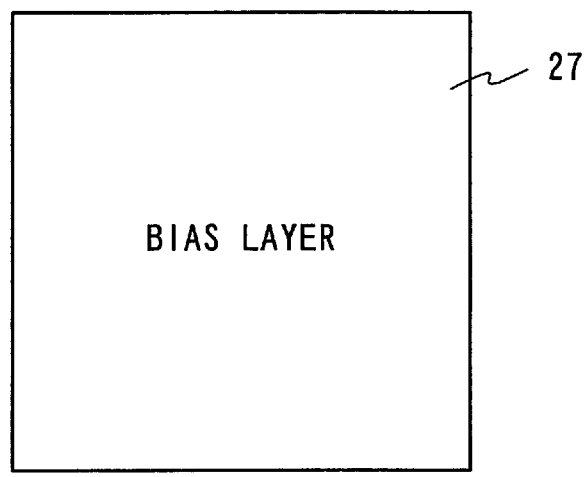
Figure 15B:
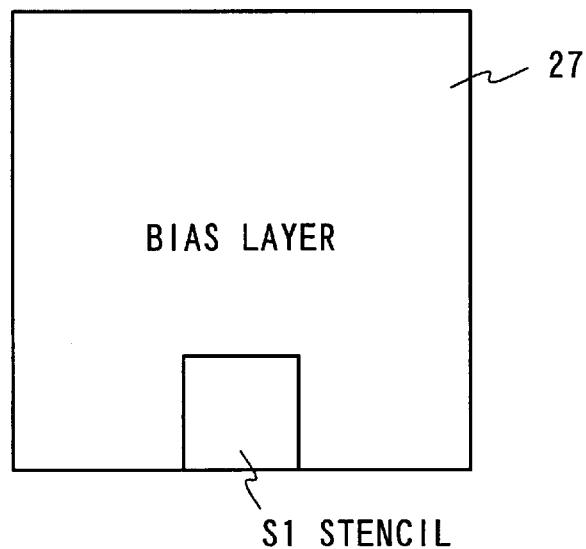
Figure 15C:
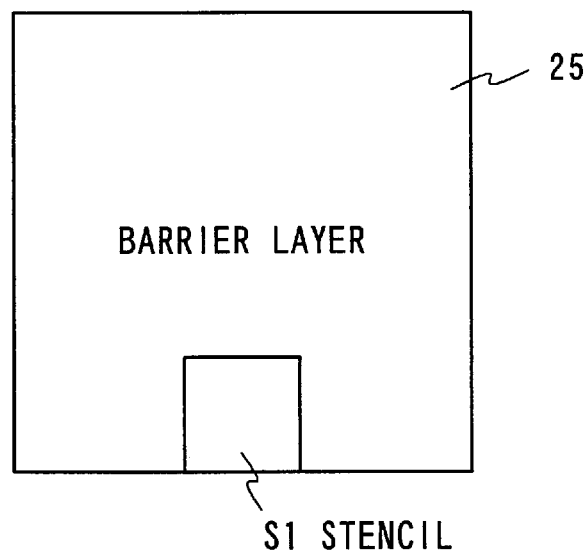
Figure 15D:
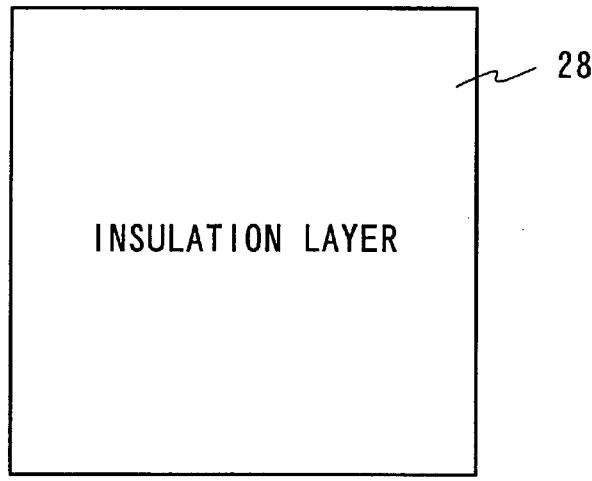
Figure 15E:
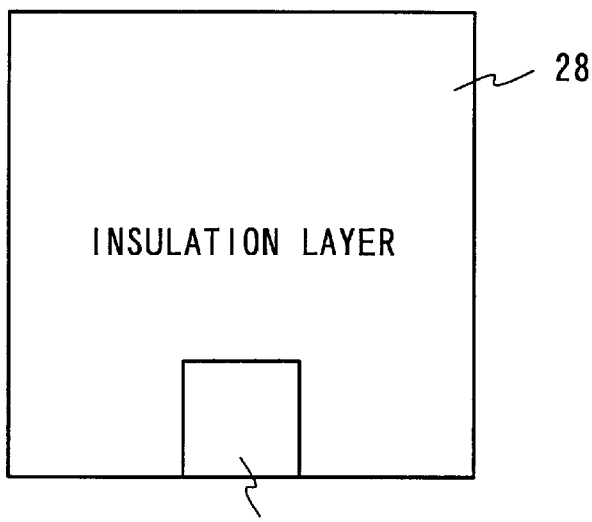
Figure 15F:
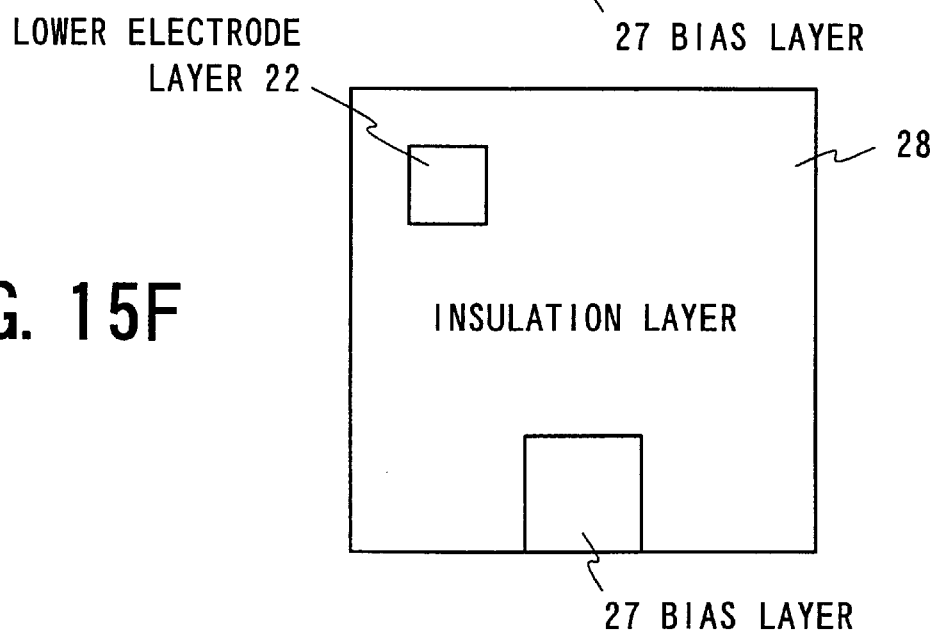

The fourth step (FIGS. 15D and 15E): the insulation layer 28 is formed on the barrier layer 25 and the stencil S1 (FIG. 15D), and then the stencil S1 is lifted off (FIG. 15E).

The fifth step (FIG. 15F): CMP is carried out to form an opening at the region A7 shown in FIG. 14B until the lower electrode layer 22 is exposed.

Final step (FIG. 15G): the upper electrode layer 29 and the upper shield layer 30 have been deposited in this order onto the regions C7 and D7 shown in FIG. 11B, and the read head 14A is completed.

As mentioned above, since the lower electrode layer 22 is affixed to layers contacting the lower electrode layer 22 with strong bond strength, the lower electrode layer 22 is not exfoliated from the contacting layers. Moreover small average surface roughness (equal to or smaller than 0.3 nm) of the lower electrode layer 22 is helpful to form flat MTJ layer on the lower electrode layer 22, thus, a leak current does not occur. According to those characteristics, accurate reading of data stored in the magnetic recording medium is realized, and improved reliability of the read head 14A is available.

Any one of the read head 14A exemplified in Ex. 1 to Ex. 7 may have a lower gap insulation layer between the lower shield layer 21 and the lower electrode layer 22, and/or a upper gap insulation layer between the upper electrode layer 29 and the upper shield layer 30. Each of such the gap insulation layer is made of Al oxide, Si oxide, aluminum nitride, silicon nitride, and/or diamond-like carbon. And single layer structure, multi-layer structure, or composition structure each including the above material(s) is applicable. The gap insulation layers form magnetic gaps.

Any one of the read head 14A described in Ex. 1 to Ex. 7 may have a protect layer between the MTJ layer and the upper electrode layer 29. The protect layer comprise any one of the following structures: single layer structure (made of oxide, nitride, or composition thereof), dual-layer structure (metal-oxide, metal-nitride, or metal-composition (oxide and nitride)). Each layer applicable to the above structured protect layer is made of Ti oxide (nitride), V oxide (nitride), Cr oxide (nitride), Co oxide (nitride), Cu oxide (nitride), Zn oxide (nitride), Y oxide (nitride), Zr oxide (nitride), Nb oxide (nitride), Mo oxide (nitride), Tc oxide (nitride), Ru oxide (nitride), Rh oxide (nitride), Pd oxide (nitride), Ag oxide (nitride), Hf oxide (nitride), Ta oxide (nitride), W oxide (nitride), Re oxide (nitride), Os oxide (nitride), Ir oxide (nitride), Pt oxide (nitride), Au oxide (nitride), Si oxide (nitride), Al oxide (nitride), and/or Ni oxide (nitride). And single layer structure, multi-layer structure, or composition structure each including the above material(s) is applicable.

As for Ex. 1, 2, 5, 6 and 7, the read head 14A may have a base layer between the lower electrode layer 21 and the fixer layer 23, and an upper layer between the free layer 26 (or the protect layer) and the upper electrode layer 29. As for Ex. 3 and 4, the read head 14A may comprise a base layer between the lower electrode layer 22 and the free layer 26, and an upper layer between the fixer layer 23 (or the protect layer) and the upper electrode layer 29.

The purpose of the base layer is to control crystallization in the free layer 26 thus to improve magnetic characteristics (especially, coercive force). On the other hand, the upper layer is prepared in order to adjust positional relationship among the lower and upper shield layers 21 and 30, and the free layer 26, to improve electrical contact between the protect layer and the upper electrode layer 29, and to flatten a surface on which the upper gap insulation layer is formed.

Materials for the base layer and the upper layer are as follows.

The base layer is made of Ta, Hf, Zr, W, Cr, Ti, Mo, Pt, Ni, Ir, Cu, Ag, Co, Zn, Ru, Rh, Re, Au, Os, Pd, Nb, V, oxide of the above, and/or nitride of the above. And single layer structure, multi-layer structure, or composition structure each including the above material(s) is applicable.

The upper layer is made of Au, Ag, Cu, Mo, W, Y, Ti, Zr, Hf, V, Nb, and/or Ta. And single layer structure, multi-layer structure, or composition structure each including the above material(s) is applicable.

Second Embodiment

A magneto-resistive element according to a second embodiment will now be described with the accompanying drawings.

As well as the first embodiment, the magnet-resistive element according to the second embodiment is employed in the read head 14A of the magnetic disk drive 1.

The read head 14A having the magnet-resistive element according to the second embodiment is so-called a yoke head.

Figure 16:
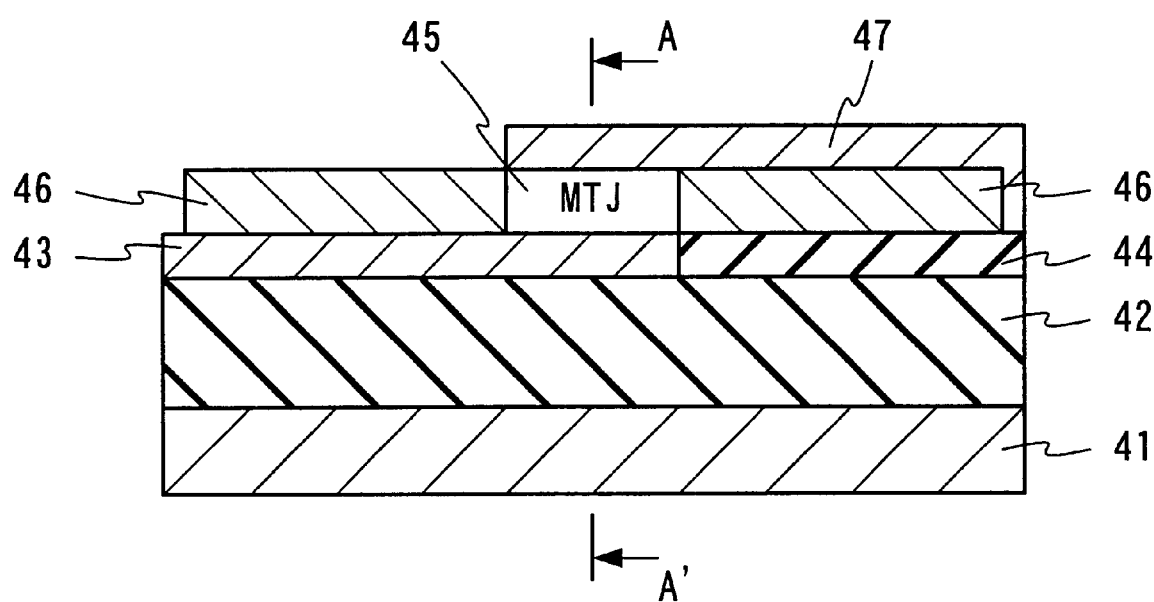
FIG. 16 is a cross sectional view showing the structure of a magnetic head comprising a magneto-resistive element according to the second embodiment of the present invention.
Figure 17A:
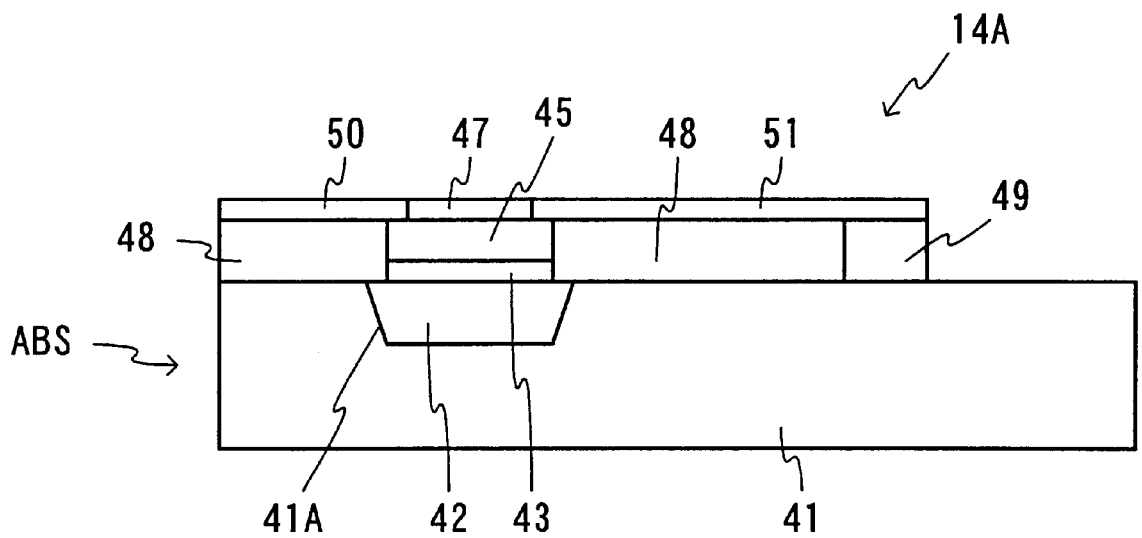
FIGS. 17A to 17D are cross sectional views showing the magnetic head shown in FIG. 16 along a line A–A'.
Figure 17B:
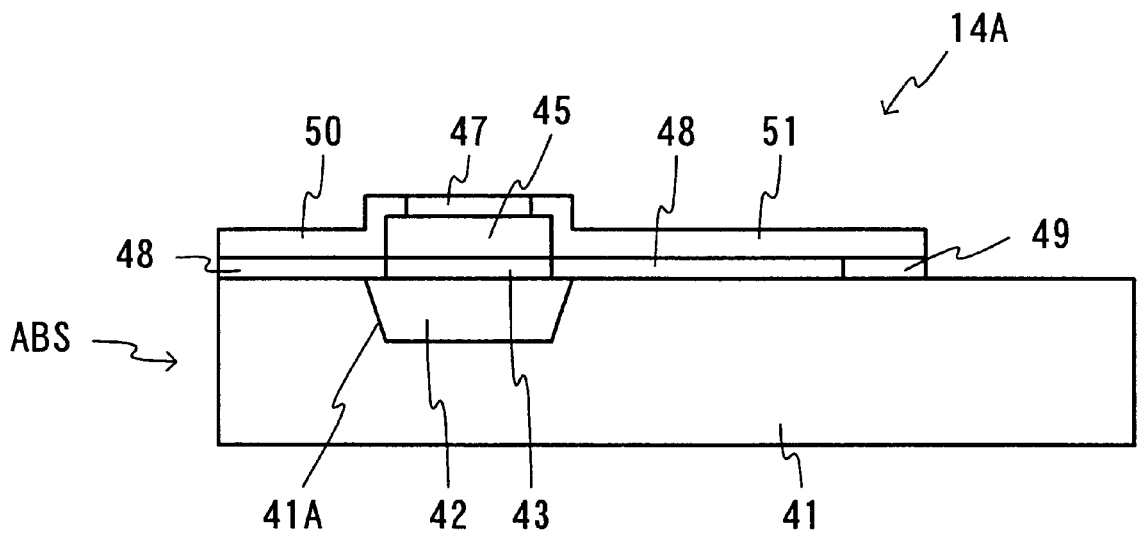
Figure 17C:
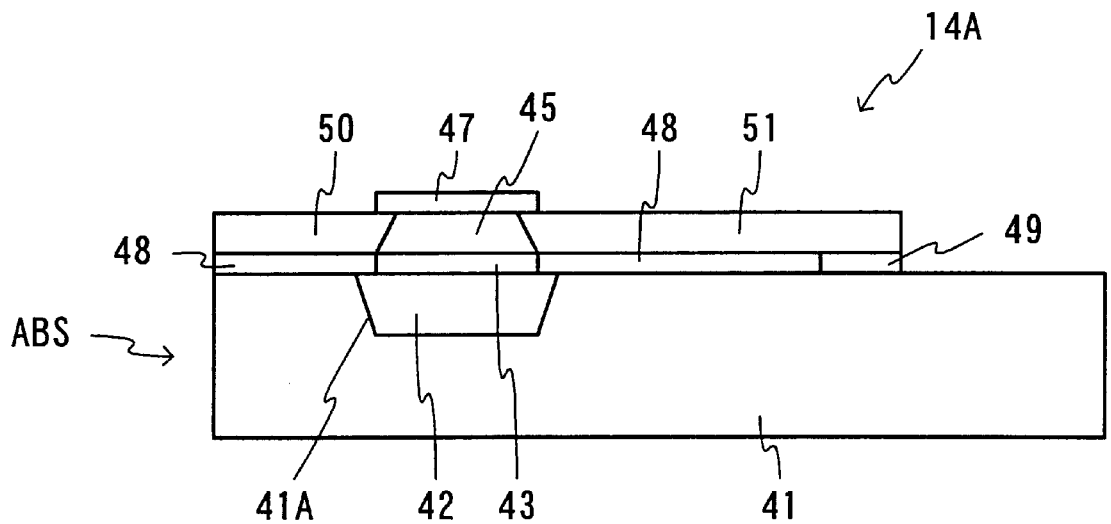
Figure 17D:
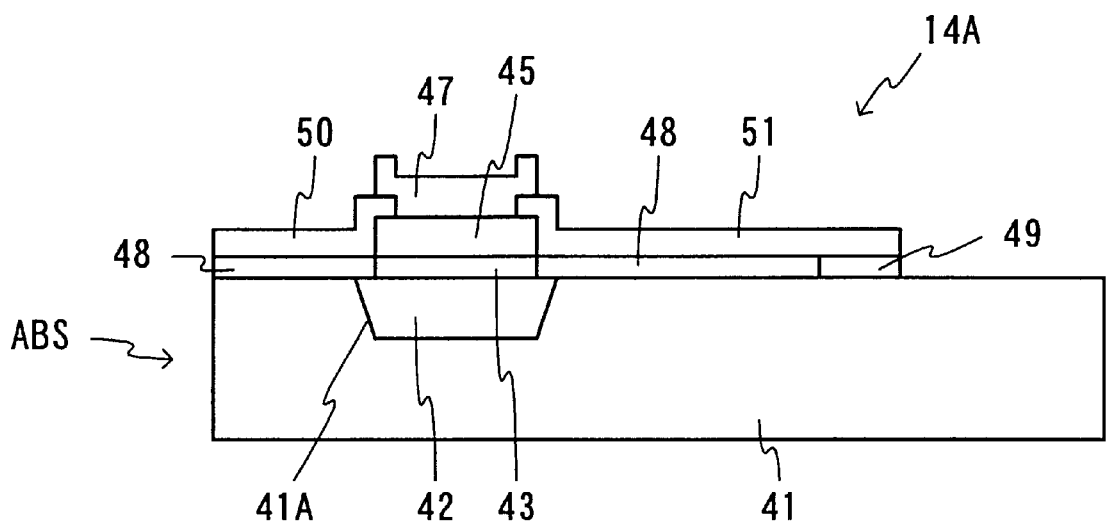

FIG. 16 is a cross sectional view showing the structure of the read head 14A. FIGS. 17A to 17D show various cross sectional structures along a line A–A' in FIG. 16 which are applicable to the read head 14A.

As shown in FIGS. 16 and 17A–17D, the read head 14A comprises a ferromagnetic substrate 41, a non-magnetic insulator 42, a lower electrode layer 43, a gap cancel layer 44, a magnetic tunnel junction (MTJ) layer 45, a bias layer 46, an upper electrode layer 47, a non-magnetic insulation layer 48, a non-rigid magnetic layer 49, a front yoke 50, and a back yoke 51.

The ferromagnetic substrate 41 is made of, for example, NiZn ferrite, MnZn ferrite, MgZn ferrite, or the like. As shown in FIGS. 17A to 17D, the ferromagnetic substrate 41 has a groove 41A near its ABS (Air Bearing Surface).

The non-magnetic insulator 42 is made of, for example, Al oxide, Si oxide, aluminum nitride, silicon nitride, diamond-like carbon, or the like. The groove 41A is filled with the non-magnetic insulator 42.

As shown in FIGS. 16 and 17A–17D, the lower electrode layer 43 is formed at a predetermined region on the non-magnetic insulator 42. Material of the lower electrode layer 43 is substantially the same as that of the lower electrode layer 22 described in the first embodiment. Furthermore, the lower electrode layer 43 also has small average surface roughness which is equal to or smaller than 0.3 nm. Accordingly, the lower electrode layer 43 will be affixed with strong bond strength to layers to be formed so as to contact the lower electrode layer 43, and the layers to be formed above the lower electrode layer 43 will be flattened.

The gap cancel layer 44 is formed on the non-magnetic insulator 42 so as to be adjacent to the lower electrode layer 43 as shown in FIG. 16. The thickness of the gap cancel layer 44 is substantially the same as that of the lower electrode layer 43.

The MTJ layer 45 is formed at a predetermined region on the lower electrode layer 43 as shown in FIG. 16. As well as the first embodiment, the MTJ layer 45 comprises a fixer layer, a fixed layer, a barrier layer, and a free layer. The resistance of the MTJ layer 45 changes in accordance with external magnetic field (magnetic field leaked from the magnetic recording medium). Since the average surface roughness of the lower electrode layer 43 is equal to or smaller than 0.3 nm, the MTJ layer 45 is flattened, thus, current leakage during data reading is prevented. Various structures like Ex. 1 to 7 in the first embodiment are applicable to the MTJ layer 45 in this embodiment. Materials for the fixer layer, the fixed layer, the barrier layer, and the free layer are substantially the same as those described in the first embodiment.

The bias layer 46 is formed on the lower electrode layer 43 and the gap cancel layer 44 so as to sandwich the MTJ layer 45, as shown in FIG. 16. More precisely, a piece of the bias layer 46 is formed on the gap cancel layer 44 which is adjacent to the lower electrode layer, and another piece of the bias layer 46 is formed on the lower electrode layer 43. This structure allows the bias layer 46 to apply bias magnetic field to the free layer in the MTJ layer 45 in order to cause the free layer to have stable magnetic domain, as well as the first embodiment.

The upper electrode layer 47 is formed on the gap cancel layer 44, the MTJ layer 45, and the bias layer 46. The upper electrode layer 47 is made of a material which is substantially the same as that described in the first embodiment.

The non-magnetic insulation layer 48 is formed on the ferromagnetic substrate 41 and the non-magnetic insulator 42 so as to sandwich the lower electrode layer 43, as shown in FIGS. 17A to 17D. Material of the non-magnetic insulation layer 48 is substantially the same as that of the non-magnetic insulator 42.

The non-rigid magnetic layer 49 is formed on the ferromagnetic substrate 41 so as to be adjacent to the non-magnetic insulation layer 48, as shown in FIGS. 17A to 17D. The non-rigid magnetic layer 49 magnetically connects the ferromagnetic substrate 41 and the back yoke 51. The non-rigid magnetic layer 49 is made of, for example, NiFe, CoZr, CoFeB, CoZcMo, CoZrNb, CoZr, CoZrTa, CoHf, CoTa, CoTaHf, CoNbHf, CoZrNb, CoHfPb, CoTaZrNb, CoZrMoNi, FeAlSi, ion nitride material, MnZn ferrite, NiZn ferrite, MgZn ferrite, or the like.

The front yoke 50 is formed on the non-magnetic insulation layer 48 as shown in FIGS. 17A to 17D, and is made of a material which is the same as that of the non-rigid magnetic layer 49.

The back yoke 51 is formed on the non-magnetic insulation layer 48 and the non-rigid magnetic layer 49 as shown in FIGS. 17A to 17D, so that the upper electrode layer 47 is sandwiched by the front and back yokes 50 and 51.

Figure 18:
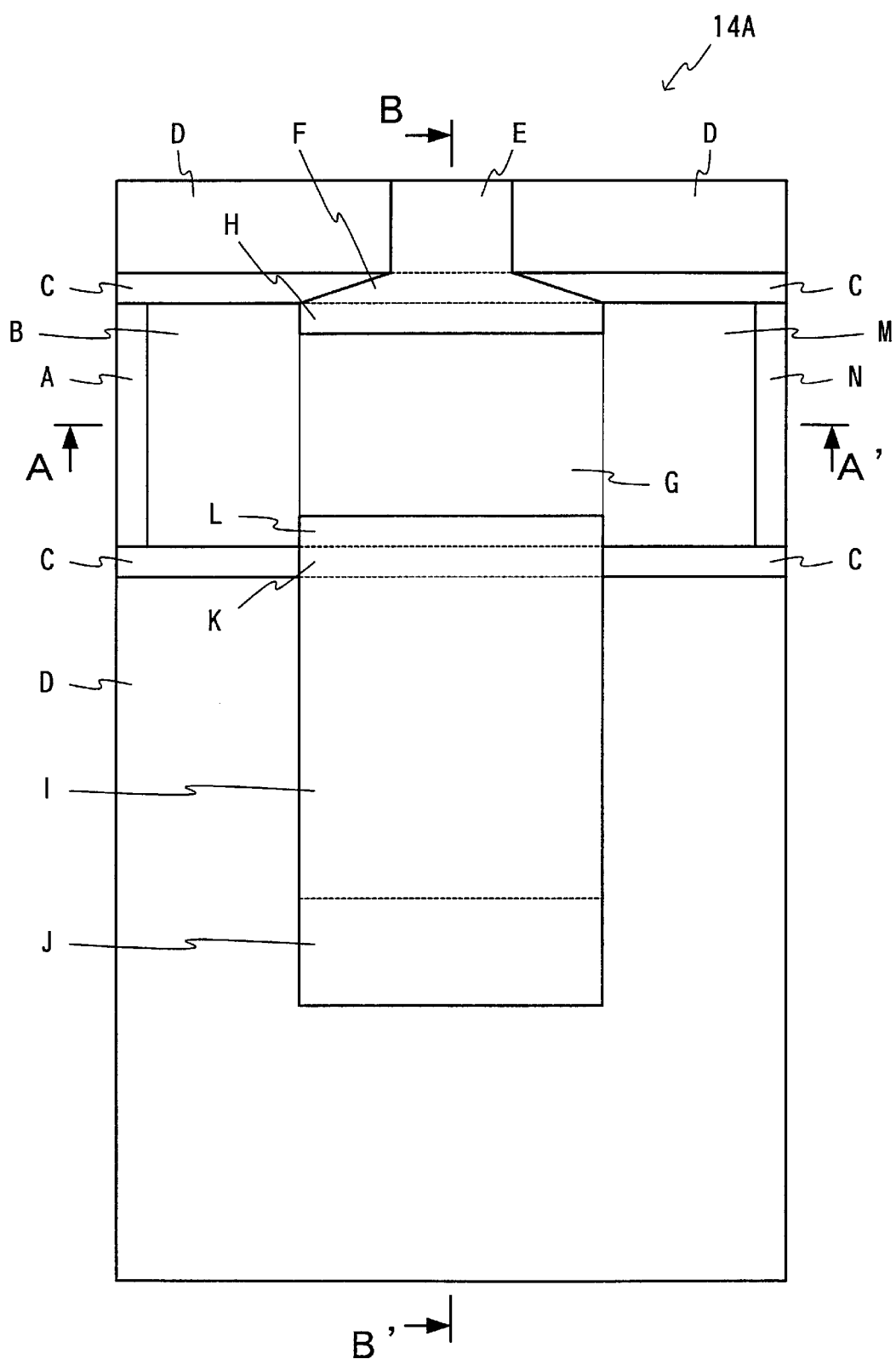
FIG. 18 is a plan view showing the magnetic head shown in FIGS. 16 and 17A–17D.

The structure of the read head 14A in cross section has been described so far with reference to the FIGS. 16 and 17A–17D. Shapes in plan view of the layers are different from each other. Regions denoted by reference characters A to N in FIG. 18 represent shapes of the layers in the read head 14A. Note that FIG. 16 is the cross sectional view along the line A–A' shown in FIG. 18, and FIGS. 17A–17D are the cross sectional views along a line B–B' shown in FIG. 18.

Layer structures at the regions A to N will now be described.

At the region A, the ferromagnetic substrate 41, the non-magnetic insulator 42, and the lower electrode 43 have been deposited in this order.

At the region B, the ferromagnetic substrate 41, the non-magnetic insulator 42, the lower electrode layer 43, and the bias layer 46 have been deposited in this order.

At the region C, the ferromagnetic substrate 41 and the non-magnetic insulator 42 have been deposited in this order.

At the region D, only the ferromagnetic substrate 41 is prepared.

At the region E, the ferromagnetic substrate 41, the non-magnetic insulation layer 48, and the front yoke 50 have been deposited in this order.

At the region F, the ferromagnetic substrate 41, the non-magnetic insulator 42, the non-magnetic insulation layer 48, and the front yoke 50 have been deposited in this order.

At the region G, the ferromagnetic substrate 41, the non-magnetic insulation layer 48, the lower electrode layer 43, the MTJ layer 45, and the upper electrode layer 47 have been deposited in this order.

At the region H, the ferromagnetic substrate 41, the non-magnetic insulation layer 48, the lower electrode layer 43, the MTJ layer 45, and the front yoke 50 have been deposited in this order.

At the region I, the ferromagnetic substrate 41, the non-magnetic insulation layer 48, and the back yoke 51 have been deposited in this order.

At the region J, the ferromagnetic substrate 41, the non-rigid magnetic layer 49, and the back yoke 51 have been deposited in this order.

At the region K, the ferromagnetic substrate 41, the non-magnetic insulator 42, the non-magnetic insulation layer 48, and the back yoke 51 have been deposited in this order.

At the region L, the ferromagnetic substrate 41, the non-magnetic insulator 42, the lower electrode layer 43, the MTJ layer 45 and the back yoke 51 have been deposited in this order.

At the region M, the ferromagnetic substrate 41, the non-magnetic insulator 42, the gap cancel layer 44, the bias layer 46, and the upper electrode layer 47 have been deposited in this order.

At the region N, the ferromagnetic substrate 41, the non-magnetic insulator 42, the gap cancel layer 44, and the upper electrode layer 47 have been deposited in this order.

As well as the first embodiment, in thus structured read head 14A, a predetermined voltage is applied between the lower electrode layer 43 and the upper electrode layer 47 for reading data from the magnetic recording medium. Since a current flow in the MTJ layer 45 changes in accordance with the magnetic field leaked from the magnetic recording medium, the current flow between the lower electrode layer 43 and the upper electrode layer 47 represents read data.

As mentioned above, since the lower electrode layer 43 is affixed to layers contacting the lower electrode layer 43 with strong bond strength, the lower electrode layer 43 is not exfoliated from the contacting layers. Moreover small average surface roughness (equal to or smaller than 0.3 nm) of the lower electrode layer 43 is helpful to form flat MTJ layer 45 on the lower electrode layer 43, thus, a leak current does not occur. According to those characteristics, accurate reading of data stored in the magnetic recording medium is realized, and improved reliability of the read head 14A is available.

The read head 14A according to the second embodiment may also comprise a protect layer between the MTJ layer 45 and the upper electrode layer 47, as well as the first embodiment.

Figure 19A:
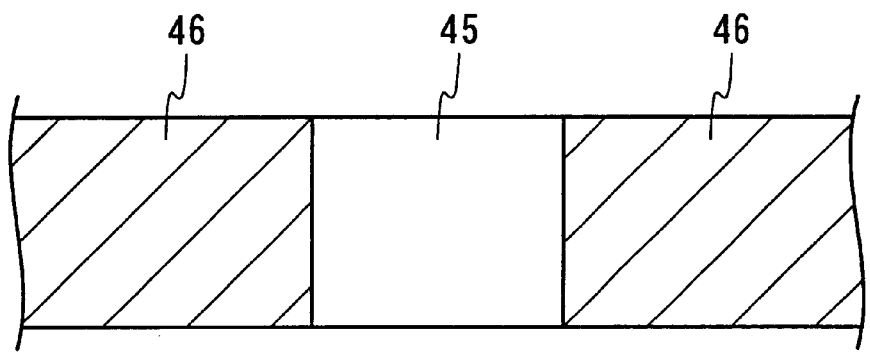
FIGS. 19A to 19C are diagrams showing positional relation ship among a bias layer and an MTJ layer in the magneto-resistive element.
Figure 19B:
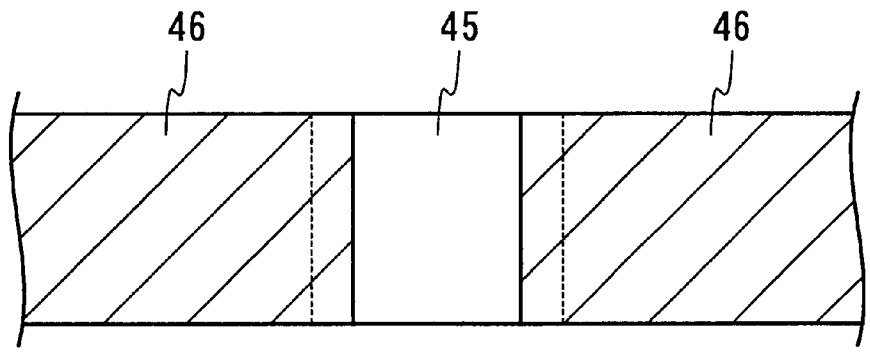
Figure 19C:
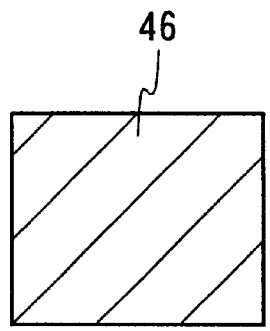

In the above description, a case where ends of the bias layer pieces 46 contacts ends of the MTJ layer 45 respectively (see FIG. 19A) has been explained so far. However, the bias layer 46 may be formed so as to cover the MTJ layer 45 partially as shown in FIG. 19B, or may be formed so as to cover the MTJ layer 45 wholly as shown in FIG. 19C.

EXAMPLES

With using completed magnetic heads as described in the first and second embodiments, experiments (Cases 1 to 6) for data collection by performing data reading/writing are carried out in order to prove that the read head having the lower electrode layer whose average surface roughness is equal to or smaller than 0.3 nm shows improved performance.

Case 1

Figure 20:
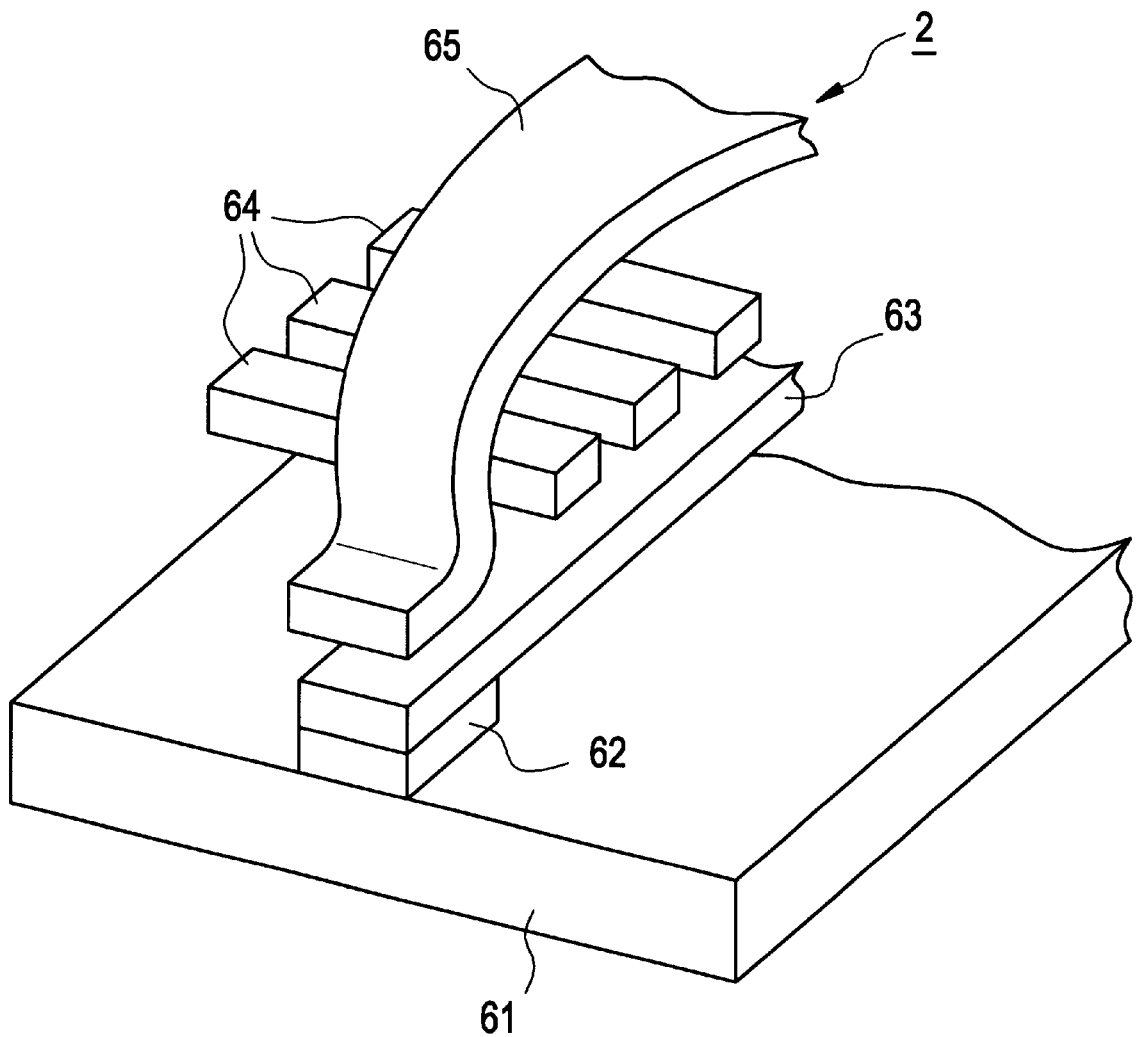
FIG. 20 is a diagram showing the structure of a completed magnetic head.

A magnetic head prepared for Case 1 has the structure which is similar to that of the magnetic head 14 shown in FIG. 2. That is, a magnetic head 2 comprises a read head and a write head formed on the read head. More precisely, the magnetic head 2 comprises a substrate 61, a read head 62, a lower core 63, a coil 64, and an upper core 65, as shown in FIG. 20. A set of the lower core 63, the coil 64, and the upper core 65 forms the write head.

Figure 21:
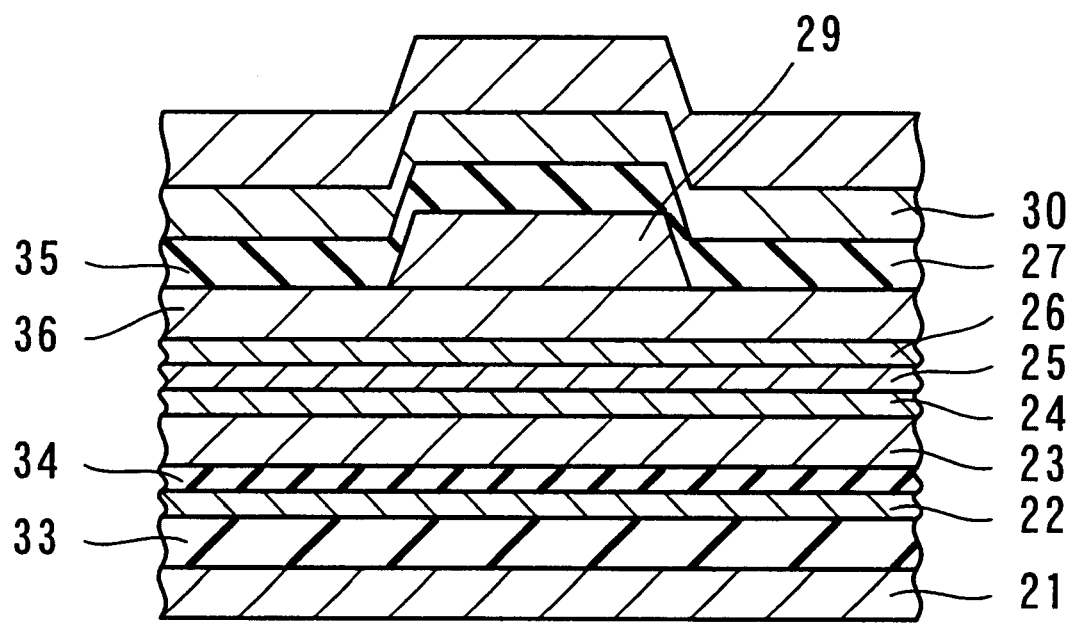
FIG. 21 is a cross sectional view showing the completed magnetic head.
Figure 22:
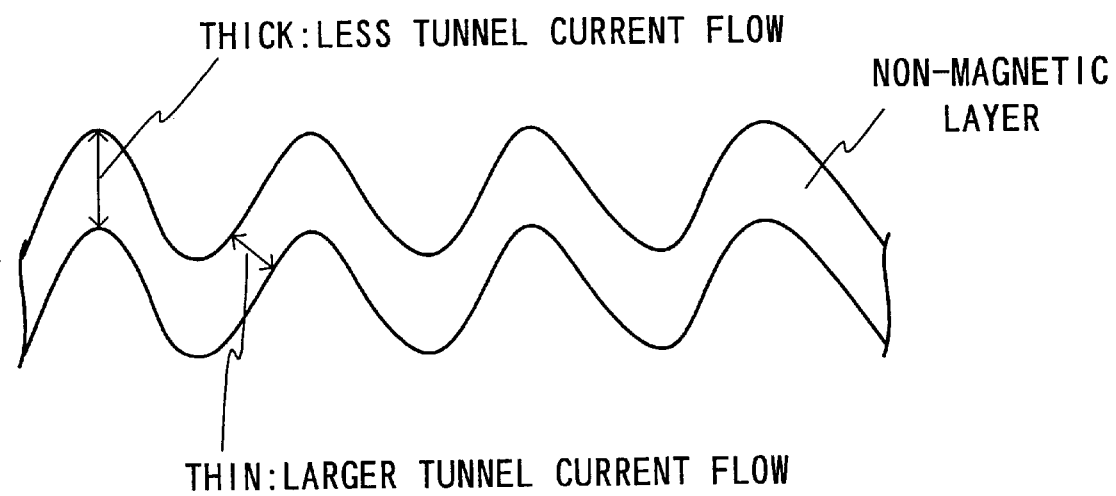
FIG. 22 is a diagram showing a state where a non-magnetic layer between magnetic layers is not flat.

As shown in FIG. 21, the read head 62 has the structure of Ex. 2 described in the first embodiment. Additional elements of the read head 62 are: a lower gap layer 33 formed between the lower shield layer 21 and the lower electrode layer 22; a base layer 34 formed between the lower electrode layer 22 and the fixer layer 23; a protect layer 36 formed between the free layer 26 and the upper electrode layer 29; and an upper gap layer 35 formed between the upper electrode layer 29 and the upper shield layer 30. A set of the fixer layer 23, the fixed layer 24, the barrier layer 25, the free layer 26, and the protect layer 36 forms the MTJ layer.

The lower shield layer 21 has the thickness of 1 micrometer, and is made of composition of Co, Ni, and Fe. The composition contains 65 at % (atomic percent) of Co, 12 at % of Ni, and 23 at % of Fe (hereinafter, relationship between the material and its ratio will be referred to as, for example, Co65Ni12Fe23).

The lower electrode layer 22 is made of one of the various materials shown in table 1, and has the thickness of 40 nm.

The fixer layer 23 is made of composition of Pt46Mn54, and has the thickness of 25 nm.

The fixed layer 24 has the deposition structure in which a layer 0.9 nm thick made of composition of Co90Fe10, an Ru layer having the thickness of 5 nm, and another composition layer 5 nm thick of Co90Fe10 have been deposited in this order.

The barrier layer 25 is made of Al oxide, and has the thickness of 2 nm.

The free layer 26 has the deposition structure in which a layer 2 nm thick made of composition Co90Fe10, and a layer 8 nm thick made of composition of Ni82Fe18 have been deposited in this order.

The bias layer 27 has the deposition structure in which a Cr layer 10 nm thick, and a layer 36 nm thick made of composition of Co74.5Cr10.5Pt15 have been deposited in this order.

The upper electrode layer 29 has the deposition structure in which a Ta layer 5 nm thick, an Au layer 60 nm thick, and another Ta layer 5 nm thick.

The upper shield layer 30 is made of composition of Co89Zr4Ta4Cr3, and has the thickness of 1 micrometer.

The lower gap layer 33 is made of almina having the thickness of 70 nm.

The base layer 34 is made of Ta, and has the thickness of 3 nm.

The upper gap layer 35 is made of almina having the thickness of 70 nm.

The protect layer 36 is made of Ta, and has the thickness of 3 nm.

The substrate 61 comprises 2 mm thick aluminum titanate, and 10 micrometers thick almina deposited on the aluminum titanate.

Steps for manufacturing the magnetic head 2 are as follows.

First, the lower shield layer 21 is formed on the substrate 61 by plating.

RF magnetron sputtering using almina as a target material is carried out under Ar gas atmosphere to form the lower gap layer 33 on the lower shield layer 21. ≦In this step, flow rate of the Ar gas is 50 sccm, pressure of the Ar gas is 0.1 Pa (≈1 mTorr), a current for film formation is 0.1 A, and backing pressure is $4 \times 10^{-5}$ Pa ($\approx 3 \times 10^{-7}$ Torr).

A suitable method such as sputtering or evaporation is selected for the material to be the lower electrode layer 22 is selected, and the selected method is carried out under Ar atmosphere in order to form the lower electrode layer 22 on the lower gap layer 33.

Then, the base layer 34, the fixer layer 23, the fixed layer 24, the barrier layer 25, the free layer 26, and the protect layer 36 are deposited in this order onto the lower electrode layer 22, that is, the MTJ layer is formed on the lower electrode layer 25. More precisely, the layers except the barrier layer 25 are formed by DC magnetron sputtering under Ar gas atmosphere. In this step, flow rate of the Ar gas is 50 sccm, pressure of the Ar gas is 0.1 Pa ($\approx$1 mTorr), current for film formation is 0.1 A, and backing pressure is $2.7\times10^{-8}$ Pa ($\approx 2\times 10^{-10}$ Torr). The barrier layer 25 appears after Al layer is subjected to oxidization treatment under pure oxygen atmosphere for 20 minutes. In this case, the Al layer which is formed by sputtering has the thickness of 2 nm, and pressure of the pure oxygen atmosphere is 13 mPa ($\approx$0.1 mTorr).

After the formation of the MTJ layer is completed, heat treatment (250 degrees Celsius) is carried out for 5 hours. During the heat treatment, 40 kA/m ($\approx$500 Oe) magnetic field is applied to the MTJ layer. The applied magnetic field in this step is perpendicular to magnetic field during MTJ layer formation.

Then, sputtering or evaporation is carried out under Ar gas atmosphere to form the upper electrode layer 29 at a predetermined region on the free layer 26.

DC magnetron sputtering is carried out under Xe gas atmosphere to form the bias layer 27 on the free layer 26 so as to cover the upper electrode layer 29. In this step, flow rate of the Xe gas is 50 sccm, pressure of the Xe gas is 0.1 Pa ($\approx$1 mTorr), current for film formation is 0.1 A, and backing pressure is $2.7\times10^{-8}$ Pa ($\approx 2$-$10^{-8}$ Torr).

Then, RF magnetron sputtering with using almina as a target material is carried out under Ar gas atmosphere to form the upper gap layer 35 on the bias layer 27. In this step, flow rate of the Ar gas is 50 sccm, pressure of the Ar gas is 0.1 Pa ($\approx$1 mTorr), current for film formation is 0.1 A, and backing pressure is $4\times10^{-5}$ Pa ($\approx 3\times 10^{-7}$ Torr).

And, the upper shield layer 21 is formed on the upper gap layer 35 by plating.

Thus, a read head 62 is formed on the substrate 61.

And then, the lower core 63 is formed on the read head 62.

A conductive film, which will be the coil 64, is formed on the lower core 63. A photoresist mask having a predetermined pattern is formed on the conductive film. The coil 64 is formed by etching the conductive film which is masked with the photoresist mask. In this step, the etching is carried out after the photoresist mask is hardened by baking (250 degrees Celsius) for 2 hours.

Finally, the upper core 65 is formed on the coil 64, thus, the magnetic head 2 shown in FIG. 20 is completed.

By the baking for hardening the photoresist mask, the magnetization direction (which should be perpendicular to the ABS) of the fixer and fixed layers 23 and 24 deviates. Performance of the read head 62 is reduced by such the deviation of the magnetization. To correct the deviation, the magnetic head 2 is subjected to heat treatment for magnetization for 1 hour. The heat treatment is carried out under a magnetic field of 40 kA/m ($\approx$500 Oe) with a temperature of 200 degrees Celsius. According to resultant magnetization curve, rotation degree of an easy axis of magnetization in the free layer 26 toward the magnetization direction caused by the heat treatment is very little.

Using the magnetic disk drive 1 (FIG. 1) in which the above described magnetic head 2 is installed and a magnetic recording medium made of CoCrTa material, data reading and writing are performed.

Specification of the magnetic recording medium: coercive force is 237 kA/m ($\approx$3.0 kOe), MrT, where Mr represents remained magnetization (memu/cm$^3$) and T represents film thickness (cm), is 0.35 memu/cm$^2$; write track width is 3 micrometers; distance between the ABS during data writing is 0.2 micrometers; and read track width is 2 micrometers.

First, environmental test for the magnetic heads 62 was carried out. In this test, the magnetic heads 62 and conventional magnetic heads (for comparison) had been left in a room whose atmospheric temperature was 100 degrees Celsius and humidity was 90%. After 1000 hours past, output signal level, signal to noise (S/N) ratio, and bit error rate of the magnetic head were measured.

Tables 2A and 2B show results of the conventional magnetic heads. Table 2A shows the result of the conventional magnetic head whose lower electrode layer is made of Cu. Table 2B shows the result of the conventional magnetic head whose lower

TABLE 2A (LOWER ELECTRODE LAYER: Cu)

|  | BEFORE TEST | AFTER TEST |
| --- | --- | --- |
| OUTPUT LEVEL (mV) | 3.1 | 3.2 |
| S/N (dB) | 28 | 21 |
| BIT ERROR RATE | $\leq 1 \times 10^{-6}$ | approx. $1 \times 10^{-3}$ |

TABLE 2B (LOWER ELECTRODE LAYER: Al)

|  | BEFORE TEST | AFTER TEST |
| --- | --- | --- |
| OUTPUT LEVEL (mV) | 1.6 | 1.6 |
| S/N (dB) | 24 | 24 |
| BIT ERROR RATE | approx. $1 \times 10^{-5}$ | approx. $1 \times 10^{-5}$ |

In the case of Cu electrode layer, the output level was stable, however, signal to noise ratio was greatly reduced down to 21 dB from 28 dB. Bit error rate increased up to $1\times10^{-3}$ from $1\times10^{-6}$.

Barkhausen noise causes such changes in S/N ratio and bit error rate. Occurrence of Barkhausen noise was proved by measuring magnetic hysteresis loop of the read head 62, that is, the free layer 26 had large hysteresis of reverse magnetization. Moreover, slant exfoliation of the lower electrode layer 22 from the lower gap layer 33 was seen through a microscope. This exfoliation may be one of the causes which increase the hysteresis.

On the contrary, it is obvious from table 2B that output level, S/N ratio and bit error rate of the lower electrode layer 22 made of Al were stable. However, those elements were worse than those of Cu before subjected to the environmental test, that is, the output level and S/N ratio were low while the bit error rate was high. Unflat barrier layer 25 because of large average surface roughness of the lower electrode layer 22 may worsen those elements.

Table 3 shows output level, S/N ratio, and bit error rate of the read head 62 which employs the present invention after subjected to the environmental test. Table 3 also shows the results shown in tables 2A and 2B for comparison.

TABLE 3

| MATERIAL | THICKNESS (nm) | S/N (dB) | BER (×10$^{-6}$) |
|---|---|---|---|
| Al (conventional) | 40 | 24 | approx. 10 |
| Cu (conventional) | 40 | 21 | approx. 1000 |
| Ta | 40 | 26 | ≦1 |
| Zr | 40 | 26 | ≦1 |
| Ti | 40 | 28 | ≦1 |
| Hf | 40 | 27 | ≦1 |
| W | 40 | 27 | ≦1 |
| Mo | 40 | 28 | ≦1 |
| Y | 40 | 27 | ≦1 |
| V | 40 | 28 | ≦1 |
| Nb | 40 | 28 | ≦1 |
| Au | 40 | 26 | ≦1 |
| Ag | 40 | 26 | ≦1 |
| Pb | 40 | 28 | ≦1 |
| Ta/Cu/Ta | 5/30/5 | 29 | ≦1 |
| Ta/Cu | 5/35 | 28 | ≦1 |
| (Ta/Cu)x4 | 5/5 | 31 | ≦1 |
| Ta/Au/Ta | 5/30/5 | 28 | ≦1 |
| Ta/Ag/Ta | 5/30/5 | 28 | ≦1 |
| Ta/Pt/Ta | 5/30/5 | 29 | ≦1 |
| Ta/Pb/Ta | 5/30/5 | 28 | ≦1 |
| Zr/Cu/Zr | 5/30/5 | 29 | ≦1 |
| Hf/Cu/Hf | 5/30/5 | 28 | ≦1 |
| Hf/Cu | 5/35 | 28 | ≦1 |
| W/Cu/W | 5/30/5 | 28 | ≦1 |
| W/Cu | 5/35 | 28 | ≦1 |
| Ti/Cu/Ti | 5/30/5 | 29 | ≦1 |
| Ti/Cu | 5/35 | 29 | ≦1 |
| (Ti/Cu)x4 | 5/5 | 30 | ≦1 |
| Ti/Au/Ti | 5/30/5 | 28 | ≦1 |
| Ti/Ag/Ti | 5/30/5 | 28 | ≦1 |
| Ti/Pt/Ti | 5/30/5 | 29 | ≦1 |
| Ti/Pb/Ti | 5/30/5 | 28 | ≦1 |
| Mo/Cu/Mo | 5/30/5 | 28 | ≦1 |
| (Mo/Cu)x4 | 5/5 | 32 | ≦1 |
| Y/Cu/Y | 5/30/5 | 29 | ≦1 |
| V/Cu/V | 5/30/5 | 28 | ≦1 |
| Nb/Cu/Nb | 5/30/5 | 29 | ≦1 |

As shown in table 3, cases where the lower electrode layer 22 has average surface roughness which is equal to or smaller than 0.3 nm show results better than cases where conventional material is used. That is, such the small average surface roughness brings high S/N ratio and low bit error rate.

Case 2

To prove that the cases where the lower electrode layer 22 whose average surface equal to or smaller than 0.3 nm show high S/N ratio and low bit error rate, measurements for various average surface roughness were carried out.

In this experiment, the lower electrode layer 22 was made of Mo, and various average surface roughness was produced by changing pressure of Ar atmosphere while making the lower electrode layer 22.

Table 4 shows relationship among Ar pressure, average surface roughness Ra, S/N ratio, and bit error rate. The shown average surface roughness Ra was calculated based on the method regulated by JIS which uses an atomic force microscope (AFM).

TABLE 4

| Ar PRESSURE (mTorr) | Ra (nm) | S/N (dB) | BIT ERROR RATE |
|---|---|---|---|
| 1 | 0.24 | 28 | ≦1 × 10$^{-6}$ |
| 2 | 0.26 | 28 | ≦1 × 10$^{-6}$ |
| 4 | 0.30 | 26 | ≦1 × 10$^{-6}$ |

TABLE 4-continued

| Ar PRESSURE (mTorr) | Ra (nm) | S/N (dB) | BIT ERROR RATE |
|---|---|---|---|
| 6 | 0.35 | 21 | approx. 1 × 10$^{-3}$ |
| 8 | 0.46 | 16 | measurement impossible |

As shown in table 4, S/N ratio and bit error rate were stable in the cases where the average surface roughness were equal to or smaller than 0.3 nm. However, the cases where the average surface roughness exceeded 0.3 nm show radical reduction of S/N ratio and radical increase of bit error rate.

Case 3

This is another approach to prove the result of Case 1. In this experiment, the lower electrode layer 22 was made by another way so as to have various average surface roughness.

As Case 2, the lower electrode layer 22 was made of Mo. The average surface roughness was changed by changing the thickness of the lower electrode layer 22.

Table 5 shows the relationship among the thickness of the lower electrode layer 22, the average surface roughness, S/N ratio, and bit error rate. The shown average surface roughness Ra was calculated based on the method regulated by JIS which uses an atomic force microscope (AFM).

TABLE 5

| Mo THICKNESS (nm) | Ra (nm) | S/N (dB) | BIT ERROR RATE |
|---|---|---|---|
| 40 | 0.24 | 28 | ≦1 × 10$^{-6}$ |
| 100 | 0.27 | 27 | ≦1 × 10$^{-6}$ |
| 200 | 0.31 | 26 | ≦1 × 10$^{-6}$ |
| 400 | 0.37 | 22 | approx. 5 × 10$^{-3}$ |
| 800 | 0.47 | 14 | measurement impossible |

As shown table 5, S/N ratio and bit error rate were stable in the cases where the average surface roughness were equal to or smaller than 0.3 nm. However, the cases where the average surface roughness exceeded 0.3 nm show radical reduction of S/N ratio and radical increase of bit error rate.

It is obvious from tables 4 and 5 that at least read head 62 comprising the lower electrode layer 22 made of Mo whose average surface roughness is equal to or smaller than 0.3 nm shown high S/N ratio and low bit error rate.

Case 4

This experiment is a case where the lower electrode layer 22 is made of Ti. As well as Case 2, Ar pressure was changed to produce various average surface roughness of the lower electrode layer 22.

Table 6 shows the relationship among Ar pressure, average surface roughness Ra, S/N ratio, and bit error rate. The shown average surface roughness Ra was calculated based on the method regulated by JIS which uses an atomic force microscope (AFM).

TABLE 6

| Ar PRESSURE (mTorr) | Ra (nm) | S/N (dB) | BIT ERROR RATE |
|---|---|---|---|
| 1 | 0.25 | 28 | ≦1 × 10$^{-6}$ |
| 2 | 0.27 | 27 | ≦1 × 10$^{-6}$ |

TABLE 6-continued

| Ar PRESSURE (mTorr) | Ra (nm) | S/N (dB) | BIT ERROR RATE |
|---|---|---|---|
| 4 | 0.29 | 26 | $\leq 1 \times 10^{-6}$ |
| 6 | 0.33 | 22 | Approx. $1 \times 10^{-3}$ |
| 8 | 0.46 | 18 | Approx. $5 \times 10^{-1}$ |

As shown in table 6, S/N ratio and bit error rate were stable in the cases where the average surface roughness were equal to or smaller than 0.3 nm. However, the cases where the average surface roughness exceeded 0.3 nm show radical reduction of S/N ratio and radical increase of bit error rate.

According to the results of Cases 2 to 4, the small average surface roughness (equal to or smaller than 0.3 nm) of the lower electrode layer 22 influences to have excellent S/N ratio and bit error rate regardless of neither the material nor the method of forming the lower electrode layer 22.

Case 5

In Case 5, the read heads 62 having Ex. 1 to 7 of the first embodiment were subject to measurements to find out their output level, read/write frequency (mark length) which reduces the output level down to be half, S/N ratio, and bit error rate.

The read heads 62 for this experiment have the Ex. 1 to 7 of the first embodiment, however, each of them further comprises the lower gap layer 33 formed between the lower shield layer 21 and the lower electrode layer 22, the base layer 34 formed between the lower electrode layer 22 and the fixer layer 23, and the upper gap layer 35 formed between the upper electrode layer 29 and the upper shield layer 30.

In this case, the lower electrode layer 22 has the deposition structure in which Ta layers (5 nm thick each) and Cu layers (5 nm thick each) are deposited alternately. Precise deposition order is: Ta layer/Cu layer/Ta layer/Cu layer/Ta layer/Cu layer/Ta layer/Cu layer. The average surface roughness of thus structured lower electrode layer 22 is equal to or smaller than 0.3 nm.

In the read head 62 employing Ex. 1 to 6, each bias layer 27 has the deposition structure in which a Cr layer (10 nm thick) and a composite layer (36 nm thick) of Co74.5Cr10.5Pt15. In the other read head 62 employing Ex. 7, the bias layer 27 is made of Ba ferrite, and has the thickness of 50 nm.

Other layers are made of the materials which are substantially the same as those described in Case 1, and those are formed in the same manner described in Case 1.

A magnetic head as shown in FIG. 2 or FIG. 20 which employs the above described read head is subjected to an environmental test as well as that described in Case 1. After the environmental test, measurements for finding out their output level, read/write frequency (mark length) which reduces the output level down to be half, S/N ratio, and bit error rate were carried out.

Table 7 shows results of Case 5 by structures (Ex. 1 to 7).

TABLE 7

|  | Ex. 1 | Ex. 2 | Ex. 3 | Ex. 4 | Ex. 5 | Ex. 6 | Ex. 7 |
|---|---|---|---|---|---|---|---|
| OUTPUT LEVEL (mV) | 3.5 | 3.6 | 3.6 | 3.7 | 3.5 | 3.6 | 3.6 |
| MARK LENGTH FOR HALF OUTPUT (kFCI) | 180 | 195 | 195 | 190 | 190 | 185 | 185 |
| S/N (dB) | 31 | 30 | 31 | 31 | 30 | 29 | 29 |
| BIT ERROR RATE | $\leq 10^{-7}$ | $\leq 10^{-7}$ | $\leq 10^{-7}$ | $\leq 10^{-7}$ | $\leq 10^{-7}$ | $\leq 10^{-7}$ | $\leq 10^{-7}$ |

It is obvious from table 7 that the cases where the average surface roughness of the lower electrode layer 22 is equal to or smaller than 0.3 nm show high output level and S/N ratio while bit error rate is low, regardless of the structure of the read head 62.

Case 6

In Case 6, four types of yoke heads (FIGS. 17A to 17D) described in the second embodiment were subjected to measurements to find out their output level, read/write frequency (mark length) which reduces the output level down to be half, S/N ratio, and bit error rate as well as Case 5.

As described in the second embodiment, each yoke head comprises the ferromagnetic substrate 41, the non-magnetic insulator 42, the lower electrode layer 43, the gap cancel layer 44, the magnetic tunnel junction (MTJ) layer 45, the bias layer 46, the upper electrode layer 47, the non-magnetic insulation layer 48, the non-rigid magnetic layer 49, the front yoke 50, and the back yoke 51.

The ferromagnetic substrate is made of MnZn ferrite.

The non-magnetic insulator 42 is made of Si oxide.

The lower electrode layer 43 has the deposition structure in which Mo layers (5 nm thick each) and Au layers (5 nm thick each) are deposited alternately so that the lower electrode layer 43 has the thickness of 40 nm. The average surface roughness of the lower electrode layer 43 is equal to or smaller than 0.3 nm.

The gap cancel layer 44 is made of Al oxide.

The MTJ layer 45 comprises a base layer, a fixer layer, a fixed layer, a barrier layer, a free layer, and a protect layer.

The base layer is made of Ta, and has the thickness of 3 nm.

The fixer layer is made of Pt46Mn54, and has the thickness of 25 nm.

The fixed layer is made of Co90Fe10, and has the thickness of 5 nm.

The barrier layer is made of Al oxide, and has the thickness of 2 nm.

The free layer has the deposition structure in which a composite layer (2 nm thick) of Co90Fe10 and another composite layer (8 nm thick) of Ni82Fe18 are deposited in this order.

The protect layer is made of Ta, and has the thickness of 3 nm.

The bias layer 46 is made of CoCrTa, and has the thickness of 500 nm.

The upper electrode layer 47 is formed on the gap cancel layer 44, the MTJ layer 45, and the bias layer 46. Material of the upper electrode layer 47 is substantially the same as that of the upper electrode layer 29 described in the first embodiment.

The non-magnetic insulation layer 48 is made of material which is the same as that of the non-magnetic insulator 42.

The non-rigid magnetic layer 49 is made of Ni80Fe20.

Each of the front yoke 50 and the back yoke 51 has the deposition structure in which Ta layers (5 nm thick each) and Ni80F20 layers (20 nm thick each) are deposited alternately so that each yoke have the thickness of 200 nm.

A magnetic head as shown in FIG. 2 or FIG. 20 which employs the above described read head is subjected to an environmental test as well as that described in Case 1. After the environmental test, measurements for finding out their output level, read/write frequency (mark length) which reduces the output level down to be half, S/N ratio, and bit error rate were carried out.

Table 8 shows results of Case 6 by the types (FIGS. 7A to 7D).

TABLE 8

|  | FIG. 7A | FIG. 7B | FIG. 7C | FIG. 7D |
|---|---|---|---|---|
| OUTPUT LEVEL (mV) | 2.9 | 3.2 | 3.3 | 3.4 |
| MARK LENGTH FOR HALF OUTPUT (kFCI) | 215 | 269 | 259 | 261 |
| S/N (dB) | 33 | 35 | 36 | 35 |
| BIT ERROR RATE | $\leq 10^{-7}$ | $\leq 10^{-7}$ | $\leq 10^{-7}$ | $\leq 10^{-7}$ |

As shown in table 8, high output level and S/N ratio and low bit error rate are available regardless of the read head structure.

According to the above experiment results, it is proved that only the small average surface roughness (equal to or smaller than 0.3 nm) of the lower electrode layer 43 is required to obtain excellent S/N ratio and bit error rate. That is, a read head having a lower electrode layer whose average surface roughness is equal to or smaller than 0.3 nm has improved ability to read data more accurately from a magnetic recording medium.

As mentioned above, since the lower electrode layer employs the material having strong bond strength, exfoliation of the layers does not occur. As a result, the above described read head 14A shows excellent performance with improved reliability.

In the cases of Ex. 5, 6, and 7 in the first embodiment, although patterning is applied only to the free layer 26 of the layers in the MTJ layer, patterning may be applied to other layers as needed. However, at least the free layer 26 must be subjected to the patterning.

The yoke head described in the second embodiment may comprise MR enhance layer(s) between the free layer and the barrier layer and/or between the barrier layer and the fixed layer. The MR enhance layer is made of Co, NiFeCo, FeCo, CoFeB, CoZrMo, CoZrNb, CoZr, CoZrTa, CoHf, CoTa, CoTaHf, CoNbHf, CoZrNb, CoHfPd, CoTaZrNb, CoZrMoNi, or amorphous magnetic material, and improves sensitivity of the read head.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H11-017383 filed on Jan. 26, 1999 and including specification, claims, drawings and summary. The disclosure of the above Japanese Patent Application is incorporated herein by reference in its entirety.

What is claimed is:

1. A magneto-resistive element comprising:
   a first electrode having average surface roughness of equal to or smaller than 0.3 nm;
   a magneto-resistive layer, formed on said first electrode, which comprises a non-magnetic layer and a pair of magnetic layers sandwiching said non-magnetic layer, and whose resistance changes in accordance with a magnetic field; and
   a second electrode formed on said magneto-resistive layer.

2. The magneto-resistive element according to claim 1, wherein said first electrode is made of a material which prevents said first electrode from being exfoliated from a layer formed directly on said first electrode.

3. The magneto-resistive element according to claim 2, wherein said first electrode is made of at least one of Ta, Zr, Ti, Hf, W, Mo, Y, V, Nb, Au, Ag, Pd, and Pt.

4. The magneto-resistive element according to claim 3, wherein said first electrode is affixed to said layer formed directly on said first electrode with bond strength of equal to or greater than 36 Giga Pascal.

5. The magneto-resistive element according to claim 2, wherein said first electrode is made of a material including at least one of Ta, Zr, Ti, Hf, W, Mo, Y, V, Nb, Au, Ag, Pd, and Pt.

6. The magneto-resistive element according to claim 5, wherein said first electrode is affixed to said layer formed directly on said first electrode with bond strength of equal to or greater than 36 Giga Pascal.

7. A magnetic head comprising:
   a read head, for reading data from a magnetic recording medium, which comprises a first electrode whose average surface roughness is equal to or smaller than 0.3 nm, a magneto-resistive layer formed on said first electrode and a second electrode layer formed on said magneto-resistive layer, wherein said magneto-resistive layer comprises a non-magnetic layer and a pair of magnetic layers sandwiching said non-magnetic layer, and whose resistance is changed in accordance with a magnetic field; and
   a write head, for writing data on a magnetic recording medium, which is formed on said read head.

8. A data writing/reading device for writing/reading data on/from a magnetic recording medium, said data writing/reading device comprising:

a magnetic head having a first electrode whose average surface roughness is equal to or smaller than 0.3 nm, a first magnetic layer formed on said first electrode, a non-magnetic layer formed on said first magnetic layer, a second magnetic layer formed on said non-magnetic layer, and a second electrode formed on said second magnetic layer;

a drive circuit for driving said magnetic recording medium and said magnetic head relatively; and a control circuit for controlling said drive circuit in order to control said magnetic head to read data.

9. A magneto-resistive element comprising:

a first electrode having average surface roughness of equal to or smaller than 0.3 nm;

a magneto-resistive layer, formed on said first electrode, which comprises a non-magnetic layer and a pair of magnetic layers sandwiching said non-magnetic layer, and whose resistance changes in accordance with a magnetic field; and a second electrode formed on said magneto-resistive layer, wherein said first electrode affixed to a layer formed directly on said first electrode with bond strength of equal to or greater than 36 Giga Pascal.

10. A magneto-resistive element comprising:

a first electrode having average surface roughness of equal to or smaller than 0.3 nm;

a magneto-resistive layer, formed on said first electrode, which comprises a non-magnetic layer and a pair of magnetic layers sandwiching said non-magnetic layer, and whose resistance changes in accordance with magnetic field; and a second electrode formed on said magneto-resistive layer, wherein said first electrode is made of at least one of Ta, Zr, Ti, Hf, W, Mo, Y, V, Nb, Au, Ag, Pd, and Pt, and wherein said first electrode is affixed to a layer formed directly on said first electrode with bond strength of equal to or greater than 36 Giga Pascal.

11. A magneto-resistive element comprising:

a first electrode having average surface roughness of equal to or smaller than 0.3 nm;

a magneto-resistive layer, formed on said first electrode, which comprises a non-magnetic layer and a pair of magnetic layers sandwiching said non-magnetic layer, and whose resistance changes in accordance with magnetic field; and a second electrode formed on said magneto-resistive layer, wherein said first electrode is made of a material which prevents said first electrode from being exfoliated from a layer formed directly on said first electrode, and wherein said first electrode is affixed to said layer formed directly on said first electrode with bond strength of equal to or greater than 36 Giga Pascal.

* * * * *